US010355895B2

(12) United States Patent
Barbieri et al.

(10) Patent No.: US 10,355,895 B2
(45) Date of Patent: Jul. 16, 2019

(54) BASEBAND UNIT WITH ADAPTIVE FRONTHAUL LINK FOR A DISTRIBUTED RADIO ACCESS NETWORK

(71) Applicant: Phluido, Inc., San Diego, CA (US)

(72) Inventors: Alan Barbieri, La Jolla, CA (US); Dario Fertonani, La Jolla, CA (US)

(*) Notice: Subject to any disclaimer, the term of this patent is extended or adjusted under 35 U.S.C. 154(b) by 70 days.

(21) Appl. No.: 15/549,381

(22) PCT Filed: Mar. 11, 2016

(86) PCT No.: PCT/US2016/022114
§ 371 (c)(1),
(2) Date: Aug. 17, 2017

(87) PCT Pub. No.: WO2016/145371
PCT Pub. Date: Sep. 15, 2016

(65) Prior Publication Data
US 2018/0034669 A1 Feb. 1, 2018

Related U.S. Application Data

(60) Provisional application No. 62/131,337, filed on Mar. 11, 2015.

(51) Int. Cl.
*H04L 25/02* (2006.01)
*H04L 29/06* (2006.01)
(Continued)

(52) U.S. Cl.
CPC .......... *H04L 27/26* (2013.01); *H04B 1/1661* (2013.01); *H04L 1/0006* (2013.01);
(Continued)

(58) Field of Classification Search
None
See application file for complete search history.

(56) References Cited

U.S. PATENT DOCUMENTS 6,745,012 B1 6/2004 Ton
8,964,641 B2 2/2015 Dalela et al.
(Continued)

FOREIGN PATENT DOCUMENTS

EP 2632072 B1 11/2016
WO 2014018864 A1 1/2014
(Continued)

OTHER PUBLICATIONS

Aleksandra Checko et al., 'Cloud RAN for Mobile Networks—A Technology Overview', IEEE Communications Surveys & Tutorials, pp. 1-24, Jan. 2015.
(Continued)

*Primary Examiner* — Duc T Duong
(74) *Attorney, Agent, or Firm* — Bruce A. Young; Young's Patent Services

(57) ABSTRACT

A distributed radio frequency communication system facilitates communication between a wireless terminal and a core network. The system includes a remote radio unit (RRU) coupled to at least one antenna to communicate with the wireless terminal. The RRU includes electronic circuitry to perform at least a first portion of a first-level protocol of a radio access network (RAN) for communicating between the wireless terminal and the core network. The system also includes a baseband unit (BBU) coupled to the core network, and configured to perform at least a second-level protocol of the RAN. A fronthaul link is coupled to the BBU and the RRU. The fronthaul link utilizes an adaptive fronthaul protocol for communication between the BBU and the RRU. The adaptive fronthaul protocol has provisions for adapting to conditions of the fronthaul link and radio network by changing the way data is communicated over the fronthaul link.

36 Claims, 22 Drawing Sheets

(51) Int. Cl.

| | |
|---|---|
| *H04W 88/14* | (2009.01) |
| *H04L 27/26* | (2006.01) |
| *H04L 29/08* | (2006.01) |
| *H04L 29/10* | (2006.01) |
| *H04L 29/14* | (2006.01) |
| *H04B 1/16* | (2006.01) |
| *H04L 1/18* | (2006.01) |
| *H04L 27/00* | (2006.01) |
| *H04W 72/04* | (2009.01) |
| *H04L 1/00* | (2006.01) |
| *H04L 12/46* | (2006.01) |
| *H04B 1/62* | (2006.01) |
| *H04L 5/00* | (2006.01) |
| *H04W 88/08* | (2009.01) |

(52) U.S. Cl.
CPC ........ *H04L 1/1893* (2013.01); *H04L 12/4604* (2013.01); *H04L 25/02* (2013.01); *H04L 27/0002* (2013.01); *H04L 29/06* (2013.01); *H04L 29/08* (2013.01); *H04L 29/10* (2013.01); *H04L 69/04* (2013.01); *H04L 69/40* (2013.01); *H04W 72/0413* (2013.01); *H04B 1/62* (2013.01); *H04L 5/003* (2013.01); *H04L 2027/003* (2013.01); *H04W 88/085* (2013.01)

(56) References Cited

U.S. PATENT DOCUMENTS

| | | | |
|---|---|---|---|
| 9,998,310 | B2 | 6/2018 | Barbieri et al. |
| 10,097,391 | B2 | 10/2018 | Fertonani et al. |
| 2012/0157089 | A1 | 6/2012 | Yang et al. |
| 2012/0207206 | A1 | 8/2012 | Samardzija et al. |
| 2012/0250740 | A1 | 10/2012 | Ling |
| 2012/0300710 | A1 | 11/2012 | Li et al. |
| 2013/0100907 | A1 | 4/2013 | Liu |
| 2013/0322273 | A1 | 12/2013 | Etemad et al. |
| 2014/0029431 | A1 | 1/2014 | Haberland et al. |
| 2014/0031049 | A1* | 1/2014 | Sundaresan ........... H04W 16/02 455/447 |
| 2014/0171063 | A1 | 6/2014 | Mori |
| 2014/0185601 | A1 | 7/2014 | Ilyadis |
| 2014/0201383 | A1 | 7/2014 | Kuehnel et al. |
| 2014/0226481 | A1* | 8/2014 | Dahod .................. H04W 72/04 370/235 |
| 2014/0226736 | A1 | 8/2014 | Niu et al. |
| 2014/0241315 | A1 | 8/2014 | Niu et al. |
| 2014/0255034 | A1 | 9/2014 | Huo |
| 2014/0286165 | A1 | 9/2014 | Chowdhury et al. |
| 2014/0286239 | A1 | 9/2014 | Chowdhury et al. |
| 2014/0286258 | A1 | 9/2014 | Chowdhury et al. |
| 2014/0293784 | A1 | 10/2014 | Haberland |
| 2014/0301288 | A1 | 10/2014 | Koc et al. |
| 2014/0303814 | A1 | 10/2014 | Burema et al. |
| 2014/0349667 | A1 | 11/2014 | Hahn et al. |
| 2014/0362801 | A1 | 12/2014 | Morita |
| 2014/0378047 | A1* | 12/2014 | Kennard ............ H04B 7/15535 455/22 |
| 2015/0189692 | A1 | 7/2015 | Portolan et al. |
| 2015/0230287 | A1 | 8/2015 | Moon et al. |
| 2015/0341941 | A1* | 11/2015 | Nguyen .............. H04W 72/082 370/332 |
| 2015/0365934 | A1* | 12/2015 | Liu ....................... H04L 5/0039 370/329 |
| 2015/0372728 | A1 | 12/2015 | Rahman et al. |
| 2016/0080027 | A1* | 3/2016 | Agata .................. H04W 16/26 370/329 |
| 2016/0128085 | A1* | 5/2016 | Liu ..................... H04J 14/00 398/96 |
| 2016/0143016 | A1 | 5/2016 | Chanclou et al. |
| 2016/0165521 | A1 | 6/2016 | Choi et al. |
| 2016/0183248 | A1* | 6/2016 | Niu ..................... H04B 7/0413 370/329 |
| 2016/0192181 | A1 | 6/2016 | Choi et al. |
| 2016/0212747 | A1* | 7/2016 | Effenberger ........ H04W 72/0453 |
| 2016/0255613 | A1 | 9/2016 | Faerber et al. |
| 2016/0269961 | A1* | 9/2016 | Imana .................. H04W 36/28 |
| 2016/0270006 | A1 | 9/2016 | Choi et al. |
| 2017/0238361 | A1* | 8/2017 | Pawar ................... H03M 7/40 455/561 |
| 2017/0250927 | A1* | 8/2017 | Stapleton ............. H04L 25/02 |
| 2017/0288695 | A1* | 10/2017 | Feng .................. H03M 7/3082 |
| 2018/0007736 | A1* | 1/2018 | Ruttik .................. H04W 88/08 |
| 2018/0234875 | A1* | 8/2018 | Leroudier ........... H04W 88/085 |

FOREIGN PATENT DOCUMENTS

| | | |
|---|---|---|
| WO | 2014076004 A2 | 5/2014 |
| WO | 2014110730 A1 | 7/2014 |
| WO | 2015037857 A1 | 3/2015 |
| WO | 2015060562 A1 | 4/2015 |
| WO | 2016145371 A2 | 9/2016 |

OTHER PUBLICATIONS

USPTO, Final Office Action for related U.S. Appl. No. 15/701,290, dated Mar. 15, 2017.
USPTO, Non-Final Office Action for related U.S. Appl. No. 15/701,290, dated Nov. 14, 2017.
USPTO, Notice of Allowance for related U.S. Appl. No. 15/701,362, dated Aug. 29, 2018.
USPTO, Notice of Allowance for related U.S. Appl. No. 15/701,290, dated May 2, 2018.
Young, Bruce, Response/Amendment to Final Office Action for related U.S. Appl. No. 15/701,290, dated Mar. 22, 2018.
Young, Bruce, Response/Amendment to Non-Final Office Action for related U.S. Appl. No. 15/701,290, dated Feb. 12, 2018.
Barbieri and Fertonani, Distributed Radio Access Network With Adaptive Fronthaul, Unpublished U.S. Appl. No. 15/549,381, filed Aug. 8, 2017.
Barbieri and Fertonani, Remote Radio Unit with Adaptive Fronthaul Link using Adaptive Compression, Unpublished U.S. Appl. No. 15/701,290, filed Sep. 11, 2017.
Choi, et al., Full-Duplex Wireless Design, Jul. 14, 2014, retrieved from http://sing.stanford.edu/fullduplex/ on Jul. 9, 2017.
Common Public Radio Interface (CPRI); Interface Specification, V7.0, Oct. 9, 2015, retrieved from http://www.cpri.info/downloads/CPRI_v_7_0_2015-10-09.pdf on Feb. 25, 2015.
Common Public Radio Interface, Mar. 11, 2015, retrieved from http://www.ieee802.org/1/files/public/docs2015/liaison-CPRI_Tdoc_1124_presentation-0315.pdf on Feb. 25, 2015.
Fertonani and Barbieri, Remote Radio Unit with Adaptive Fronthaul Link for a Distributed Radio Access Network, Unpublished U.S. Appl. No. 15/701,315, filed Sep. 11, 2017.
Haijun Zhang et al., 'Cooperative Interference Mitigation and Handover Management for Heterogeneous Cloud Small Cell Networks', In: IEEE Wireless Communications, Jul. 6, 2015, vol. 22, Issue 3, pp. 92-99.
J. J. van de Beek, M. Sandell and P. O. Borjesson, ML estimation of time and frequency offset in OFDM systems, IEEE Transactions on Signal Processing, vol. 45, No. 7, pp. 1800-1805, Jul. 1997.
Korean Intellectual Property Office, International Search Report for PCT/US2016/022114, dated Nov. 17, 2016.
Korean Intellectual Property Office, International Search Report for PCT/US2016/058351, dated Apr. 11, 2017.
Korean Intellectual Property Office, Written Opinion of the International Searching Authority for PCT/US2016/022114, dated Nov. 17, 2016.
Korean Intellectual Property Office, Written Opinion of the International Searching Authority for PCT/US2016/058351, dated Apr. 11, 2017.
Liang Liu et al., 'Optimized Uplink Transmission in Multi-Antenna C-RAN With Spatial Compression and Forward', In: IEEE Transactions on Signal Processing, Jun. 25, 2015, vol. 63, Issue 19, pp. 5083-5095.

(56) References Cited

OTHER PUBLICATIONS

LTE; Evolved Universal Terrestrial Radio Access (E-UTRA) and Evolved Universal Terrestrial Radio Access Network (E-UTRAN); Overall description; Stage 2 (3GPP TS 36.300 version 12.4.0 Release 12), Feb. 2015, retrieved from http://www.etsi.org/deliver/etsi_ts/136300_136399/136300/12.04.00_60/ts_136300v120400p.pdf on Mar. 2, 2016.

LTE; Evolved Universal Terrestrial Radio Access (E-UTRA); Medium Access Control (MAC) protocol specification (3GPP TS 36.321 version 12.4.0 Release 12); Feb. 2015, retrieved from http://www.etsi.org/deliver/etsi_ts/136300_136399/136321/12.04.00_60/ts_136321v120400p.pdf on Mar. 2, 2016.

LTE; Evolved Universal Terrestrial Radio Access (E-UTRA); Physical channels and modulation (3GPP TS 36.211 version 12.4.0 Release 12), Feb. 2015, retrieved from http://www.etsi.org/deliver/etsi_ts/136200_136299/136211/12.04.00_60/ts_136211v120400p.pdf on Mar. 5, 2016.

LTE; Evolved Universal Terrestrial Radio Access (E-UTRA);LTE physical layer; General description (3GPP TS 36.201 version 12.1.0 Release 12), Feb. 2015, retrieved from http://www.etsi.org/deliver/etsi_ts/136200_136299/136201/12.01.00_60/ts_136201v120100p.pdf on May 16, 2016.

M. Morelli and U. Mengali, Carrier-frequency estimation for transmissions over selective channels,IEEE Transactions on Communications, vol. 48, No. 9, pp. 1580-1589, Sep. 2000.

Mayank Jain et al. in "Practical, Real-time, Full Duplex Wireless" published in the Proceedings of the 17th Annual International Conference on Mobile Computing and Networking (Mobicom 2011), Sep. 19, 2011.

Milosavljevic, Milos, Combined optical and wireless/wireline access based on existing requirements, Version 1.0, Sep. 30, 2011, retrieved from http://cordis.europa.eu/docs/projects/cnect/4/248654/080/deliverables/001-AccordanceD53WP5201130SeptemberUHv10.pdf on Feb. 10, 2016.

NGMN Alliance, 'Further Study on Critical C-RAN Technologies', version 1.0, Mar. 31, 2015.

European Patent Office, Supplemental Search Report for related application EP 1676243.1, dated Aug. 16, 2018.

Fertonani and Barbieri, Baseband Unit with Adaptive Fronthaul Link and Dynamic RAN Parameters, Unpublished U.S. Appl. No. 16/122,687, filed Sep. 5, 2018.

Nui et al., RAN architecture options and performance for 5G network evolution, 2014 IEEE Wireless Communications and Networking Conference Workshops (WCNCW) IEEE, Apr. 6, 2014, pp. 294-298.

USPTO, Non-final Office Action for related U.S. Appl. No. 15/701,362, dated Jun. 28, 2018.

Uwe et al., Quantitative Analysis of Split Base Station Processing and Determination of Advantageous Architectures for LTE, Bell Labs Technical Journal, vol. 18, No. 1, May 30, 2013, pp. 105-128.

Young, Bruce, Response Non-final Office Action for related U.S. Appl. No. 15/701,362, dated Jun. 30, 2018.

Young, Bruce, Response/Amendment to Non-Final Office Action for related U.S. Appl. No. 15/701,315, dated Mar. 21, 2019.

* cited by examiner

BASEBAND UNIT WITH ADAPTIVE FRONTHAUL LINK FOR A DISTRIBUTED RADIO ACCESS NETWORK

CROSS-REFERENCE TO RELATED APPLICATIONS

The present application claims priority to U.S. Provisional Patent Application No. 62/131,337, entitled Methods for Radio-as-a-Service, filed on Mar. 11, 2015, the entire contents of which are hereby incorporated by reference for any and all purposes.

BACKGROUND

Technical Field

The present subject matter relates to wireless communication. More specifically, the present subject matter relates to a radio access network (RAN) using an adaptive fronthaul protocol.

Background Art

A Radio Access Network (RAN) provides access to a core network for a wireless terminal, such as a smartphone. RANs have progressed through several different generations of technology, and are sometimes referred to by a so-called "generation number," such as 3G, or 4G networks. An example 2G RAN is the GSM (Global System for Mobile Communications) Radio Access Network (GRAN), example 3G RANs include the GSM EDGE Radio Access Network (GERAN), and the Universal Mobile Telecommunications System (UMTS). An example 4G network is the Long-Term Evolution Advanced (LTE-A) which is also known as the Evolved Universal Terrestrial Radio Access Network (E-UTRAN) and may also be referred to simply as "LTE" herein. Each RAN communicates with wireless terminals using radio frequency communication protocols defined by the RAN at frequencies supported by the RAN and licensed by a particular communications company, or carrier. The frequencies are modulated using a variety of techniques, depending on the RAN, to carry digital information that can be used for voice transmission and/or data transfer.

Each RAN can define its own software structure, but many generally conform to the 7-layer Open Systems Interconnection (OSI) model. The seven layers include a lowest layer, layer 1, which is commonly referred to as the physical layer or PHY, which describes the transmission and reception of raw bit streams over a physical medium. The next layer, layer 2, is known as the data link layer, but often is referred to by the name of a protocol that resides at that layer, such as the medium access protocol (MAC), or point-to-point protocol (PPP), which provide for transmission of data frames between two nodes connected by a physical layer. The third layer, known as the network layer, manages a multi-node network and handles such issues as addressing, to send packets of data between nodes. The internet protocol (IP) is a commonly used network layer protocol. The next layer, layer 4, is known as the transport layer. Common transport protocols include the transmission control protocol (TCP) and the user datagram protocol (UDP). Transport protocols manage transmission of data segments between nodes of the network. Layer 5, the session layer, manages communication sessions, layer 6, the presentation layer, translates data between a networking service and an application, and the top layer, layer 7 or the application layer, provides high-level application programming interfaces (APIs) for network related services.

More details of an E-UTRAN are provided as an example. The specifications for E-UTRAN are developed and published by the $3^{rd}$ Generation Partnership Project (3GPP). The specifications related to E-UTRAN are known as the 36 series specifications and are available for download from the 3GPP website at http://www.3gpp.org/DynaReport/36-series.htm. Several of the specifications include information helpful in understanding this disclosure, including: "LTE; Evolved Universal Terrestrial Radio Access (E-UTRA); LTE physical layer; General description," 3GPP TS 36.201 version 12.1.0 Release 12, 2015-02; "LTE; Evolved Universal Terrestrial Radio Access (E-UTRA); Physical channels and modulation," 3GPP TS 36.211 version 12.4.0 Release 12, 2015-02; "LTE; Evolved Universal Terrestrial Radio Access (E-UTRA) and Evolved Universal Terrestrial Radio Access Network (E-UTRAN); Overall description; Stage 2," 3GPP TS 36.300 version 12.4.0 Release 12, 2015-02; and "LTE; Evolved Universal Terrestrial Radio Access (E-UTRA); Medium Access Control (MAC) protocol specification," 3GPP TS 36.321 version 12.4.0 Release 12, 2015-02; all four of which are incorporated by reference herein.

In an E-UTRAN a base station is known as an enhanced node B (eNB) and a wireless terminal is known as user equipment (UE). An eNB can manage one or more cells, also called sectors, and is responsible for transmission and reception of wireless signals as well as interfacing with the core network, known as evolved packet core (EPC). It provides connectivity, that is, reliable data transfer (whenever possible), and control paths to the UEs in its coverage area. An eNB communicates with a UE using a pair of carrier frequencies, one for uplink (UL) and one for downlink (DL), if using Frequency Division Duplex (FDD), or using a single carrier frequency for both UL and DL if using Time Division Duplex (TDD). The DL uses Orthogonal Frequency Division Multiple Access (OFDMA) modulation of the carrier, and the UL uses Single-Carrier Frequency Division Multiple Access (SC-FDMA), which is also known as Linearly precoded OFDMA (LP-OFDMA). While the two modulation schemes are different, they share many similar qualities, and term "OFDM" may generally be used herein to describe either scheme.

In a traditional implementation, eNBs are separate logical entities, connected to the same core network via the S1 interface, which can be conveyed over a wired or wireless backhaul connection. An optional X2 interface may be used to directly connect neighbor eNBs. During a call, a UE may be handed over to neighbor eNBs, depending on radio conditions and traffic load. Handovers imply, among other things, a transfer of "context" of the UE being handed over, from a source eNB to a destination eNB. Such transfer may occur via the S1 interface or via the X2 interface, if available. The functions of the eNB can be broadly classified as radio frequency (RF) functions that deal with radio frequency signals, and baseband (BB) operations that deal with digital data.

eNBs implement several functions which together can be classified baseband (BB) operations. The baseband operations include the physical-layer (PHY) functions, medium access control (MAC) layer functions, radio link control (RLC) layer functions, packet data converge protocol (PDCP) layer functions, and radio resource control (RRC) layer functions.

Physical-layer (PHY) functions include, among others, transmission of downlink physical channels, such as physical downlink control channel (PDCCH), physical downlink shared channel (PDSCH), and cell-specific reference signal (CRS). The PHY layer functions also include reception of uplink physical layer channels, such as physical uplink shared channel (PUSCH), physical uplink control channel (PUCCH), physical random access channel (PRACH) and sounding reference signal (SRS). The PHY layer also handles synchronization, measurements of radio conditions, and other miscellaneous functions.

Medium access control (MAC) layer functions include scheduling, mapping of transport channels to logical channels, maintenance of uplink time alignment, hybrid automatic repeat request (HARD) operation, and discontinuous reception (DRX). Radio link control (RLC) layer functions include concatenation, segmentation, reassembly, reordering, and error correction (through ARQ). Packet data convergence protocol (PDCP) layer functions include in-sequence delivery of data units, header compression, elimination of duplicates, ciphering and deciphering, and integrity protection and verification. Radio resource control (RRC) layer functions include broadcast of system information, connection control, mobility, and measurement configuration and control.

In a traditional implementation, all eNB functions are carried out by specialized hardware devices, dedicated telecommunications equipment, data centers, and the like. In such traditional systems, the entire eNB is located in one location, allowing the eNB to be managed as a single unit. In another implementation, one or more eNBs are managed by the same hardware device or co-located devices and the transmission and reception antennas corresponding to the eNBs are distributed in a potentially large region. In such implementation, group of co-located antennas may be denoted as remote radio heads (RRHs), and a special interface connects the processing device with the RRHs it manages. A RRH can also be referred to as a remote radio unit (RRU) and the terms are used interchangeably herein.

In one implementation, which may be referred to as a distributed RAN or a Cloud-RAN, an RRH is targeted to have a smaller form factor, reduced power consumption, and lower operating expenses. To meet this goal, the RRH implements a minimum set of functions. In such implementations, the RRH may only include radio frequency (RF) functions such as amplification, filtering, up and down frequency conversion, digital to analog and analog to digital conversions, and the like, and baseband processing is still performed by dedicated equipment, which may not be co-located with the RRH.

A block diagram of a traditional distributed RAN 100 is shown in FIG. 1. The RAN 100 includes a central office 102 with one or more baseband units (BBUs) 160 that include all of the functionality for the PHY layer and the MAC layer of the RAN protocol. The RAN 100 also includes multiple RRUs 130 that include RF functionality and are each coupled to one or more antennas 131 to communicate with UE devices, such as smartphones. The interface between a BBU 160 and an RRH 130, is referred to as a fronthaul link 135. A traditional fronthaul link 135, can utilize a wired, optical, or radio frequency physical link, but the traditional fronthaul link is synchronous, low-jitter, and usually point-to-point. The fronthaul link 135 may be referred to as being "fiber-grade" indicating that it is high speed and low latency with minimal jitter. In some cases, the fronthaul link 135 uses a proprietary protocol, but in many implementations, a standardized protocol, such as the Common Public Radio Interface (CPRI) or the Open Base Station Architecture Initiative (OBSAI), is used. A central office 102 may host multiple BBUs 160, which in turn may control multiple RRUs 130. The BBUs 160 of the central office 102 are coupled to the core network, or EPC 199, by a backhaul link 190, that may utilize standard networking technology and is much more tolerant of latency and jitter issues than the fronthaul link 135.

One key issue with a distributed RAN 100 architecture is latency. Different functions in the baseband stack can have different requirements of end-to-end latency. As an example, HARQ, implemented in the MAC layer, requires an end-to-end delay of less than 4 ms in an LTE FDD (frequency division duplex) implementation. This means that from the time a UE transmits a data packet via the PUSCH channel, there is a maximum time, set by the specification, for the eNB to provide a corresponding HARQ response, e.g. a non-acknowledgement (NACK) to the UE. The overall latency for performing a specific function of the baseband stack, e.g. downlink (DL) HARQ processing, includes the time spent by the UE to perform the function, the bidirectional propagation delay over the wireless medium, and any propagation and processing delay over the fronthaul link 135 connecting the antennas and the BBU 160.

If the overall latency for performing a specific function does not satisfy specific constraints imposed by the standard for the function, the system may fail, and communication between an eNB and a UE cannot be sustained. Thus, latency constraints need to be satisfied in all operating conditions. This requires hard, real-time, constraints on the processing of specific latency-constrained functions, or functions that have an impact on the overall system timeline. Furthermore, fronthaul propagation delays from the antennas 131 to the BBUs 160 also must be accounted for within the overall latency constraint. In order to minimize the additional latency introduced by exchange of data between the BBUs 160 and the RRUs 130, a fiber-grade fronthaul is traditionally used.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification.

Reference now is made in detail to the examples illustrated in the accompanying drawings and discussed below.

Figure 1:
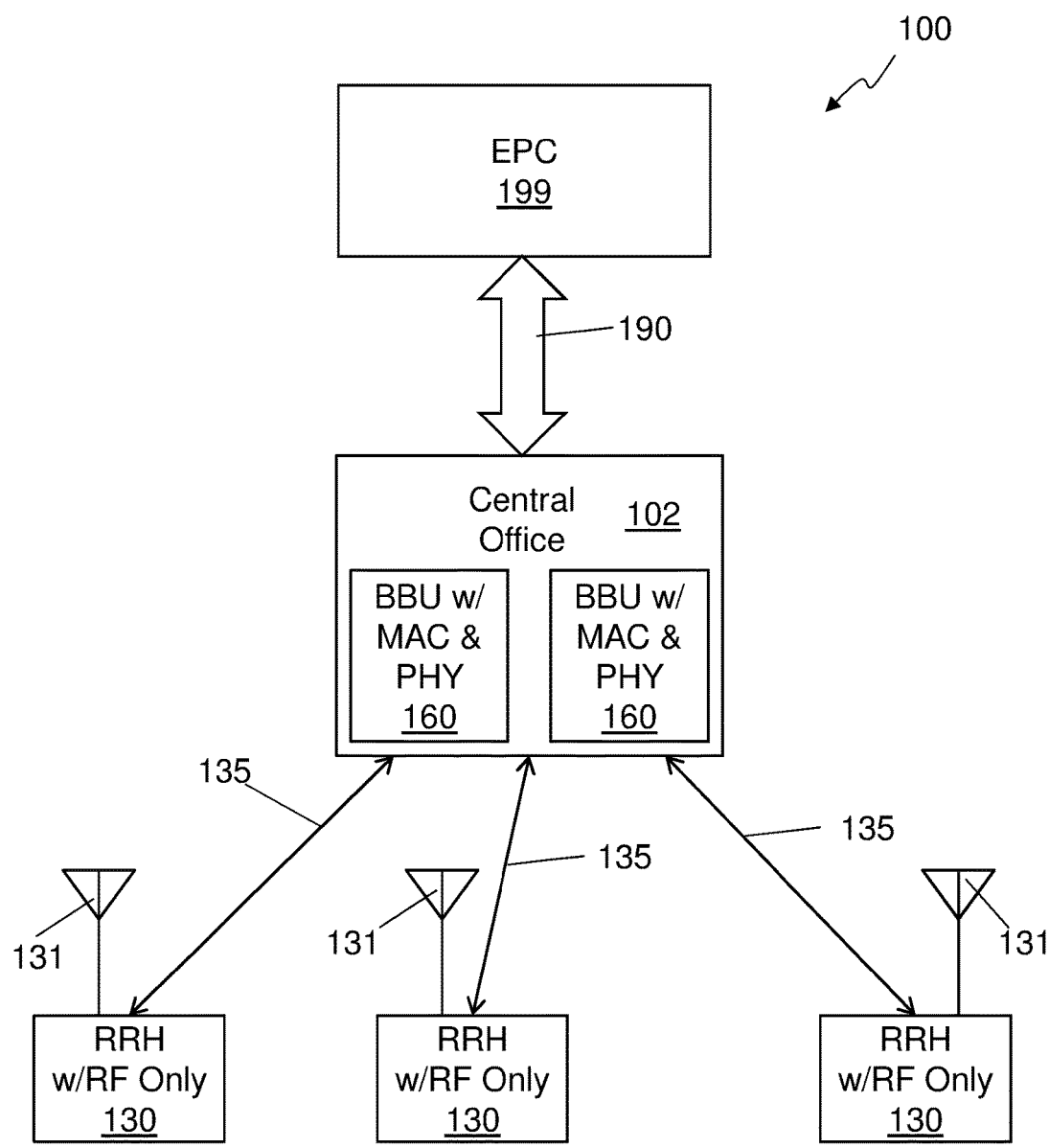
FIG. 1 is a block diagram of a traditional distributed radio access network (RAN)
Figure 2:
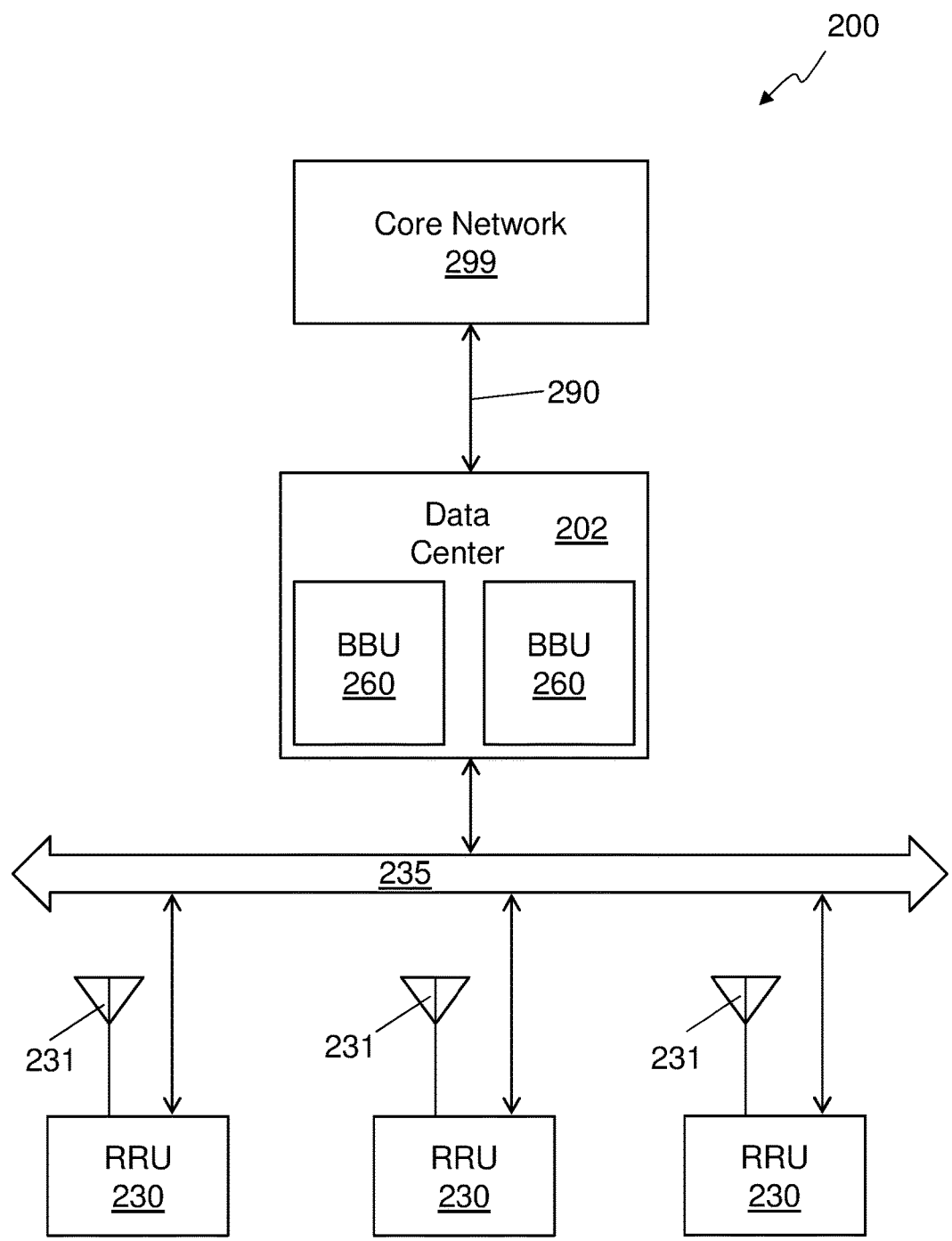
FIG. 2 is a block diagram of an embodiment of a distributed radio access network (RAN)

FIG. 2 is a block diagram of an embodiment of a distributed radio area network (RAN) 200. The RAN 200 represents a radio frequency communication system to facilitate communication between a wireless terminal and a core network 299. The RAN 200 can be any type of RAN, but in at least some embodiments, the RAN 200 is an Evolved Universal Terrestrial Radio Access Network (E-UTRAN), and the core network 299 includes an Evolved Packet Core (EPC). While an E-UTRAN system is used as an example in this document, the principles, systems, apparatus, and methods disclosed herein can be applied by one of ordinary skill to different radio access networks, including legacy networks such as Universal Mobile Telecommunications System (UMTS), other contemporary networks such as Worldwide Interoperability for Microwave Access (Wi-MAX), and future networks.

The RAN 200 includes a remote radio unit (RRU) 230 coupled to at least one antenna 231 to communicate with the wireless terminal. Depending on the system, any number of RRUs can be included, such as the three RRUs 230 shown in FIG. 2. The multiple RRUs 230 can be geographically distributed and there can be multiple RRUs 230 in a single location. A single RRU 230 can be coupled to any number of antennas, although many installations couple two antennas to each RRU 230. An RRU 230 includes electronic circuitry to perform at least a first portion of a first-level protocol of the RAN 200 for communicating between the wireless terminal and the core network 299.

The RAN 200 also includes a baseband unit (BBU) 260 coupled to the core network 290, and is configured to perform at least a second-level protocol of the RAN 200. In some embodiments, the BBU 260 also performs a second portion of a first-level protocol of the RAN 200. Depending on the system, any number of BBUs 260 can be included, such as the two BBUs 260 shown in FIG. 2. The multiple BBUs 260 can be geographically distributed and there can be multiple BBUs 260 in a single location, such as the two BBUs 260 shown in the data center 202. The BBUs 260 are coupled to the core network 299 using a backhaul link 290. The backhaul link 290 can be any sort of communication link, such as a S1 interface in an E-UTRAN, or an internet protocol (IP) packet-based network, depending on the embodiment.

The RAN 200 also includes a fronthaul link 235 coupled to the BBU 260 and the RRU 230 and utilizing an adaptive fronthaul protocol for communication between the BBU 260 and the RRU 230. In some embodiments, the fronthaul link 235 includes a non-deterministic communication link, where at least one of a latency, an arbitration, a bandwidth, a jitter, a packet order, a packet delivery, or some other characteristic of the communication link, cannot be determined with certainty in advance. In some embodiments, the fronthaul link 235 has a variable roundtrip latency with a maximum that is greater than a response time requirement for at least one message type sent by the wireless terminal and processed by the second-level protocol of the RAN 200. In at least one embodiment, the fronthaul link 235 exhibits jitter in excess of a maximum jitter requirement of the RAN 200, and in some embodiments, the fronthaul link 235 has a variable throughput with a minimum throughput less than a maximum throughput of the wireless terminal. Many embodiments utilize a fronthaul link 235 that includes an Ethernet network. In some embodiments, the adaptive fronthaul protocol comprises a packet-based protocol with non-guaranteed in-order packet delivery and/or non-guaranteed packet delivery, and may utilize an internet protocol (IP).

In the embodiment shown, at least one BBU 260 and at least one RRU 230 are connected through a logical transport channel which may be conveyed over a shared physical medium, the fronthaul link 235. For example, a protocol based on collision detection or collision avoidance, such as Ethernet, may be used to multiplex multiple transport channels over the shared medium. In such an embodiment, the reduced cost of fronthaul link 235 may significantly decrease the overall capital expenditure.

The fronthaul link 235 may include multiple networks and/or communication links coupled together with active network devices, such as bridges, routers, switches, and the like. In some installations, the fronthaul link 235 may include a link, such as a synchronous optical networking (SONET) link, from one or more BBUs 260 to a remote active network device, which then provides dedicated local links to two or more RRUs 230, such as 1000Base-T Ethernet links. In this configuration, the link from the active network device to the BBU 260 is shared by multiple RRUs. Depending on the configuration of the local network of RRUs, additional portions of the fronthaul link 235, which refers to the entire communication path between a BBU 260 and a RRU 230 may also be shared by multiple RRUs and/or multiple BBUs. Thus, in some installations, two or more remote radio units 230, each coupled to respective at least one antenna 231, may share at least a portion of the fronthaul link 235 to communicate with the BBU 360. Additionally, in some installations two or more baseband units 260 share at least a portion of the fronthaul link 235 to communicate with the RRU 230.

The BBUs 260 may have access to the core network 299 using a backhaul link 290 which may include the internet or a dedicated IP/Multiprotocol Label Switching (MPLS) network, via a suitable gateway node, or directly. Furthermore, some of the BBUs 260 may be remotely located in the "cloud", that is, data and control transport channels may be established between at least one remote BBU 260 and at least one RRU 230, and such a pipe may be routed over multiple different physical media, and may be processed by multiple intermediate network nodes, such as routers, switches, and the like.

Additional network nodes required by the network to operate properly, such as blocks belonging to the EPC network, the mobility management unit (MME), the home subscriber server (HSS), and the like, may also be remotely located and accessible via transport channels conveyed over the core network 299. In one implementation, at least one such network node may be co-located with at least one BBU 260.

In some embodiments, a hierarchical structure may be considered, consisting of multiple levels characterized by different latencies to the endpoints (RRUs) and taking care of different functions of either the access stratum (AS) or the non-access stratum (NAS).

In one example of the hierarchical structure, at least one RRU may be connected, via dedicated or shared medium, to a nearby BBU taking care of some of the PHY functions, MAC functions, and upper layer functions, or a subset thereof. At least one of the BBUs may be connected, via dedicated or shared medium, to a "regional-level" BBU taking care of other/different functions of either the AS or the NAS. The regional-level processing unit may be connected via transport channel conveyed over a dedicated or shared medium to additional BBUs, or may have direct access to the core network.

The various fronthaul and backhaul connections at different levels may have different characteristics in terms of throughput, latency, reliability, quality of service, and the like. For example, a fronthaul (connecting RRUs to nearby BBUs) may be based on dedicated fiber-grade backhaul, whereas the connection of BBUs to the core network may be conveyed over a shared medium using internet protocol (IP).

Embodiments described here utilize an adaptive fronthaul protocol for communication between the RRU and the BBU. An adaptive fronthaul protocol provides mechanisms for the BBU and/or RRU to react to changes in the environment, such as the fronthaul, the radio signal, the loads of the mobile terminals coupled to the RRUs, or other characteristics of the system, to provide a graceful adaptation to the changes instead of losing the connection between the BBU and RRU if the new conditions cannot support the previous parameters of the connection. Thus, the adaptive fronthaul protocol has provisions for adapting to conditions of the fronthaul link and radio network by changing the way data is communicated over the fronthaul link. Characteristics of an adaptive fronthaul protocol may include, but are not limited to, adapting a compression of the fronthaul uplink information and/or fronthaul downlink information, adapting an amount of loss of data caused by the compression, changing a parameter of the RAN based on characteristics of the fronthaul link, bypassing a function of a second-layer protocol of the RAN based on characteristics of the fronthaul link, using information from a second-layer protocol to change parameters in the a first-layer protocol, or other adaptations in how the fronthaul link is used. Such an adaptive fronthaul protocol allows a much more cost effective link, such as a packet-switching network, to be used in the fronthaul link. In some cases, this may allow for deployments without any special provisioning of the fronthaul link by allowing the fronthaul information to be transmitted over standard internet connections.

Figure 3:
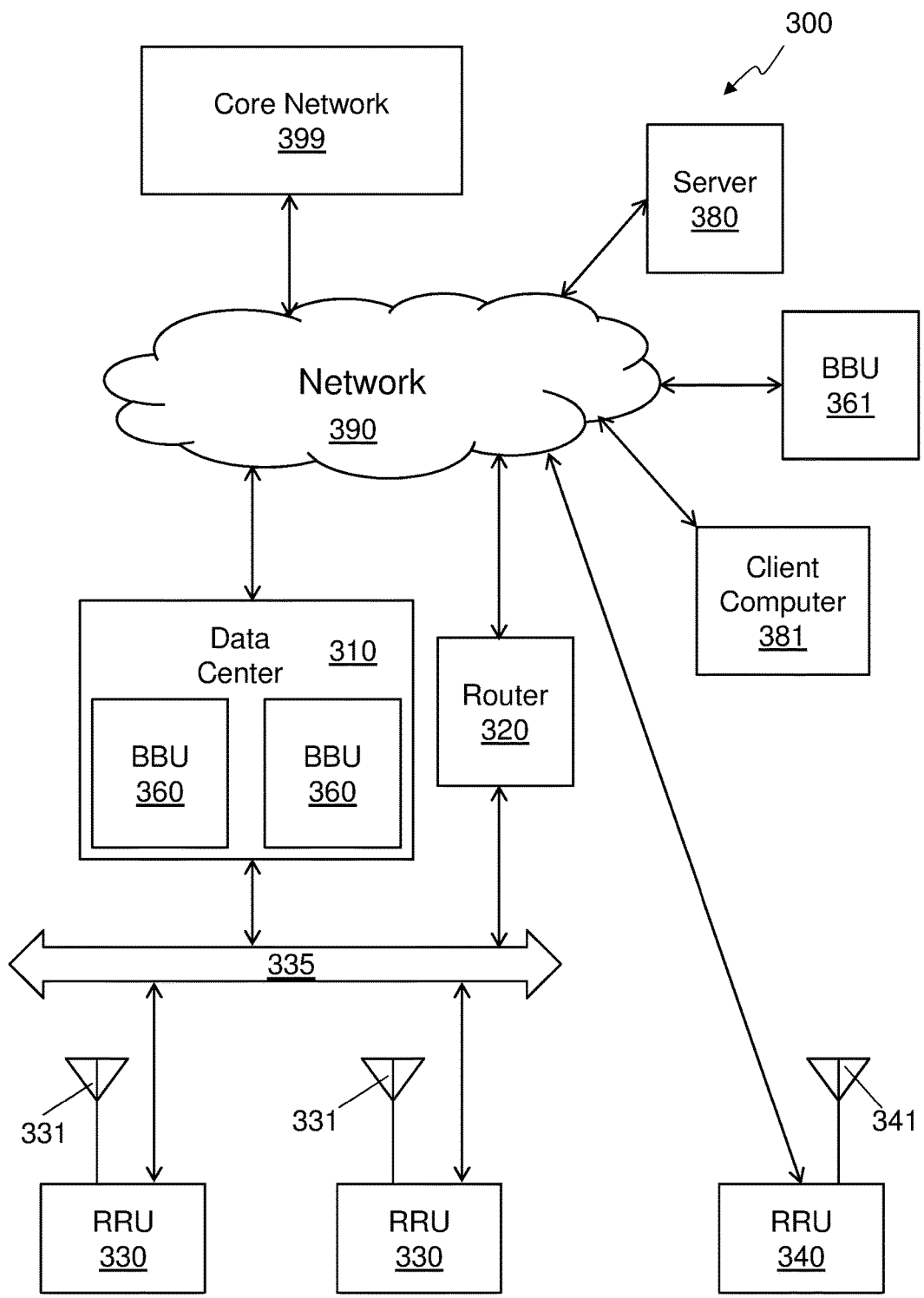
FIG. 3 is a block diagram of an alternative embodiment of a distributed RAN.

FIG. 3 is a block diagram of an alternative embodiment of a distributed RAN 300. If latency constraints on the fronthaul link can be relaxed by using certain techniques to mitigate the negative impacts of latency, different system and network architectures may be used for a RAN 300. Such alternative architectures may offer reduced capital and or operating expenditures, increased flexibility, improved reliability via redundancy, and the like.

The RAN 300 includes multiple BBUs 360 in a data center 310 that are coupled to multiple RRUs 330 through a shared non-deterministic fronthaul link 335. Each RRU 330 is coupled to at least one antenna 331 to communicate with wireless terminals, or user equipment (UE). The BBUs 360 in the data center 310 are coupled to a network 390 to provide access to a core network 399, such as an EPC of an E-UTRAN. The network 390 may be a part of the core network 399 in some embodiments, or may be a private managed network, or the public internet, depending on the embodiment. In some installations, the fronthaul link 335 may be coupled to the network 390 by active network equipment, such as the router 320. In some embodiments, the fronthaul link 335 may be a part of the network 390.

In some embodiments, the distributed RAN 300 may be referred to as a Cloud-RAN 300 which includes a BBU 361 coupled to the network 390 and a RRU 340 with antenna 341 coupled to the network 390. In some cases, a RRU 330 on the fronthaul link 335 may be coupled with the BBU 361. So in at least one embodiment, the fronthaul link includes at least one active network device 320, at least a first physical communication link 335 coupled between the RRU 330 and the at least one active network device 320, and at least a second physical communication link 390 coupled between the at least one active network device and the BBU 361. The network 390 may have other devices coupled to it, other than BBUs and RRUs such as the server 380 and the client computer 381. So in some embodiments, the fronthaul link, which includes network 390, is configured to carry fronthaul uplink information from the RRU 330 to the BBU 361, fronthaul downlink information from the BBU 361 to the RRU 330, and other information between at least two other devices 380, 381 coupled to the fronthaul link.

In FIG. 2 and FIG. 3 arrows connecting different building blocks may represent physical media (e.g., an optical fiber or twisted pair copper wires), or logical data and/or control pipes, e.g., based on the internet protocol (IP). Such logical connections may be conveyed over a shared or dedicated physical medium. In addition, blocks required for correct network functionality, e.g., routers, switches, gateways, and the like, may be present, although they are not explicitly represented in the figures above.

Figure 4:
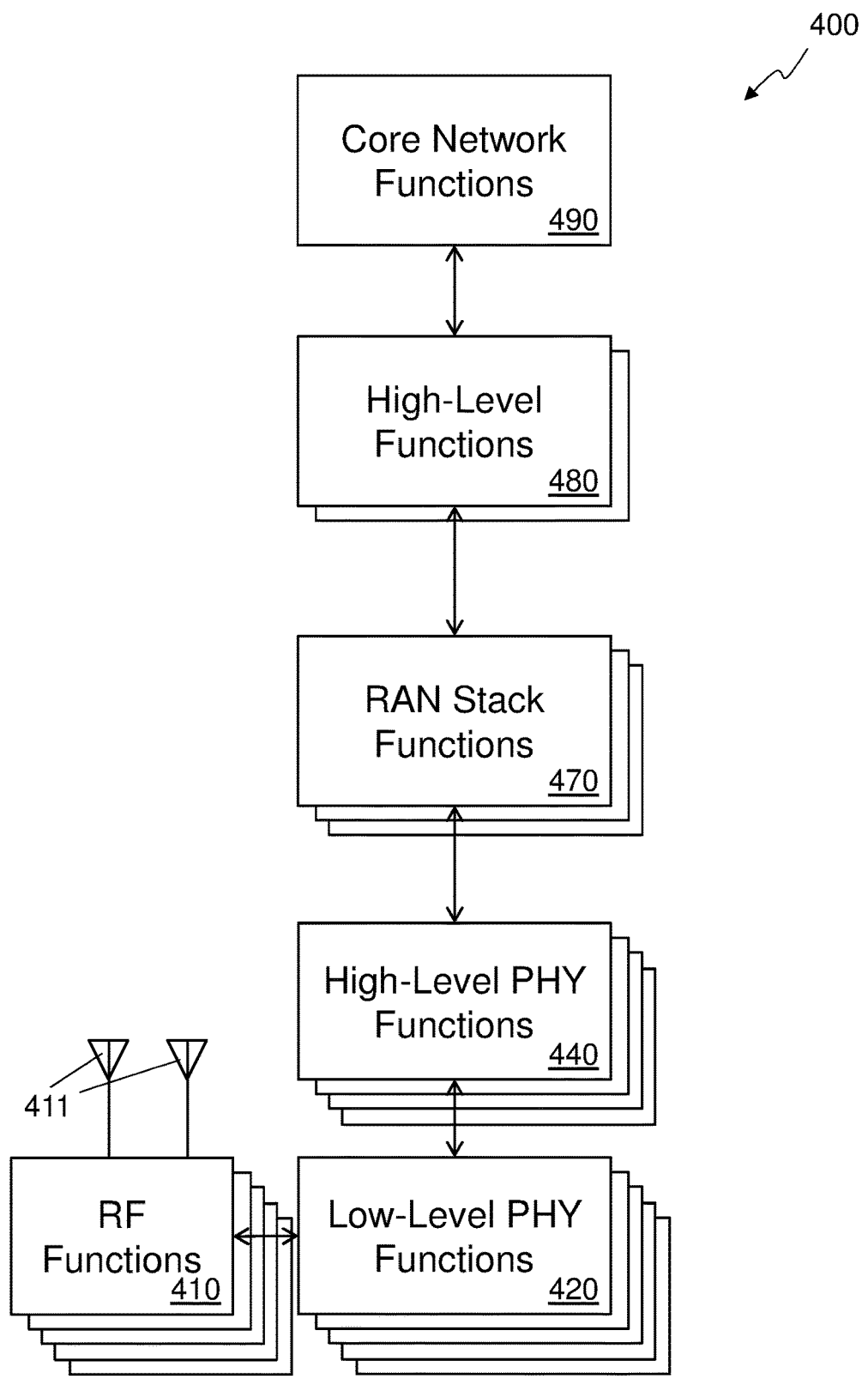
FIG. 4 shows a data flow diagram of an embodiment for a hierarchical structure for a RAN.

FIG. 4 shows a data flow diagram of an embodiment for a hierarchical structure 400 for a RAN. The structure 400, or stack, includes several different layers to perform various functions to enable the functions of the RAN. Each layer may include any combination of specialized electronic circuitry, specialized programmable circuitry, general purpose processors, other types of circuitry, firmware, and software. The software stack 400 has a generally hierarchical structure with modules at one level generally communicating to modules directly above and below it, although communication of some information and/or control may bypass one or more levels. In general, there may be more instances of a lower-level module than a module at the next higher layer, although this is not fixed and various embodiments may have any number of instances of any level in the stack 400. Generally, a higher-level module may include a more software-centric embodiment while lower-level modules may rely more on application-specific electronic circuitry, although any module may have any combination of hardware and software, depending on the embodiment. This is due to generally stricter timing requirements at lower levels as compared to upper levels, which may necessitate a more hardware-centric solution in some cases.

At the lowest level are the RF functions 410. There may be any number of blocks of RF functions 410 which are respectively coupled to any number of antennas 411. The RF functions include, but are not limited to, RF transmission and/or reception and tuning, RF amplification and/or gain control, frequency up-conversion, frequency down-conversion, filtering, analog-to-digital conversion and digital-to-analog conversion. The RF functions 410 may communicate with the other low-level physical-layer (PHY) functions 410 to exchange data and/or control information. In some embodiments, the communication uses digital baseband samples, which may be represented by a single value, or by a pair in-phase and quadrature (IQ) values, which may be referred to as a complex value or complex baseband sample. In some embodiments, the communication between the RF functions 410 and the low-level PHY functions 420 may use a proprietary interconnect, but in other embodiments a standard interconnect such as CPRI or OBSAI may be used.

The low-level PHY function 420 includes functionality defined by a first-layer protocol, such as a physical-layer protocol, of a RAN. One low-level PHY function module 420 may support one or more RF function modules 410 and may be co-located with its associated RF functions modules 410. The low-level PHY function 420 with an associated RF function 410 may be referred to as an access point. The exact split between the low-level PHY functions 420 and the high-level PHY functions 440 may vary between RAN architectures and between embodiments, but in some embodiments, the low-level PHY functions 420 receive frequency-domain information generated by the high-level PHY functions 440 and convert the frequency-domain information into the time-domain baseband samples for the RF functions 410. The low-level PHY functions 420 may include circuitry for Fourier transforms to convert frequency-domain information into time-domain information, and/or circuitry for inverse Fourier transforms to convert time-domain information into frequency-domain information. The Fourier-based functions can utilize any appropriate algorithm including, but not limited to a discrete Fourier Transform (DFT), a fast Fourier transform (FFT), an inverse discrete Fourier Transform (IDFT), an inverse fast Fourier transform (IFFT), or any other type of Fourier-based algorithm that may appropriately be used. The low-level PHY functions 420 may use an adaptive fronthaul protocol to communicate with the high-level PHY functions 440 and utilize a non-deterministic fronthaul link for that communication. The low-level PHY functions 420 may include circuitry to perform actions related to the adaptive fronthaul protocol, such as data compression and/or decompression, fronthaul link monitoring, and radio signal monitoring, and may communicate with the high-level PHY functions 440 about the monitoring.

The high-level PHY functions 440 include those functions defined by the first-layer protocol of the RAN, e.g. the physical layer, that are not included in the low-level PHY functions 420. The list of functions included may vary according to the RAN protocol and the embodiment, but may include functionality such as muxing, demuxing, modulation, demodulation, encoding, and/or decoding. In some embodiments there may be a one-to-one correspondence between a low-level PHY module 420 and a high-level PHY module 440, but in many embodiments, one high-level PHY module 440 may support two or more low-level PHY modules 420. There may also be embodiments, where a single low-level PHY module 420 communicates information to two or more high-level PHY functions 440, such as situations where two wireless terminals are on the same channel received by a single RF function module 410 which is fed to a single low-level PHY module 420, but the data from one wireless terminal is sent to one high-level function module 440 while the data from the other wireless terminal is sent to a different high-level function module 440.

The RAN stack functions 470 includes other protocol layers above the first level, such as a second-level, or data link layer, protocol, and may vary according to the RAN protocol and the embodiment. In at least one embodiment for an Evolved Universal Terrestrial Radio Access Network (E-UTRAN), the first-level protocol utilizes an Evolved Universal Terrestrial Radio Access (E-UTRA) physical-layer (PHY) protocol and the second-level protocol utilizes an E-UTRA medium access control (MAC) protocol. The RAN stack functions 470 may include other functionality, such as layers corresponding to a network layer, a transport layer, and/or a session layer. Continuing to use the E-UTRAN as an example, the RAN stack functions module 470 may also include one or more of the radio link control (RLC) layer, the packet data convergence protocol (PDCP) layer, and the radio resources control (RRC) layer.

The high-level functions 480 may vary according to the RAN and the embodiment but may include functions related to higher level protocols such as the presentation layer and the application layer, and may include functions such as channel assignment, tone assignment, scheduling, or other functions, such as functionality that may be defined by one of the RAN protocol layers. In some embodiments, a RAN protocol layer may be included in the high-level function 480 instead of the RAN stack functions 470. The high-level functions 480 may be a regional-level function. The core network functions 490 provide access to other resources in the core network, the EPC in E-UTRAN, as well as resources outside of the core network, such as the internet.

The modularity shown in the stack 400 is an example only and many other partitioning options may be used in embodiments. In some embodiments, one or more of the block may be split into two or more blocks, and in other embodiments, two or more of the blocks shown may be merged into a single block. In one particular embodiment, the RF functions 410 and the low-level PHY functions 420 are combined into a remote radio unit (RRU), and the high-level PHY functions 440 and at least a portion of the RAN stack functions 470 are included in a baseband unit (BBU). The RRU may be managed, and its operation controlled, by the BBU. The BBU may configure the RRU via suitable management and operation (MaO) protocol units (PU). Each MaO PU can set one or more parameters. A non-exhaustive list of parameters for an example RRU is shown below:

Center frequency and bandwidth, separately for UL and DL
  Vectors when carrier aggregation is supported
Sampling frequency
Transmission and reception filters, both in analog domain and digital domain (if present and if configurable)
FFT size, cyclic prefix (CP) length (pattern of CP lengths, if different for different symbols)
Operations such as DC removal, frequency shifts, and the like to be applied to the transmitted and/or received samples
Mapping of logical antennas to physical antennas, along with corresponding linear precoding matrix
AGC parameters
Predefined constellations for transmission (for each constellation, a set of complex numbers is provided that defines the location of each constellation point)
Management operations include
Query features of RRU
Query RRU's log, recent events, statistics (e.g., uptime)
Query RRU's GPS information, whenever present (e.g., accurate location)
Restart RRU
Push SW update to RRU
Put RRU in idle mode (that is, turn off TX and/or RX chain)
MaO PUs are also used by RRU for diagnostic purposes (report errors, log, and statistics) and to inform BBU about RRU's capabilities such as
  Number of physical antennas
  Supported bands and bandwidths
  Preferred sampling rate, oscillator accuracies
  Amount of installed memory available for buffers, HW capabilities, and the like
  HW and SW version Many other parameters may be included in embodiments of an RRU that may be read and/or written by the BBU to manage and control the operation of the RRU.

Figure 5:
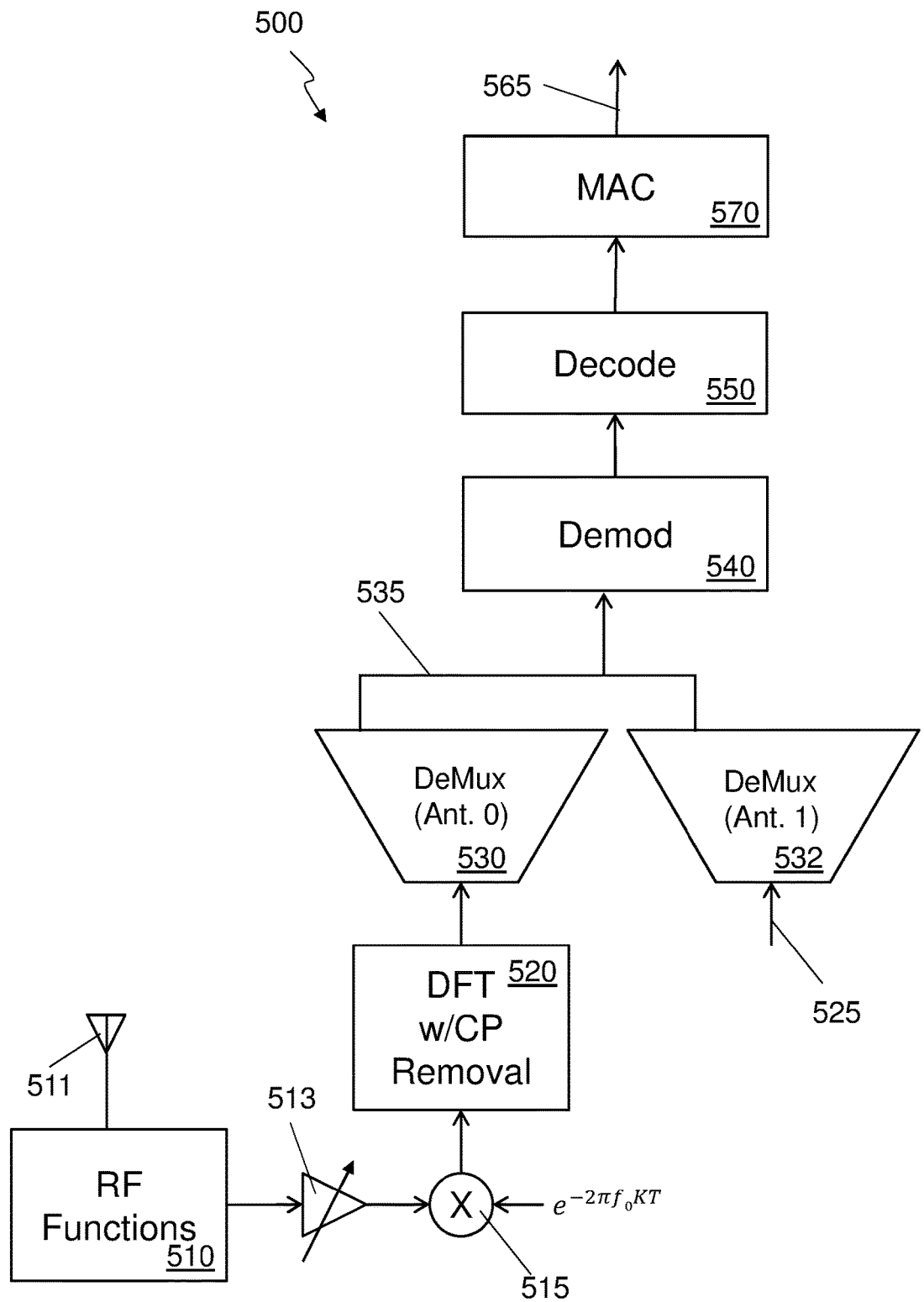
FIG. 5 shows a data flow diagram for an embodiment for receiving PUSCH data at an eNB of an E-UTRA network.

FIG. 5 shows a data flow diagram for an embodiment for receiving PUSCH data at an eNB of an E-UTRA network; A portion of an eNB receiver 500 is shown to illustrate data (i.e., PUSCH) reception. Reception of different physical channels, e.g., PUCCH, may share most of the building blocks described for PUSCH receiver.

An RF signal from an antenna 511 is suitably processed by the RF functions block 510 to obtain baseband (BB) samples. Such RF processing may include amplification, down-conversion, filtering, automatic gain control (AGC), analog to digital conversion (ADC), and the like. Next, the time-domain BB samples may be further processed—such processing may include scaling, de-rotation, filtering, removal of cyclic prefix (CP), serial to parallel conversion, and the like. A gain may be adjusted or a DC level shifted by the amplifier block 513 and the frequency shifted for purposes such as Doppler shift compensation, at frequency shift block 515. Signals from different receive antennas may be processed independently.

The BB time-domain samples may be transformed into frequency-domain samples via a discrete Fourier transform (DFT) 520, which may be implemented using a fast-Fourier transform (FFT) algorithm or any other appropriate algorithm. For every execution of the DFTs (e.g., one per antenna), different tones may be assigned to different processing blocks, depending on the tone allocation for the SC-FDMA symbol. This is handled by the demux blocks 530, 532. As an example, all tones belonging to a specific PUSCH may be fed to a per-PUSCH processing chain. The demux 530 receives the frequency-domain data from the DFT block 520 based on the RF signal received on antenna 511 and selects the tones assigned to the particular PUSCH to output 535. The demux 532 accepts the frequency-domain data 525 related to another antenna, and selects the tones for the particular PUSCH to output 535. The combined selected frequency-domain data 535 is then sent to a processing chain that may include channel estimation, equalization, demodulation 540, and decoding 550 for the PUSCH. The decoded bits and other information may be fed to the MAC layer 570 for further processing which then sends its output 565 to higher level protocols for additional processing.

In an alternative implementation, all tones belonging to at least one PUSCH may be fed to a single processing block which may jointly perform channel estimation, equalization, demodulation, and decoding, for all PUSCH co-scheduled on a given set or resource blocks (RBs). The joint processing may include at least one of joint channel estimation, joint equalization, joint demodulation and decoding, iterative cancellation of reference sequence, iterative cancellation of data tones, turbo-equalization, turbo-channel-estimation, and the like.

The receiver processing blocks described above may be implemented with dedicated hardware, or as software components executed on general purpose computers, or the like. Furthermore, different blocks may be implemented by dedicated or general purpose devices, computers, or data centers, in different physical locations. For example, RF processing may be co-located with antennas, whereas other processing blocks may be remotely located (with respect to antennas), e.g., in a remote data center, which may also be called a central office.

Figure 6:
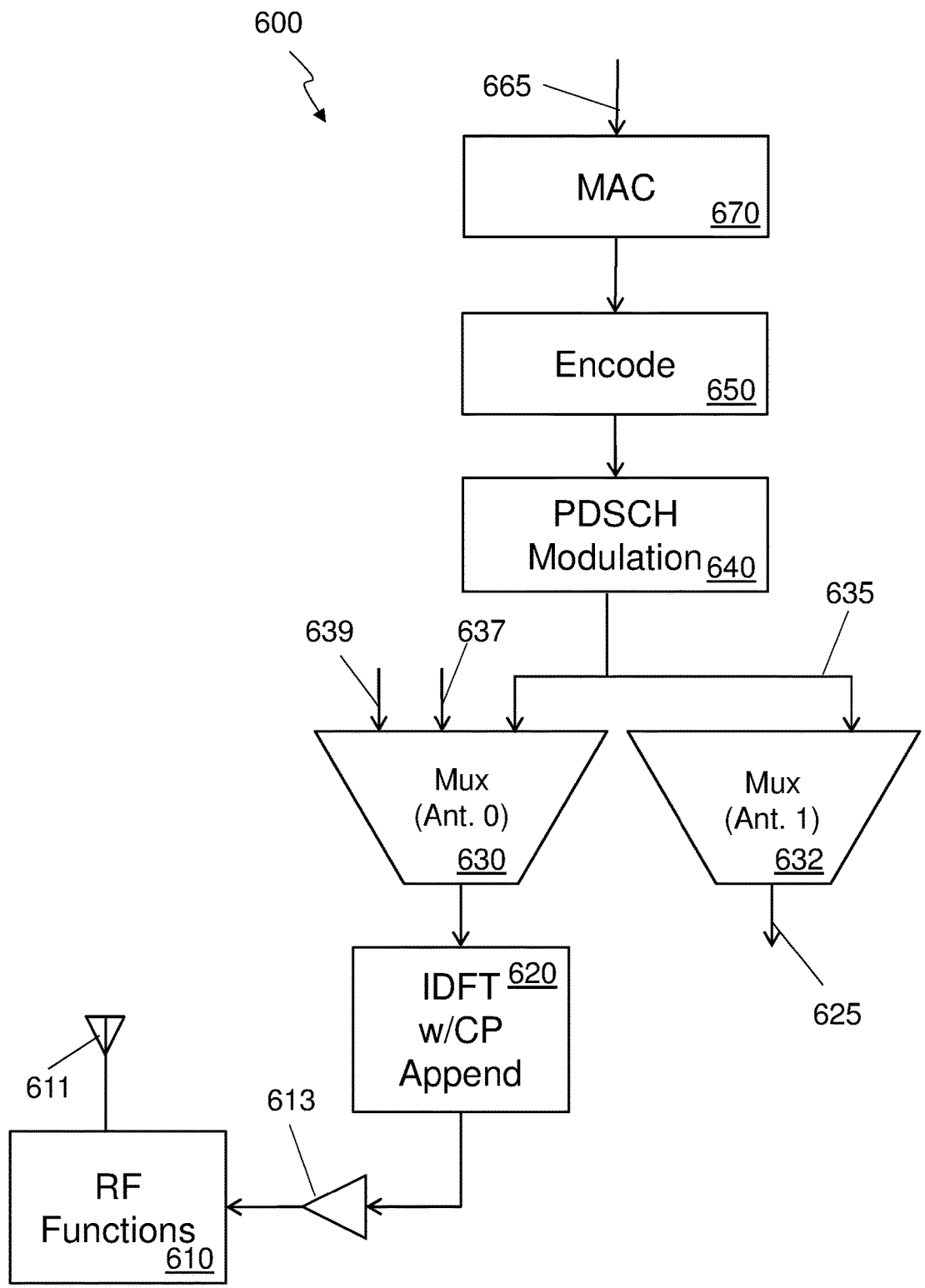
FIG. 6 shows a data flow diagram for an embodiment for transmitting PDSCH data from an eNB of an E-UTRA network.

FIG. 6 shows a data flow diagram for an embodiment for transmitting PDSCH data from an eNB of an E-UTRA network. The portion of the eNB transmitter 600 shown in FIG. 6 emphasizes transmission of shared data channel (PDSCH). Data units 665 are processed by the MAC layer 670 are then encoded 650 and modulated 640 separately for each PDSCH, and the corresponding frequency-domain samples may be suitably mapped depending onto the PDSCH tone allocation by muxes 630, 632. A separate mux may be included for each antenna to select the frequency-domain samples from separate PDSCH assigned to tones of a carrier frequency. The mux 630 for antenna zero 611 receives the frequency-domain samples from the PDSCH modulator 640 as well as frequency-domain samples from second PDSCH 637 and a third PDSCH 639 and selectively multiplexes the assigned tones to its output which is sent to the IDFT 620. The mux 632 for antenna one receives the frequency-domain samples from the PDSCH modulator 640 as well as frequency-domain samples from other PDSCH modulators (not shown) to selectively multiplex their assigned tones to its output 625.

The frequency-domain tones are then transformed to time-domain baseband samples via an inverse discrete Fourier transform (IDFT), for example implemented using an inverse fast Fourier transform (IFFT) algorithm, and the time-domain samples so obtained may be subject to further processing, e.g., scaling 613, rotation, CP appending, and the like. These BB samples may be further processed by an RF processing unit 610 which may include digital to analog conversion (DAC), amplification, filtering, and the like, and then are broadcast as an RF signal from antenna 611.

In an alternative implementation, multiple PDSCH co-scheduled on the same slot (e.g., PDSCH dedicated to different users), may be jointly processed before mapping and IDFT. The joint processing may include, joint linear beamforming, joint non-linear beamforming, and the like.

The transmitter processing blocks described above may be implemented with dedicated hardware, as software components executed by general purpose computers, or the like. Furthermore, different blocks may be implemented by dedicated or general purpose devices, computers, or data centers, in different physical locations. For example, RF processing may be co-located with antennas, whereas other processing blocks may be remotely located (with respect to antennas), e.g., in a remote data center.

Figure 7:
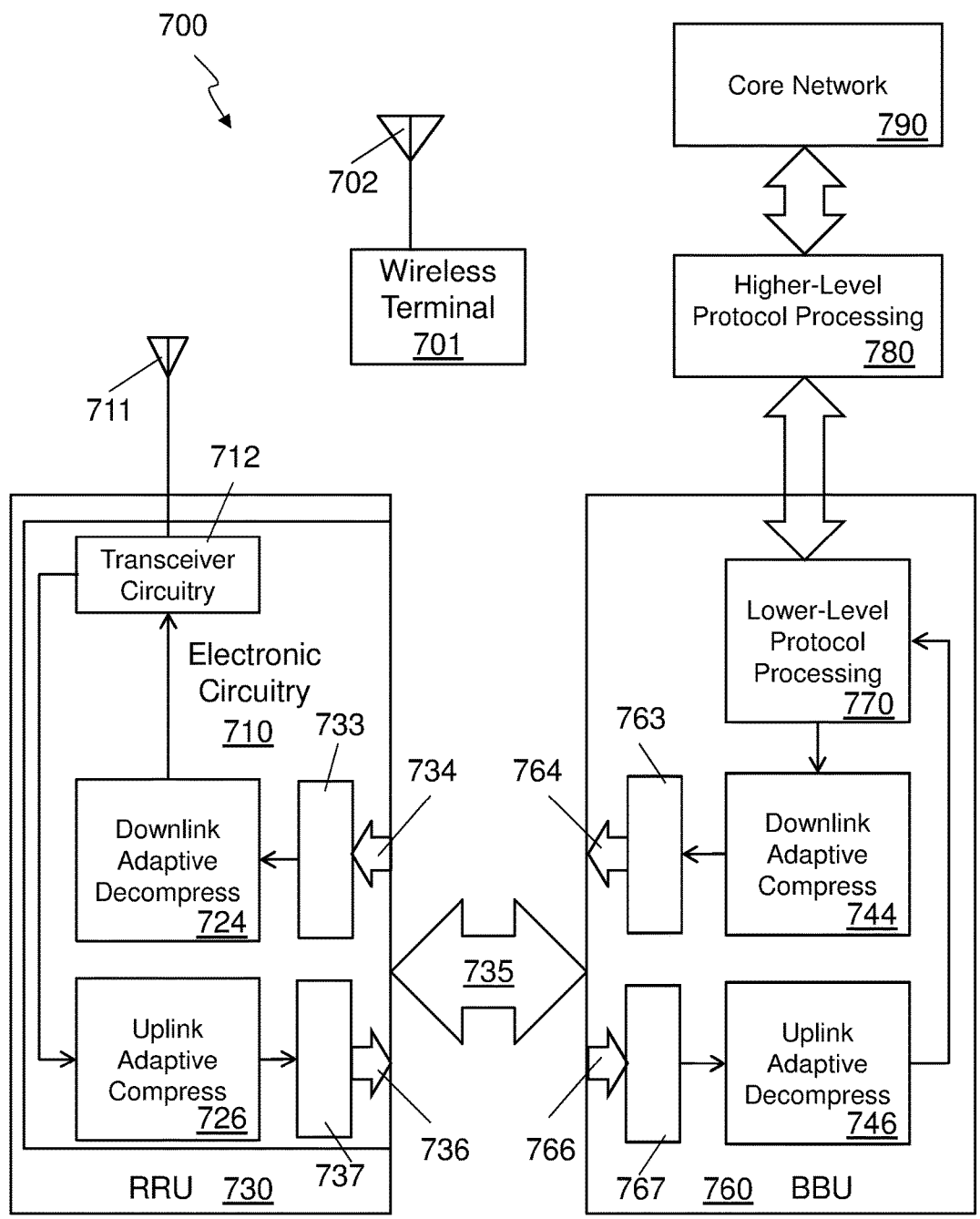
FIG. 7 is a detailed block diagram of an embodiment of a distributed RAN.

FIG. 7 is a detailed block diagram of an embodiment of a distributed RAN 700. The RAN 700 includes a remote radio unit (RRU) 730 coupled to at least one antenna 711, and a baseband unit (BBU) 760 coupled to the core network 790. A fronthaul link 735 is coupled to the BBU 760, through interface circuitry 764, 766, and the RRU 730. The fronthaul link utilizes an adaptive fronthaul protocol for communication between the BBU 760 and the RRU 730. The RRU 730 includes electronic circuitry 710 to perform at least a first portion of a first-level protocol of a radio access network (RAN) 700 for communicating between the wireless terminal 701 and the core network 790. The BBU 760 is configured to perform at least a second-level protocol of the RAN 700 in the lower level protocol processing block 770. The RAN 700 provides the wireless terminal 701 with access to the core network 790 through an RF signal sent between the antenna 702 of the wireless terminal 701 and the antenna 711 of the RRU 730. The BBU 760 may be coupled to the core network 790 through a computing system that provides higher level protocol processing 780, such as additional layers of the stack 400 shown in FIG. 4.

In embodiments, the electronic circuitry 710 of the RRU 730 includes receiver circuitry, shown as transceiver circuitry 712, to receive a radio frequency signal from the at least one antenna 711 and convert the received radio frequency signal to digital baseband samples. The electronic circuitry 710 also includes adaptive compression circuitry 726 to adaptively compress the digital baseband samples into fronthaul uplink information based on information received from the BBU 726 over the fronthaul link 735, and interface circuitry 734, 736 to send the fronthaul uplink information to the BBU 760 over the fronthaul link 735 using the adaptive fronthaul protocol. In some systems the adaptive compression performed by the adaptive compression circuitry 726 is lossy. The BBU 760 may include an uplink adaptive decompression block 746 to decompress the uplink data received from the RRU 730.

The BBU 760 may be configured to send frequency-domain information over the fronthaul link 730 to the RRU 730. The frequency-domain information may include a tonemap descriptor describing a set of tones to be used by the RRU 730 to generate a radio frequency signal for transmission to the wireless terminal 701, and data identifying modulation symbols for tones of the set of tones, and times associated with the modulation symbols. This representation of the frequency-domain information is form of adaptive compression performed by the downlink adaptive compression block 744.

In systems, the electronic circuitry 710 of the RRU 730 may include downlink adaptive decompression circuitry 724 that has expansion circuitry to generate complex frequency-domain samples based on the data identifying the modulation symbols for the tones, inverse Fourier Transform circuitry to create complex time-domain baseband samples from the complex frequency-domain samples. The electronic circuitry 710 may also include transmitter circuitry, shown as transceiver circuitry 712, to convert the complex time-domain baseband samples into a radio frequency signal to send to the wireless terminal through the at least one antenna 711 at the times associated with the modulation symbols.

In various embodiments, the RRU 730 may include a buffer 733 to hold irregularly received downlink data from the fronthaul link 735 to enable a constant stream of information to be provided for a radio frequency signal sent to the wireless terminal 701. A size of the buffer 733 may be adapted based on a fronthaul quality indicator or information received from the BBU 760. The RRU 730 may include a buffer 737 to hold irregularly sent uplink data for the fronthaul link 735 to enable a constant stream of information to be received from a radio frequency signal sent by the wireless terminal. A size of the buffer 737 may be adapted based on a fronthaul quality indicator or information received from the BBU 760. The BBU 760 may also include an uplink buffer 767 and/or a downlink buffer 763.

In some systems, the BBU 760 can determine an indicator of fronthaul link quality, and dynamically change one or more parameters of the RAN 700 based on the indicator. The indicator of fronthaul link quality may be determined based, at least in part, on information received by the BBU 760 from the RRU 730. The information received by the BBU 760 from the RRU 730 may include RRU buffer status information, RRU buffer overrun indications, RRU buffer underrun indications, information about a received radio frequency signal, or any combination thereof. In some systems the indicator of fronthaul link quality is determined based, at least in part, on a latency of the fronthaul link 735, a bandwidth of the fronthaul link 735, errors on the fronthaul link 735, undelivered packets on the fronthaul link 735, out-of-order packets on the fronthaul link 735, BBU buffer overruns, BBU buffer underruns, or any combination thereof. The one or more parameters of the RAN 700 may include frequency-domain allocation size, modulation and coding schemes, number of users, number of grants, pattern of usable subframe, anticipation of scheduling with respect to a time index it refers to, or any combination thereof. In at least one embodiment, the indicator of fronthaul link quality includes a latency of the fronthaul link, and the one or more parameters of the RAN include a ra-ResponseWindowSize parameter in a MAC protocol of an E-UTRA network.

Figure 8:
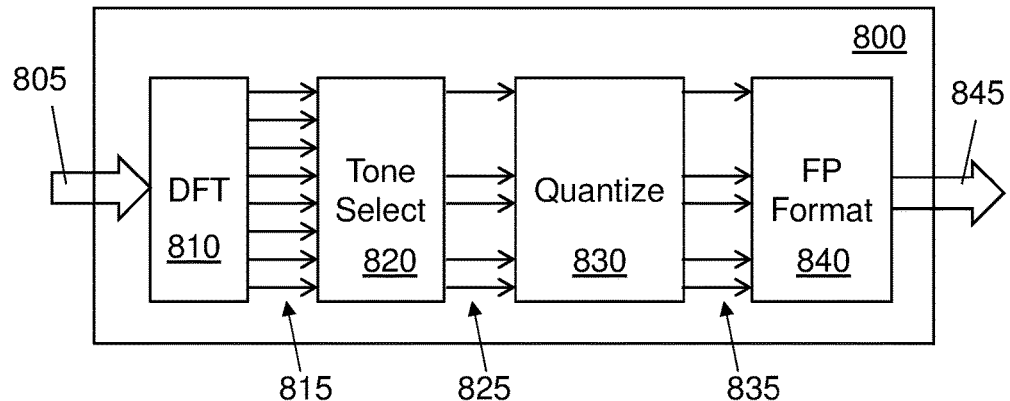
FIG. 8 is a block diagram of an embodiment of adaptive compression circuitry in a RRU.

FIG. 8 is a block diagram of an embodiment of adaptive compression circuitry 800 in a RRU. Frequency-domain (FD) samples may be transmitted in at least one downlink (DL) connection (that is, from BBU to RRU) and/or in at least one uplink (UL) connection (that is, from RRU to BBU). Each of the connections utilizes bandwidth resources on the fronthaul link. To reduce the bandwidth utilization, the FD sample may be adaptively compressed using adaptive compression circuitry 800. The adaptive compression circuitry 800 shown is for UL data, but many of the same techniques could be used for DL FD data. The adaptive compression circuitry 800 could be used as the adaptive compression circuitry 726 in FIG. 7.

One way of adaptively compressing the FD data is to discard tones of the underlying OFDM modulation that are not used during a particular block of time. In embodiments, the adaptive compression circuitry 800 includes Fourier transform circuitry 810 to convert the digital baseband samples 805 into frequency-domain information 815 for a set of received tones, and selector circuitry 820 to adaptively compress the frequency-domain information 815 into the fronthaul uplink information 845 by discarding information related to at least one tone of the set of received tones identified based on the information received from the BBU. This generates information from a set of reportable tones 825. In embodiments, the at least one tone is included in a set of receivable tones identified based on setup information received from the BBU and is excluded from a subset of tones identified by a tonemap descriptor received from the BBU.

In embodiments, the selector circuitry 820 may be adapted to discard information related to a first set of unreported tones, which are included in a set of receivable tones and the set of received tones, but excluded from a first set of tones, from first frequency-domain information associated with a first time period, and discard information related to a second set of unreported tones, which are included in the set of receivable tones and the set of received tones, but excluded from a second set of tones, from second frequency-domain information associated with a second time period. The information received from the BBU includes first information, received prior to the first time period, identifying the first set of tones associated with the first time period, second information, received prior to the second time period, identifying the second set of tones associated with the second time period, and setup information, received prior to the first time period and the second time period, identifying the set of receivable tones, The frequency-domain information 815 includes the first frequency-domain information and the second frequency-domain information.

Another way that the FD data can be compressed is by using a dynamic quantization level. The FD samples are generated at a finite-precision. The representation of the UL FD samples and the DL FD samples may be done at different quantization levels, or bit-widths. For example, the UL FD bit-width may be greater (i.e. based on a smaller quantization level) than the DL FD bit-width, reflecting the fact that the UL FD samples are expected to have greater dynamic range because they are affected by the fading occurring over the radio channel.

In one implementation, the finite-precision representation of the UL FD may use different quantization levels for different conditions of the radio links between the relevant RRUs and the relevant UEs, or for different conditions of the links between the relevant RRUs and the relevant BBUs, or the like. Similar dynamic quantization level strategies may be used in DL FD transmissions. For example, the FD samples may be transmitted with quantization level that varies as a function of the radio signal-to-noise ratio (SNR), reflecting the fact that greater quantization noise in the FD samples may be tolerated as the radio SNR decreases. Similarly, the FD samples may be transmitted with quantization level that varies as a function of the PHY modulation scheme and/or the PHY code rate, reflecting the fact that more quantization noise in the FD samples may be tolerated in the presence of low-order PHY modulation schemes and/or low PHY code rates (e.g., rate-0.3 QPSK transmissions may be more robust to quantization noise than rate-0.8 64QAM transmissions). Alternatively or in addition, the FD samples may be transmitted with quantization level that varies as a function of the number of co-scheduled users or the number of spatial MIMO streams, reflecting the fact that quantization noise may be more detrimental in the case of multiple co-scheduled spatial streams. Moreover, the FD samples may be transmitted with a quantization level that adapts to the fronthaul link bandwidth available between RRU and BBU, either statically or dynamically. For example, when the fronthaul link is shared with others, the FD samples may be transmitted with larger quantization level (few bits per sample) as the available bandwidth on the shared link decreases.

FD samples may have different representations, e.g., different bit-widths and the like, on different tones of group of tones of the same symbol. For example, if different physical channels with different SINRs, modulation formats, code rates, or the like, are multiplexed in the same symbol, FD samples corresponding to different channels may have different representations.

In some embodiments, the quantization may be performed as a part of the Fourier transform operation. So in some systems, the adaptive compression circuitry 800 includes Fourier transform circuitry 810 to convert the digital baseband samples 805 into frequency-domain information 835 with a quantization level dynamically determined based on information received from the BBU or determined by the RRU based on estimates of received radio frequency power, received radio frequency noise, signal quality, modulation scheme, coding scheme, or any combination thereof. The information received from the BBU may be determined by the BBU, based on a radio signal-to-noise ratio, a physical layer modulation scheme, a physical layer code rate, an available bandwidth of the fronthaul link, or any combination thereof.

Another method of adaptively compressing the data is to use a shared-exponent format for the data. In some embodiments, a real or complex floating-point representation of the FD samples is used. For example, a mantissa/exponent floating-point representation may be used (e.g., see standard IEEE 754), and a group of N complex-valued samples may be typically represented by using one mantissa and one exponent for each complex dimension, which gives total of 2N mantissas and 2N exponents. By utilizing a shared-exponent format, one common, or shared, exponent may be used to represent the entire set of the 2N real-valued numbers, associating the 2N mantissas with that common exponent, thus saving bandwidth of (2N−1) exponents' representations. Note that, when the 2N real-valued numbers have similar ranges, the quantization noise for the shared-exponent format and the quantization noise for the described individual-exponent representation may be considered similar. This representation may be used, for example, for FD samples that are expected to have similar power, such as FD samples from the same LTE resource block, or samples from radio resources that are close in a suitable radio dimension (e.g., time, frequency, space), or that belong to the same physical channel, or the like. Similar strategies may be used in DL FD transmissions and for real-valued FD floating-point representations.

So in some systems, the adaptive compression circuitry 800 includes Fourier transform circuitry 810 to convert the digital baseband samples 805 into frequency-domain information 815 comprising at least a first frequency-domain sample having a floating-point format and a second frequency-domain sample having the floating-point format. Formatter circuitry 840 may be included to compress the frequency-domain information 815, based on information received from the BBU, into a shared-exponent format that includes a mantissa value for the first frequency-domain sample, a mantissa value for the second frequency-domain sample, and a single shared-exponent value for both the first frequency-domain sample and the second frequency-domain sample. The fronthaul uplink information 845 then includes the frequency-domain information in the shared-exponent format. The fronthaul uplink information 845 may also include additional mantissa values for additional frequency-domain samples associated with the single shared-exponent value.

Figure 9:
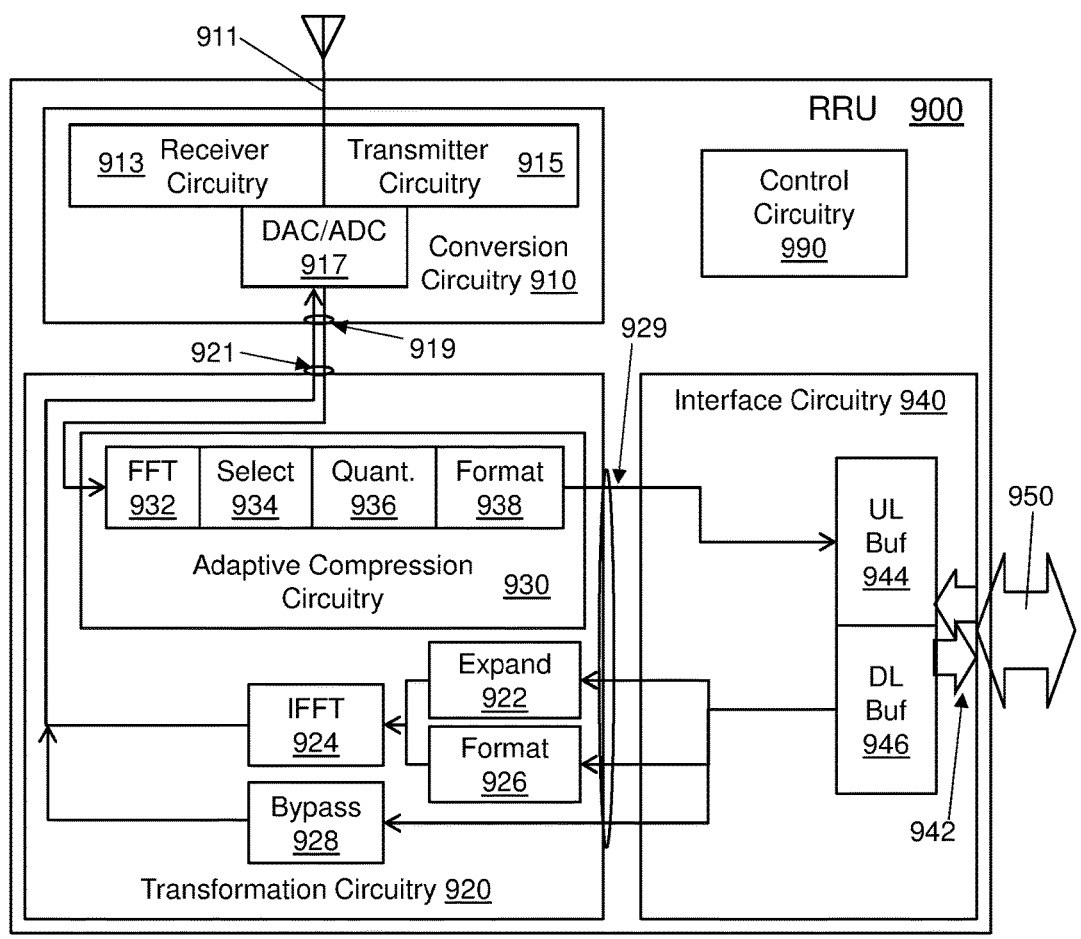
FIG. 9 is a block diagram of an embodiment a RRU.

FIG. 9 is a block diagram of an embodiment a remote radio unit (RRU) 900 for use with a baseband unit (BBU) in a distributed radio access network (RAN). The RRU 900 includes conversion circuitry 900 with a radio frequency analog interface 911 and digital baseband interface 919. The RRU 900 also includes transformation circuitry 920 with a baseband interface 921 coupled to the digital baseband interface 919 of the conversion circuitry 910, and a fronthaul interface 929. The RRU 900 also includes interface circuitry 940 coupled to a fronthaul link 950 and to the fronthaul interface 929 of the transformation circuitry 920, and adapted to communicate over the fronthaul link 950 using an adaptive fronthaul protocol. Control circuitry 990 is coupled to the interface circuitry 940, the transformation circuitry 920, and the conversion circuitry 910. In some embodiments, the RRU 900 is configured to perform at least a portion of a physical-layer (PHY) protocol of the RAN, wherein the RAN comprises an Evolved Universal Terrestrial Radio Access Network (E-UTRAN).

The conversion circuitry 910 also includes receiver circuitry 913 to receive a radio frequency signal from a wireless terminal through the radio frequency analog interface 911 and convert the received radio frequency signal to digital baseband samples, using an analog-to-digital converter 917, sent through the digital baseband interface 919 to the transformation circuitry 920. The transformation circuitry 920 includes adaptive compression circuitry 930 to adaptively compress the digital baseband samples into fronthaul uplink information under control of the control circuitry 990, and send the fronthaul uplink information to the interface circuitry 940 though the fronthaul interface 929. The interface circuitry 940 includes fronthaul link drivers 942 to send the fronthaul uplink information over the fronthaul link 950 to the BBU.

The control circuitry 990 is configured to receive information from the BBU over the fronthaul link 950 through the interface circuitry 940 and control the adaptive compression circuitry 930 based on the received information. Any type of compression may be performed by the adaptive compression circuitry 930, depending on the embodiment, but in some embodiments, the adaptive compression is lossy.

The control circuitry 990 may use the information received from the BBU to determine tones to report and/or tones to discard as a part of the adaptive compression. In some embodiments, the control circuitry 990 is configured to identify reportable tones based on a tonemap descriptor received from the BBU and provide the reportable tones to the adaptive compression circuitry 930. The adaptive compression circuitry 930 may include Fourier transform circuitry 932, to convert the digital baseband samples into frequency-domain information for a set of received tones. The Fourier transform circuitry 932 may be an FFT, a DFT, or some other form of Fourier transform. The adaptive compression circuitry 930 also includes circuitry to select information 934 related to the reportable tones from the frequency-domain information to include in the fronthaul uplink information, wherein the reportable tones are a subset of the set of received tones and at least one tone of the set of received tones is not included in the reportable tones. In some embodiments, the digital baseband samples include pairs of in-phase and quadrature samples at discrete points in time, and the frequency-domain information includes complex samples for the set of received tones.

In at least one embodiment, the control circuitry 990 identifies a first set of reportable tones based on a first tonemap descriptor included in the received information from the BBU, and provides the first set of reportable tones to the adaptive compression circuitry 930. The control circuitry 990 also identifies a second set of reportable tones based on a second tonemap descriptor included in the received information from the BBU and provides the second set of reportable tones to the adaptive compression circuitry 930. In such embodiments, the adaptive compression circuitry includes Fourier transform circuitry 932 to convert the digital baseband samples into frequency-domain information for a set of received tones, circuitry to select 934 first information related to the first set of reportable tones in the frequency-domain information associated with a first period of time to be included in the fronthaul uplink information and circuitry to select 934 second information related to the second set of reportable tones in the frequency-domain information associated with a second period of time to be included in the fronthaul uplink information. The first set of reportable tones and the second set of reportable tones are different subsets of the set of received tones.

In some embodiments the select circuitry 934 is configured to discard a subset of the frequency-domain information related to at least one tone of the set of received tones, and include a remaining subset of the frequency-domain information related to tones of the set of received tones other than the at least one tone, in the fronthaul uplink information, under control of the control circuitry 990, which is configured to identify the at least one tone based on the information received from the BBU. The at least one tone is included in a set of receivable tones identified based on setup information received from the BBU and is excluded from a subset of tones identified by the information received from the BBU. In embodiments, select circuitry 934 is configured by the control circuitry 990 to discard information related to a first set of unreported tones from first frequency-domain information associated with a first time period, and discard information related to a second set of unreported tones from second frequency-domain information associated with a second time period. The first set of unreported tones are included in a set of receivable tones and the set of received tones but excluded from a first set of tones, and the second set of unreported tones are included in the set of receivable tones and the set of received tones but excluded from a second set of tones. In such embodiments, the information received from the BBU includes a first tonemap descriptor, received prior to the first time period, identifying the first set of tones associated with the first time period, a second tonemap descriptor, received prior to the second time period, identifying the second set of tones associated with the second time period, and setup information, received prior to the first time period and the second time period, identifying the set of receivable tones, where the frequency-domain information comprises the first frequency-domain information and the second frequency-domain information.

In some embodiments, the adaptive compression circuitry 930 includes quantization circuitry 936 to quantize the frequency-domain information from the FFT circuitry 932 to generate the fronthaul uplink information at a quantization level dynamically determined by the control circuitry 990 based on measurements or estimates of received radio frequency power, received radio frequency noise, signal quality, modulation scheme, coding scheme, an available fronthaul bandwidth, or any combination thereof. The interface circuitry 940 may include an uplink buffer 944 to temporarily store the fronthaul uplink information after it is generated until it is sent over the fronthaul link 950. The control circuitry 990 may determine available fronthaul bandwidth based, at least in part, on an unsent amount of the fronthaul uplink information stored in the buffer 944. In some embodiments, the quantization circuitry 936 generates the fronthaul uplink information at a quantization level dynamically determined by the control circuitry 990 based, at least in part, on a determination of available fronthaul bandwidth. The control circuitry 990 may determine a quantization level based, at least in part, on the information received from the BBU, and dynamically provide the quantization level to the adaptive compression circuitry 930 to generate the fronthaul uplink information, using the quantization circuitry 936, at a quantization level. In embodiments, the information received from the BBU may be determined, by the BBU, based on a radio signal-to-noise ratio, a physical layer modulation scheme, a physical layer code rate, an available bandwidth of the fronthaul link, or any combination thereof.

In some embodiments, the Fourier transform circuitry 932 converts the digital baseband samples into frequency-domain information in a floating-point format having at least a first frequency-domain sample and a second frequency-domain sample. The adaptive compression circuitry 930 includes formatter circuitry 938 to compress the frequency-domain information into shared-exponent frequency-domain information that comprises one mantissa value for the first frequency-domain sample, one mantissa value for the second frequency-domain sample, and a single shared-exponent value for both the first frequency-domain sample and the second frequency-domain sample. The fronthaul uplink information includes the shared-exponent frequency-domain information. The fronthaul uplink information may also include additional mantissa values for additional frequency-domain samples associated with the single shared-exponent value.

In some embodiments, the Fourier transform circuitry 932 converts the digital baseband samples into frequency-domain information in a floating-point format having at least a first complex frequency-domain sample and a second complex frequency-domain sample. The adaptive compression circuitry 930 includes formatter circuitry 938 to compress the frequency-domain information into shared-exponent frequency-domain information that includes two mantissa values for the first complex frequency-domain sample, two mantissa values for the second complex frequency-domain sample, and a single shared-exponent value for both the first complex frequency-domain sample and the second complex frequency-domain sample. The fronthaul uplink information includes the shared-exponent frequency-domain information. The fronthaul uplink information may also include additional mantissa values for additional complex frequency-domain samples associated with the single shared-exponent value.

The control circuitry 990 may be configured to monitor information communicated by the interface circuitry 940 and communicate a fronthaul link quality indicator to the BBU, based, at least in part, on the monitored information, over the fronthaul link 950. In some embodiments, the interface circuitry 940 includes one or more buffers 944, 946 to temporarily store data communicated on the fronthaul link 950. The interface circuitry 940 may be configured to provide information regarding an amount of data stored in the one or more buffers 944, 946 to the control circuitry 990 to be used to determine the fronthaul link quality indicator. The information communicated by the interface circuitry 940 to the control circuitry 990 to be used to determine the fronthaul link quality indicator may include buffer overrun indications, buffer underrun indications, fronthaul link error information, a fronthaul link latency, packet identity information, or any combination thereof. The control circuitry may be configured to determine missing packet information or out-of-order packet information based on packet identity information communicated by the interface circuitry 940 and generate the fronthaul link quality indicator, based, at least in part, on the missing packet information or the out-of-order packet information. Alternatively, or in addition, the control circuitry 990 may be configured to monitor information communicated by the conversion circuitry 910 and communicate a fronthaul link quality indicator to the BBU, based, at least in part, on the monitored information, over the fronthaul link. The information communicated by the conversion circuitry 910 to the control circuitry 990 to be used to determine the fronthaul link quality indicator may include information about a received radio frequency signal.

In embodiments, the interface circuitry 940 includes fronthaul link receivers 942 to receive fronthaul downlink information over the fronthaul link 950 from the BBU and provide the fronthaul downlink information to the fronthaul interface 929. The transformation circuitry in such embodiments may include expansion circuitry 922 to generate frequency-domain samples, under control of the control circuitry 990, based on the fronthaul downlink information received through the fronthaul interface 929, and inverse Fourier Transform circuitry 924 to create time-domain baseband samples, under control of the control circuitry 990, from the frequency-domain samples generated by the expansion circuitry 922 and provide the frequency-domain samples to the baseband interface 921. The conversion circuitry may also include a digital-to-analog converter 917 and transmitter circuitry 915 to convert the time-domain baseband samples into a radio frequency signal to send to the wireless terminal. The frequency-domain samples may include complex frequency-domain samples, and the time-domain samples may include pairs of in-phase and quadrature data.

The fronthaul downlink information received may include a tonemap descriptor describing a set of tones to be used to generate the radio frequency signal for transmission to the wireless terminal, a set of modulation symbol descriptors, and frequency-domain data identifying a modulation symbol descriptor of the set of modulation symbol descriptors to be used for a tone of the set of tones for a particular time period. The control circuitry may be configured to receive the tonemap descriptor and the set of modulation symbol descriptors and configure the expansion circuitry 922 to expand the frequency-domain data into the frequency-domain samples based on the tonemap descriptor and the set of modulation symbol descriptors. In embodiments, the transformation circuitry 920 may include a bypass path 928 coupling the fronthaul interface 929 to the baseband interface 921 under control of the control circuitry 990 to allow the control circuitry 990 to route pairs of in-phase and quadrature time-domain data included in the fronthaul downlink information through the bypass path 928 of the transformation circuitry 920.

The fronthaul downlink information may include real-valued frequency-domain information, complex frequency-domain information and/or pairs of in-phase and quadrature time-domain data, and the pairs are associated with particular time periods. The transformation circuitry 920 may include format circuitry 938 to manage different data types. The fronthaul downlink information may include a first mantissa value, a second mantissa value, and a shared-exponent value, and the format circuitry 938 can be configured to generate a first sample value having the first mantissa value and the shared-exponent value, and a second sample value having the second mantissa value and the shared-exponent value. The fronthaul downlink information may include a first mantissa value, a second mantissa value, a third mantissa value, a fourth mantissa value, and a shared-exponent value, and the format circuitry 938 can be configured to generate a first complex frequency-domain sample with a first real part having the first mantissa value and the shared-exponent value, and a first imaginary part having the second mantissa value and the shared-exponent value, and a second complex frequency-domain sample with a second real part having the third mantissa value and the shared-exponent value, and a second imaginary part having the fourth mantissa value and the shared-exponent value.

In some embodiments, the fronthaul link 950 includes a non-deterministic communication link and the interface circuitry 940 may be configured to packetize fronthaul uplink information received from the fronthaul interface 929 of the transformation circuitry 920 into fronthaul uplink packets and send the fronthaul uplink packets over the fronthaul link 950 to the BBU. The interface circuitry 940 may also be configured to format the fronthaul uplink packets to be compliant with an internet protocol (IP) under control of the control circuitry 990.

In various embodiments, the interface circuitry 940 may include a buffer 946 to hold irregularly received downlink data from the fronthaul link 950 to enable a constant stream of information to be provided for a radio frequency signal sent to the wireless terminal, with a size of the buffer 946 adapted based on a fronthaul link quality indicator or information received from the BBU. Alternatively or in addition, the interface circuitry may include a buffer 944 to hold irregularly sent uplink data for the fronthaul link 950 to enable a constant stream of information to be received from a radio frequency signal sent by the wireless terminal, with a size of the buffer 944 adapted based on a fronthaul link quality indicator or information received from the BBU.

Figure 10:
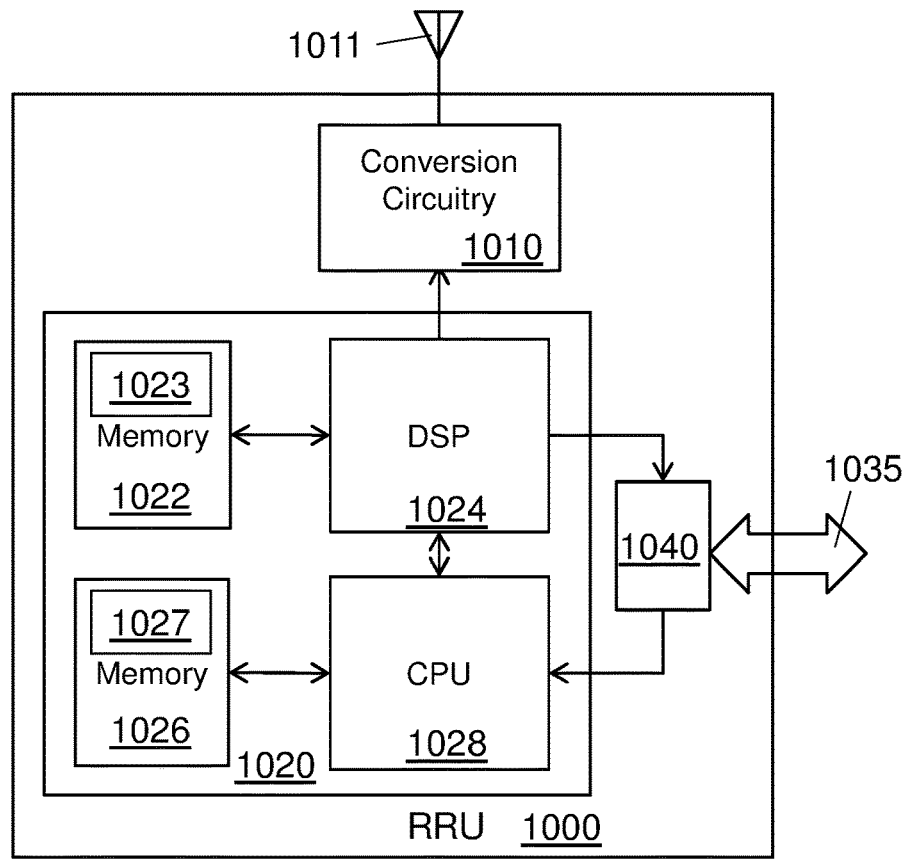
FIG. 10 is a block diagram of an alternative embodiment of a RRU.

FIG. 10 is a block diagram of an alternative embodiment of a RRU 1000. The RRU 1000 may provide an implementation of the RRU 900 of FIG. 9. The RRU 1000 includes a processing subsystem 1020 which includes at least one processor 1024, 1028 and at least one tangible computer memory 1022, 1026 coupled to the at least one processor 1024, 1028. The at least one tangible computer memory 1022, 1026 holds instructions 1023, 1027 executable by the at least one processor 1024, 1028, to perform action associated with the transformation circuitry 920, action associated with the interface circuitry 940, and action associated with the control circuitry 990. The processing subsystem 1020 includes at least a portion of the transformation circuitry 920, at least a portion of the interface circuitry 940, and at least a portion of the control circuitry 990. The RRU 1000 also includes conversion circuitry 1010 to communicate with a wireless terminal using antenna 1011.

In some embodiments, the processing subsystem 1020 may include a general purpose CPU 1028 and a digital signal processor (DSP) 1024 with various tasks split between the processors 1024, 1028 such as having the DSP 1024 perform the FFT and IFFT operations and having the CPU 1028 provide control functionality. In other embodiments, the processing subsystem 1020 may only include the DSP 1024 and may not include the CPU 1028. In such embodiments, the DSP 1024 may be able to provide control functionality or the control functionality may be provided by other circuitry. In other embodiments, the processing subsystem 1020 may only include the CPU 1028 and not include the DSP 1024. In such embodiments, the CPU 1028 may be able to perform signal processing functions such as one or more of a FFT, IFFT, selection, quantization, adaptive compression, expansion, formatting, and the like. Or dedicated circuitry may be provided for some of the signal processing functions so the CPU 1028 can provide the overall control functionality. Other embodiments may have any number of processors of any type, depending on the embodiment.

So in some embodiments the RRU 1000, adaptive compression circuitry includes a digital signal processor (DSP) 1024 and a tangible memory 1022 coupled to the DSP 1024 with the tangible memory 1022 holding instructions 1023, executable by the DSP 1024, to perform a Fourier transform to convert the digital baseband samples into frequency-domain information for a set of received tones, and a compression of the frequency-domain information by discarding information related to at least one tone of the set of received tones in the frequency-domain information to generate the fronthaul uplink information under control of the control circuitry. Control circuitry, which may include the DSP 1024, the CPU 1028, and/or other circuitry, is configured to identify the at least one tone based on the information received from the BBU and provide the at least one tone to the DSP. In some embodiments, the instructions 1023 are executable by the DSP 1024 to perform a Fourier transform to convert the digital baseband samples into frequency-domain information and generate the fronthaul uplink information based on the frequency-domain information at a quantization level that is dynamically controlled by the control circuitry. The control circuitry is configured to determine the quantization level based, at least in part, on the information received from the BBU, and dynamically provide the quantization level to the DSP.

Figure 11:
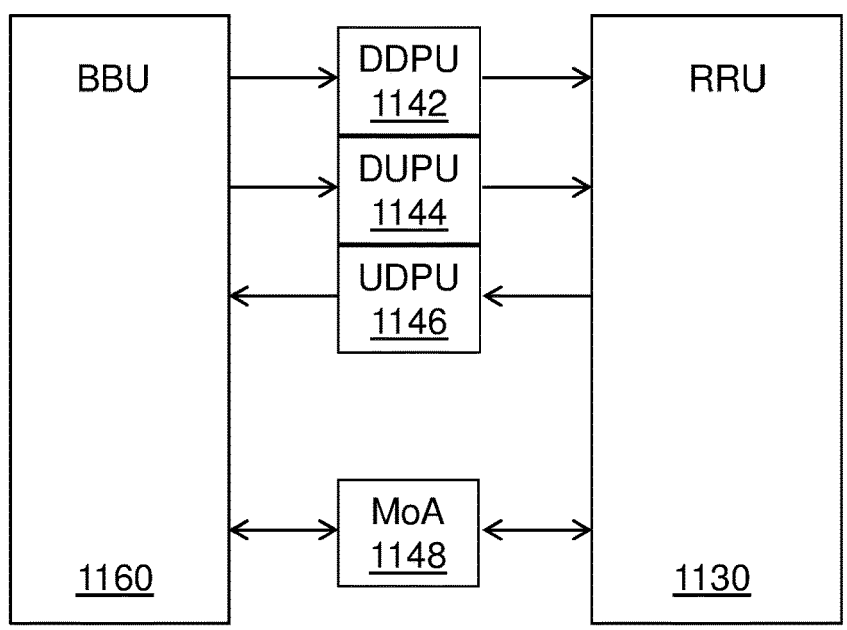
FIG. 11 is a diagram showing BBU/RRU interactions using an adaptive fronthaul protocol.

FIG. 11 is a diagram showing BBU/RRU interactions using an adaptive fronthaul protocol. The embodiments described herein rely on the exchange of messages over fronthaul links, which may be arbitrary internet protocol (IP) fronthaul links. This communication may be referred to as Fronthaul over IP (FIP) In the simplest form, FIP messages are exchanged between one baseband unit (BBU) and one remote radio unit (RRU), but in general more BBUs and/or more RRUs may be involved in the system. Each BBU may transmit messages and/or may receive messages using FIP, and so may each RRU.

The two most common transport layer protocols over IP, known as transmission control protocol (TCP) and user datagram protocol (UDP), are deficient for use in the systems described herein. In particular, some of TCP's features (e.g., nodes acknowledging proper reception sending an "ACK" message to the sender) make the protocol ideal for applications with no tolerance for data loss over the fronthaul, but unsuited for applications in which low latency is critical while occasional data loss is acceptable, such as those described herein. On the other hand, UDP would have been suitable for FIP in terms of latency, but UDP does not offer any form of recovery from/correction of common fronthaul errors such as data loss, out-of-order delivery, and duplication, so additional protocol layers would have to be added to utilize UDP.

FIP is used to target low-latency performance, with a latency as low as UDP (i.e., the minimum latency possible over IP) while providing more advanced features for detection/correction of fronthaul errors as well as other features of particular interest for a distributed RAN, such as sub millisecond-level synchronization between the clock rates of the nodes. It should be mentioned that other transport layer protocols for low-latency applications exist, but none were found to meet the requirements of low latency and accurate clock rate synchronization.

Among other things, FIP is responsible for transferring baseband samples between BBU and RRU. Compression techniques are used to reduce the fronthaul throughput requirements. FIP defines the communications between BBU and RRUs, including management and operation (MaO) of the RRUs, exchange of data and instructions between BBU and RRUs, and the like. FIP features are similar to those offered by CPRI, but with much lower bandwidth requirements.

FIP assumes an OFDMA or SC-FDMA based distributed RAN, where the concepts of "tones" and "symbols" (either OFDMA symbols or SC-FDMA symbols, referred to generally as OFDM symbols or simply "symbols") are clearly defined, although it also offers transfer of raw time-domain samples, e.g., for the support of non-OFDM-based physical channels or legacy radio access technologies (RATs). FIG. 11 shows a representation of the basic BBU 1160 interaction with RRU 1130. FIP provides a protocol for a variety of services to be provided to the distributed RAN system.

For fronthaul downlink data, FIP defined Downstream Data Protocol Units (DDPU) 1142 which are sent from the BBU 1160 to the RRU 1130. A DDPU 1142 includes instructions and data needed by the RRU 1130 to perform transmission of RF samples.

For fronthaul uplink data, FIP defines a mechanism for the BBU 1160 to send instructions to the RRU 1130 controlling the transmission of fronthaul uplink data, as well as a mechanism for the RRU 1130 to send data and instructions to the BBU 1160. Instructions for encoding and transfer of fronthaul uplink data are included in Downstream instructions for Uplink Protocol Units (DUPU) 1144 which are sent from the BBU 1160 to the RRU 1130. A DUPU 1144 includes the instructions needed by the RRU 1130 to perform sampling and encoding of uplink (UL) samples.

FIP defines Upstream Data Protocol Units (UDPU) 1146 which are sent from the RRU 1130 to the BBU 1160. A UDPU 1146 includes data corresponding to UL samples. There is a one-to-one correspondence between a DUPU 1144 record and a UDPU 1146 record because a DUPU 1144 record is sent from the BBU 1160 to the RRU 1130 defining each UDPU 1146 record to be sent from the RRU 1130 to the BBU 1160.

FIP also provides for initialization and maintenance of the connection between BBU 1160 and RRU 1130, including discovery, exchange of capabilities, and the like. Management of RRUs 1130 by the BBU 1160 is also provided for in FIP, including changing configuration parameters of RRU 1130 such as carrier frequency, bandwidth, AGC, DAC, and ADC parameters, number of active antennas, semi-static mapping of logical to physical antennas, and the like.

FIP uses the services from lower protocol layers. For management and operation, a TCP/IP socket may be opened between the BBU 1160 and each active RRU 1130, allowing FIP to rely upon TCP's reliable in-order delivery. For DDPU 1142, DUPU 1144, and UDPU 1146, FIP provides a synchronous transport protocol on top of IP.

In general, a RRU can have N logical antennas and M physical antennas, where N and M may be different. The number of physical antennas is generally a hardcoded parameter of the RRU, whereas the number of logical antennas is configured by the BBU via management commands defined in FIP, along with the linear mapping between logical antennas and physical antennas. Physical antennas may also be turned off via suitable FIP based commands. The application layer protocol units refer to logical antennas.

For downlink (DL) transmissions, only the non-empty resource elements (RE) are associated to samples being transmitted from the BBU to the RRU. Hence, if a significant number of REs are empty, meaning that the cell is only partially loaded, significant data compression can be achieved. The compression scheme can utilize information about which REs are being used and which ones are empty. A RE represents a tone used for one symbol time period.

For uplink (UL) transmissions, only the frequency-domain samples associated to non-empty UL REs need to be transferred from RRU to BBU. Because the RRU does not know which REs are used and which ones are not, the BBU needs to explicitly inform the RRU about which REs are non-empty.

In an embodiment, the BBU generates FD samples for at least one slot or subframe, and based on the physical channels multiplexed on the slot or subframe, a map of used REs is generated for each OFDM symbol composing the slot or subframe. Some PHY channels may be assigned to the same REs over a set of consecutive (possibly all) OFDM symbols in a given slot or subframe (e.g., PDSCH), while other PHY channels may be assigned to different REs in different OFDM symbols (e.g., CRS). Some PHY channels may have consecutive RE allocation in the frequency domain (e.g., PSS and SSS), other PHY channels may have regularly distributed allocation with fixed rate of insertion in the frequency domain (e.g., CRS), and yet other PHY channels may have irregularly distributed allocation (e.g., PDCCH or PDSCH with bitmap-based resource allocation).

Control information is sent before, or multiplexed with, DL FD samples sent over the fronthaul link for a slot or subframe. The control information describes the "map" of non-empty REs may be transmitted by the BBU to the RRU. The map may be specific for each physical TX antenna or may be common across all antennas. The number of FD samples corresponding to the slot or subframe corresponds to the number of non-empty REs in the map being signaled to the RRU. The RRU may receive and interpret the map corresponding to the slot or subframe, receive the stream of FD samples corresponding to the slot or subframe, and assign each FD sample sequentially to the non-empty REs extracted from the map. The FD samples may be in the order of PHY TX antenna index first, frequency-domain (i.e., tone index) related samples second, and time-domain (i.e., OFDM symbol index) related samples third.

Suitable representation of the allocation map may be adopted to reduce the overhead associated to transmitting the map over the fronthaul. The map may be described a single set of tones, or by the union or intersection of two sets of tones, described separately. Each of the sets of tones may represent a block of consecutive non-empty tones which also occupy multiple consecutive OFDM symbol in the slot or subframe (e.g., a PDSCH allocation or a portion thereof)—described by first tone index, number of consecutive tones, first OFDM symbol index, and number of consecutive OFDM symbols, or equally spaced (in the frequency domain) tones, occupying only one specific OFDM symbol (e.g., CRS)—described by the first tone index, spacing between consecutive tones, number of tones, and OFDM symbol index. The map may be described by a set of descriptors belonging to either one of the categories above. The RRU may decode the descriptors described above and may reconstruct a map of non-empty REs accordingly.

At least one OFDM symbol of the slot or subframe may be characterized by a highly irregular allocation of non-empty REs. For example, the presence of multiple PDCCHs with pseudo-random control channel element (CCE) offsets being multiplexed in the control region may entail an irregular RE allocation over the OFDM symbols devoted to control. For such OFDM symbols, a complete bitmap may be a more efficient representation. Hence, an additional descriptor may include OFDM symbol index and the corresponding bitmap (one bit per tone or group of tones) of non-empty REs.

In UL, an allocation map similar to the one described for DL, for at least one slot or subframe, may be constructed by the BBU based on UL scheduling decisions (e.g., tones used by PUSCH allocations), presence of periodic feedbacks from UEs (e.g., tones used by PUCCH or SRS allocations), presence of PRACH opportunities, and the like. The BBU may provide the map over the fronthaul to the RRU for each slot or subframe in advance. The RRU receives the map before the UL FD samples can be delivered to the BBU. Once the RRU receives the map, it may extract the samples out of the frequency-domain information generated by the Fourier transform corresponding to the non-empty REs of the slot or subframe and deliver only those samples to the BBU. Since the RRU needs to wait for the map to be received over the fronthaul, the UL latency may increase because of double counting of fronthaul latency. The UL map may be described in the same way as the DL map, that is, as a set of at least one descriptor. Descriptors may describe either consecutive tones, regularly spaces tones, bitmaps, or the like.

In either UL or DL or both, the compressed representation of FD samples may be disabled adaptively, based, e.g., on system load (that is, average percentage of non-empty REs), requirements on UL latency, and the like. When disabled, FD samples corresponding to all REs can be exchanged over the fronthaul. Disabling may be decided by the BBU on a per-RRU basis and the RRUs may be informed via suitable control plane signaling or via a suitable header multiplexed with the FD samples.

Both DDPU and DUPU, as described above and shown in FIG. 11, utilize the fronthaul over IP (FIP) protocol to describe active tones that convey non-zero samples. In order to obtain a suitably compressed representation of the tones, multiple efficient representations have been developed. A FIP tonemap descriptor is a pair as follows:

basicTonemapDescriptor={type, parameters} where type denotes the tonemap type among those listed below, and parameters is a set of parameters whose interpretation depend on the tonemap type.

The following tonemap types are defined:
CONTIGUOUS. A block of contiguous tones, in both the time-domain and the frequency-domain. Four parameters are needed: firstTone, numTones, firstSymbol, and numSymbols. If any of the contiguous tones defined in such way lie outside the range of valid tones or symbols, only the valid tones and symbols are selected.
PERIODIC. Tones defined in this way are those that satisfy the following formula: k mod P[symbol]=offset [symbol], where k is the tone index, P[symbol] denotes the periodicity, in number of tones, for a given OFDM symbol, and offset[symbol] denotes the corresponding offset for the same symbol. Note that a tonemap spanning multiple symbols can be defined by defining multiple triples <symbol, P, offset> as parameters.
LIST. For a given symbol, define a list (i.e., vector) of active tones $\{k_i\}_i$. The parameters are therefore defined as a set of triples <symbol, $\{k_i\}_i$>.
BLOCK. For a given symbol, define B[symbol] as the block size. Multiple blocks of consecutive tones can be defined through a list of the first tone for each block, such that the valid tones are $k_0$, $k_0+1$, . . . , $k_0+B-1$, $k_1$, . . . , $k_1+B-1$, . . . , $k_{N-1}+1$, . . . , $k_{N-1}+B-1$. The parameters are therefore defined as a set of triples <symbol, B, $\{k_i\}_i$>.

A set of tones can be described as a combination of one or more of the basic tonemap descriptors discussed above, along with suitable set operations such as union, intersection, and the like, applied to the sets. In particular, a tree-based representation is used to describe the sets and the operations over them.

```
tonemapDescriptor = {
    basic TonemapDescriptor OR
    {unaryOperator, tonemapDescriptor } OR
    {binaryOperator, tonemapDescriptor, tonemapDescriptor }
}
``` where unaryOperator can be the following:
INV. The active set of tones is the "inverse" of the one specified, i.e., the universe minus the specified set and binaryOperator can be one of the following:
UNION
INTERSECTION
MINUS The tones occupied by a given physical channel can be described by one tonemapDescriptor, e.g., CRS tones may be easily described with a descriptor of PERIODIC type, PDCCH with a descriptor of BLOCK type MINUS another descriptor of PERIODIC type (to exclude CRS tones), and PDSCH with a UNION of descriptors of CONTIGUOUS type MINUS another descriptor of PERIODIC type (to exclude CRS tones).

A complex entity such as an LTE slot or subframe may be described by multiple tonemap descriptors. All the protocol units whose role is to describe the tonemap are actually defined as a list of tonemap descriptors, where the order matters, in that lower-order descriptors have higher priority. That is, if a tone is concurrently described as active by two independent tonemap descriptors, it's the first one in the list that can claim ownership of the tone, where the other descriptors (if any) will have to skip the tones that were already described by a previous descriptor.

Some transmitted or received signals may be better represented by a time-domain signal (that is, post-IFFT and CP appending in downlink or pre-FFT and CP removal in uplink) rather than a frequency-domain signal. Examples of LTE physical signals which may be better represented in time-domain are PRACH (UL), PSS and SSS (DL), and the like. In addition, legacy radio technologies may require time-domain representation.

In order to represent as signal in time-domain, a descriptor different from tonemapDescriptor is used. A FIP time-domain descriptor defines:

Sampling rate. Expressed as an integer resampling of the fundamental sampling rate of the RRU (obtained/configured via MoA).

Filtering. The time-domain signal can be low-pass filtered after resampling (in DL) or before resampling (in UL). A suitable low-pass digital filter representation may be provided to the RRU in the descriptor. If a filter is not provided the RRU may use a default low-pass filtering of its choice.

Duration. How many samples (in the resampled domain) to transmit or receive.

All other descriptors such as the equalization type, layer mapping, compression, quantization, and the like described in the following can be the same regardless of whether a time-domain or frequency-domain representation is used.

Besides the tonemap, a description of the way the associated complex samples need to be quantized, interpreted, and compressed, has to be provided, both for downlink (along with the actual samples) and uplink (where the samples will be provided later by the RRU, following the format described herein). A FIP samples format descriptor is defined in such a way that quantization rules, antenna mapping, and the like are clearly and unambiguously defined.

The following information can be provided in the FIP downlink sample format descriptor:

Mapping of layers over antennas, which can be one of the following

LINEAR. Linear mapping. L layers (where L can be 1) are linearly mapped over Q antennas, where $1 \leq Q \leq N$, N being the number of logical antennas. The descriptor specifies L, the subset (of size Q) of logical antennas, and the linear precoding complex matrix of size L×Q.

SFBC. 2 antenna Alamouti. Two consecutive complex samples in the stream are mapped over 2 tones (defined in the tonemap) and two logical antennas. The two antennas are selected out of the set of N logical antennas, and the subset definition is also a member of the descriptor.

FSTD. Four-antenna space-frequency code. Same as the previous one, but for four TX antennas.

LCDD

Compression

CONSTANT. The same complex value is mapped over all samples belonging to a given layer. Only one value is provided for each layer.

MODULATION. The stream of complex samples is assumed to be obtained from a mapping operation over one of the pre-defined constellations (which can be set via a MoA configuration). M bits for each sample for each layer are provided, where M is the constellation order, i.e., the number of bits needed to describe a constellation point. The constellation to be used is specified for each layer, thus can be different across different layers.

COMPLEX. A complex number is defined for each sample of each layer.

Quantization

The following information can be provided in the FIP uplink sample format descriptor:

Antenna selection. Q antennas (where $1 \leq Q \leq N$, N being the number of logical antennas) are selected out of the N. The descriptor specifies the subset. Samples are independently reported for all Q antennas, with no specific operation carried out on the samples.

Figure 12:
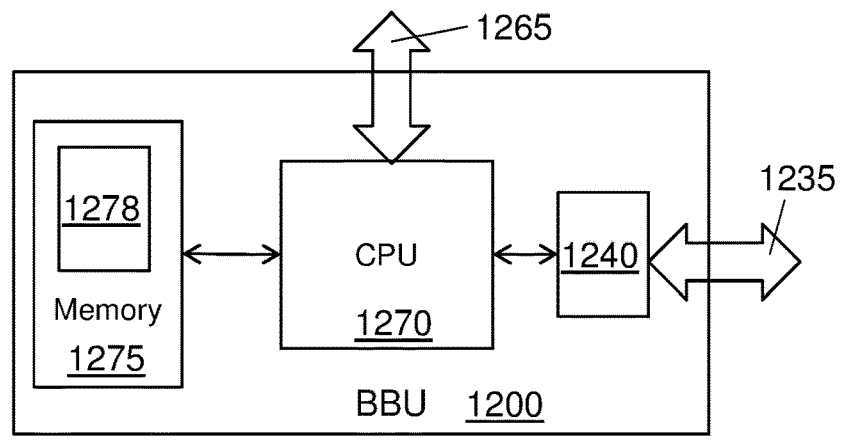
FIG. 12 is a block diagram of an embodiment of a BBU.

FIG. 12 is a block diagram of an embodiment of a baseband unit (BBU) 1200 for use with a remote radio unit (RRU) in a distributed radio access network (RAN) and coupled to a core network. The BBU 1200 includes a processor 1270, one or more memory devices 1275 coupled to the processor 1270, and storing instructions 1278 to configure the processor 1270, and interface circuitry 1240 coupled to the processor 1270 and a fronthaul link 1235. The BBU 1200 also includes an interface 1265 to the core network. The processor 1270 is configured to perform at least a second-level protocol of the RAN and communicate over the fronthaul link 1235 with the RRU using an adaptive fronthaul protocol. In some embodiments, the processor 1270 is also configured to perform a portion of a first-level protocol of the RAN. In some embodiments, the BBU 1200 supports a RAN protocol utilizing an Evolved Universal Terrestrial Radio Access Network (E-UTRAN), the core network includes an Evolved Packet Core (EPC), the first-level protocol uses an Evolved Universal Terrestrial Radio Access (E-UTRA) physical-layer (PHY) protocol, and the second-level protocol uses an E-UTRA medium access control (MAC) protocol.

The processor 1270 may perform a variety of function to manage and control the RRU. In some embodiments, the processor 1270 is configured to send setup information to the RRU that identifies a set of receivable tones. The processor 1270 may also be configured to send tone information to the RRU over the fronthaul link 1235 that identifies at least one tone, included in the set of receivable tones, which is useable to identify frequency-domain information to discard during creation of the fronthaul uplink information. In some embodiments, the tone information includes a tonemap descriptor that describes a set of reportable tones out of the set of receivable tones, and the at least one tone is excluded from a set of reportable tones. The processor 1270 may also send tone information to the RRU over the fronthaul link 1235 that identifies a set of reportable tones to use in creation of the fronthaul uplink information and the tone information may include a first tonemap descriptor that describes a set of reportable tones associated with a first time period and a second tonemap descriptor that describes a set of reportable tones associated with a second time period.

In some embodiments, the processor 1270 is configured to generate a first tonemap descriptor according to the adaptive fronthaul protocol. The tonemap descriptor includes a base type with parameters, a unary operator and a second tonemap descriptor, or a binary operator with a third tonemap descriptor and a fourth tonemap descriptor. The tone information includes the tonemap descriptor. The unary operator may be an inverse operator, the binary operator is selected from a group consisting of a union operator, an intersection operator, and a difference operator, and the base type with parameters is selected from a group consisting of a contiguous type with parameters that include a first tone and a number of tones, a periodic type with parameters that include a tone index and a periodicity, a list type with parameters that include a list of tones, and a block type with parameters that include a block size. These tonemap descriptors may be used for either uplink or downlink data.

Uplink data received from the RRU on the fronthaul link 1235 may be compressed to conserve bandwidth. In some embodiments, the processor 1270 is configured to adaptively decompress fronthaul uplink information received from the RRU over the fronthaul link 1235 using the adaptive fronthaul protocol to create decompressed fronthaul uplink data, and process the decompressed fronthaul uplink data to provide appropriate information to the second level protocol. One way that the processor 1270 may adaptively decompress the fronthaul link data is to determine a quantization level of the fronthaul uplink information and expand the fronthaul uplink information to a native quantization level to adaptively decompress the fronthaul uplink information. A native quantization level is a quantization level consistent with data types generally handled by the processor 1270, such as a 32-bit integer, or a 64-bit floating-point number, to name two non-limiting examples. The processor 1270 may to send quantization information to the RRU over the fronthaul link 1235 based on a radio signal-to-noise ratio, a physical layer modulation scheme, a physical layer code rate, an available bandwidth of the fronthaul link, or any combination thereof. In some embodiments, the quantization information includes a quantization parameter to set a quantization level used by the RRU.

In other cases, the processor 1270 may receive complex frequency-domain information in a shared-exponent floating-point format for at least some time periods in the fronthaul downlink information where the fronthaul uplink information includes a first mantissa value, a second mantissa value, a third mantissa value, a fourth mantissa value, and a shared-exponent value. The processor 1270 may then reconstitute a first complex frequency-domain sample with a first real part having the first mantissa value and the shared-exponent value, and a first imaginary part having the second mantissa value and the shared-exponent value, and reconstitute a second complex frequency-domain sample with a second real part having the third mantissa value and the shared-exponent value, and a second imaginary part having the fourth mantissa value and the shared-exponent value. The processor 1270 may also reconstitute additional complex frequency-domain samples using additional mantissa values from the fronthaul uplink information with the shared-exponent value.

To support efficient use of the fronthaul link 1235 for downlink data, the processor 1270 may adaptively compress data to create fronthaul downlink information to send to the RRU over the fronthaul link 1235 and send the fronthaul downlink information to the RRU over the fronthaul link 1235 using the adaptive fronthaul protocol. The processor 1270 may be configured to compress the data that includes a first complex frequency-domain sample and a second complex frequency-domain sample into a shared-exponent format that comprises two mantissa values for the first complex frequency-domain sample, two mantissa values for the second complex frequency-domain sample, and a single shared-exponent value for both the first complex frequency-domain sample and the second complex frequency-domain sample. The fronthaul downlink information includes the frequency-domain information in the shared-exponent format. The fronthaul downlink information may also include additional mantissa values for additional complex frequency-domain samples associated with the single shared-exponent value.

The processor 1270, in some embodiments, is configured to send frequency-domain information over the fronthaul link 1235 to the RRU using the adaptive fronthaul protocol that includes a tonemap descriptor describing a set of tones to be used by the RRU to generate a radio frequency signal for transmission to the wireless terminal, and data identifying modulation symbols for tones of the set of tones, and times associated with the modulation symbols.

In addition to sending and receiving data on the fronthaul link 1235, the processor 1270 performs a second-level protocol of the RAN. As a part of performing the protocol in a system with fronthaul link latency, the processor 1270 may determine a latency for the fronthaul link and bypass at least one function of the second-level protocol based on the determined latency and a response time requirement of the RAN protocol. The determined latency can be based on a measured latency, historical latency data, or predetermined values. One way that the processor 1270 may bypass a function of the second-layer protocol is to determine a first time that a message is expected to be sent from the wireless terminal, calculate a second time for a response message to be sent to the wireless terminal based on the first time and a response time requirement of the RAN protocol, and send a command, at a third time, to the RRU to schedule the response message to be sent at the second time over the fronthaul link to bypass the at least one function of the second level protocol, the third time determined based on the second time and the determined latency for the fronthaul link. The third time is before a time that the message is received and processed by the BBU. The processor 1270 may defer to a higher level protocol of the RAN for error recovery if the response message was incorrectly sent based on the message received from the wireless terminal. In at least one embodiment, the RAN protocol utilizes an Evolved Universal Terrestrial Radio Access Network (E-UTRAN), the message includes a PUSCH transmission, and the response message includes a HARQ ACK response.

Another way that the processor 1270 may bypass a function of the second-layer protocol is to send a message to the RRU, the message scheduled to be sent to the wireless terminal at a first time, calculate a second time for the message to be resent to the wireless terminal if a response message from the wireless terminal indicates that the message was not received correctly, the second time based on the first time and the response time requirement of the RAN protocol, and determine, at a third time, whether or not to resend the message to the RRU with the message scheduled to be sent to the wireless terminal at the second time to bypass the at least one function of the second level protocol, the third time determined based on the second time and the determined latency for the fronthaul link. The third time is before a time that the response message is received and processed by the BBU. The processor 1270 may be configured to determine whether or not to resend the message is based on a predetermined decision or one or more previously received response messages. In at least one embodiment, the RAN protocol utilizes an Evolved Universal Terrestrial Radio Access Network (E-UTRAN), the message includes a PDSCH transmission, and the response message includes a HARQ response.

Another way that the processor 1270 may bypass a function of the second-layer protocol is to configure the wireless terminal to periodically resend a message if a response message is not received within the response time requirement, receive a first instance of the message, and send multiple versions of a response for the message to the wireless terminal. The wireless terminal accepts at least one response to the multiple versions of the response as a valid response to a second instance of the message, the second instance of the message having been sent after the first instance of the message. In at least one embodiment, the RAN protocol utilizes an Evolved Universal Terrestrial Radio Access Network (E-UTRAN), the message includes a Random Access Preamble, the wireless terminal is configured to periodically resend the Random Access Preamble by setting a preambleTransMax parameter of a MAC protocol of the E-UTRAN, and the multiple versions of the response message includes Random Access Responses with differing t_id and f_id parameters of the MAC protocol. The processor 1270 is further configured to calculate the differing t_id and f_id parameters for multiple instances of the Random Access Preamble based on PRACH parameters.

The BBU 1200 may also manage aspects of the RAN based on a fronthaul link quality indicator. The processor 1270, in some embodiments, determines an indicator of fronthaul link quality, and dynamically changes one or more parameters of the RAN based on the indicator. The indicator of fronthaul link quality may be determined based, at least in part, on information received from the RRU over the fronthaul link 1235 and the information received from the RRU may include RRU buffer status information, RRU buffer overrun indications, RRU buffer underrun indications, information about a received radio frequency signal, or any combination thereof. In some embodiments, the indicator of fronthaul link quality is determined based, at least in part, on a latency of the fronthaul link, 1235 a bandwidth of the fronthaul link, errors on the fronthaul link 1235, undelivered packets on the fronthaul link 1235, out-of-order packets on the fronthaul link 1235, BBU buffer overruns, BBU buffer underruns, or any combination thereof. The one or more parameters of the RAN that may be controlled by the BBU 1200 include frequency-domain allocation size, modulation and coding schemes, number of users, number of grants, pattern of usable subframe, anticipation of the scheduling with respect to the time index it refers to, or any combination thereof. In at least one embodiment, the indicator of fronthaul link quality includes a latency of the fronthaul link, and the one or more parameters of the RAN includes a ra-ResponseWindowSize parameter in a MAC protocol of an E-UTRA network.

Figure 13:
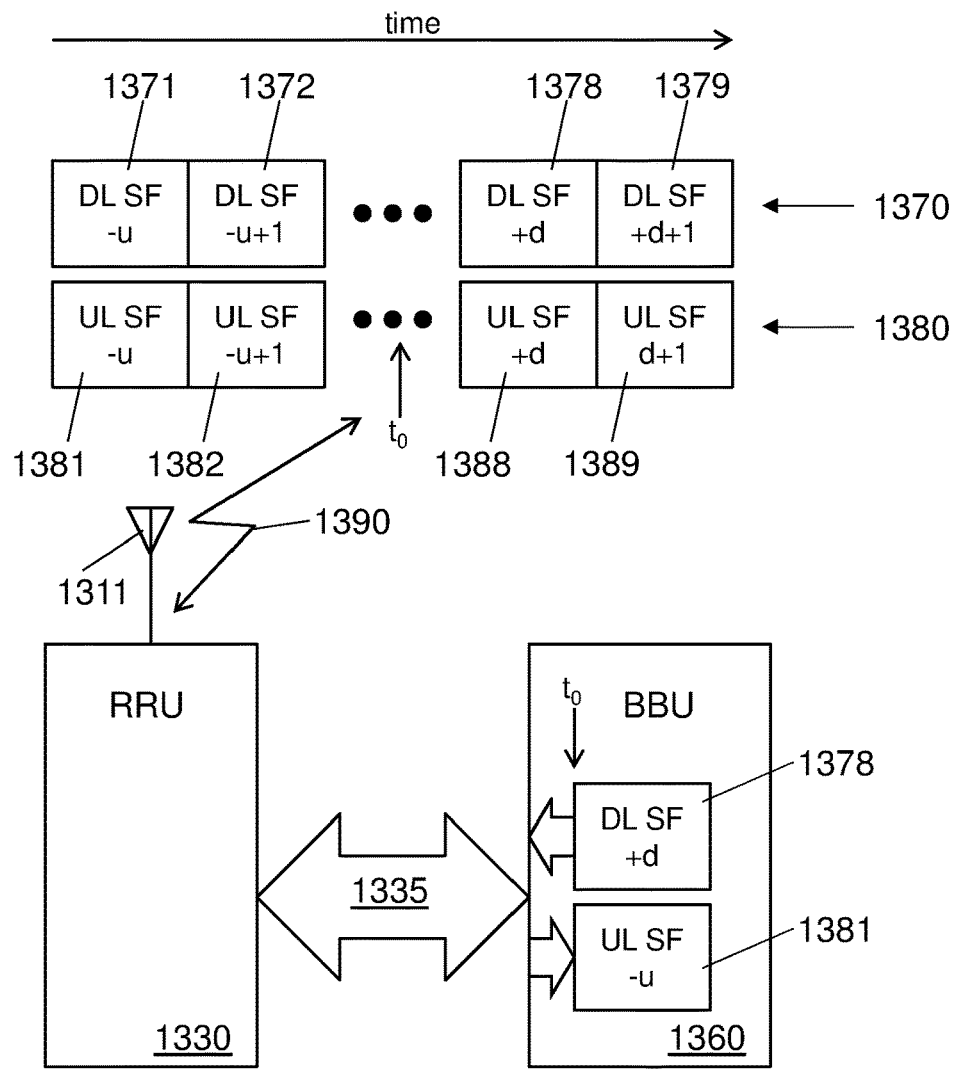
FIG. 13 is a diagram showing time relationships of subframes of the RAN at the BBU and in the RF signal in an embodiment of a distributed RAN.

FIG. 13 is a diagram showing time relationships of subframes of the RAN at the BBU 1360 and in the RF signal in an embodiment of a distributed RAN. Because of the use of a non-deterministic fronthaul link between the BBU 1360 and the RRU 1330, the latency of the fronthaul may be long enough that it is no longer possible to meet the strict timeline constraints required by certain functions, for example HARQ in LTE. Latency may increase if the fronthaul link uses a shared medium, or is subject to temporary outages which may delay exchange of samples, or is subject to processing by one or more intermediate units (e.g., routers) with unpredictable processing times, and the like. Buffering of samples also introduces additional latency, proportional to the buffer size.

Because of non-negligible latency, the BBU 1360 may experience a delay between transmitted samples relative to a specific time reference of the wireless medium (e.g., a subframe in LTE terminology) and the received samples for the same time reference. For example, when the BBU 1360 is transmitting samples corresponding to a DL subframe over the fronthaul 1335 to a RRU 1330, it may be receiving samples from the same RRU corresponding to a "past" UL subframe, where the amount of time differential between the two subframes depends on overall end-to-end latency between the two units. In a traditional implementation with fiber-grade dedicated fronthaul, or where the two units are co-located, the overall end-to-end delay may be a fraction of the unit, that is the overall end-to-end latency may be a fraction of a millisecond.

As an illustration, the BBU 1360 is coupled to the RRU 1330 by the fronthaul link 1335 which can have a significant amount of latency in a distributed RAN and due to the use of a non-deterministic fronthaul link 1335. To illustrate this latency, a set of downlink (DL) subframes 1370 and a set of uplink (UL) subframes 1380 are shown in increasing time order as they would be transmitted through the RF signal 1390. So a first DL subframe 1371 is transmitted from the RRU 1330 to a UE at the same time as the first UL subframe 1381 is transmitted from the UE to the RRU 1330, a second DL subframe 1372 is transmitted from the RRU 1330 to a UE at the same time as the second UL subframe 1382 is transmitted from the UE to the RRU 1330, a third DL subframe 1373 is transmitted from the RRU 1330 to a UE at the same time as the third UL subframe 1383 is transmitted from the UE to the RRU 1330, and a fourth DL subframe 1374 is transmitted from the RRU 1330 to a UE at the same time as the fourth UL subframe 1384 is transmitted from the UE to the RRU 1330.

An uplink latency 'u' is the time that it takes for data of an uplink subframe to transit from a UE, propagate through the RF signal 1390 to the antenna 1311, pass through the processing of the RRU 1330, and travel across the fronthaul uplink 1335 to the BBU 1360. A downlink latency 'd' is the time that it takes for a downlink subframe to travel from the BBU 1360, transit across the fronthaul link 1335 to the RRU 1330, be processed by the RRU 1330 and broadcast from the antenna 1311 to propagate as an RF signal 1390 to the UE. The latencies 'u' and 'd' can be variable over time. To illustrate the latency, a DL subframe 1378 is shown being sent by the BBU 1360 at particular time $t_0$. At that same time, an UL subframe 1381 is shown being received by the BBU 1360. The two subframes might not be able to both be sent on the fronthaul link 1335 at exactly the same time due to the physical constraints of the fronthaul link 1335, but conceptually, they can be seen as being simultaneously sent and received, respectively, by the BBU 1360. The time $t_0$ is also shown in the timeline of the subframes 1370, 1380 on the RF signal. Because of the latencies, the DL subframe 1378 being sent by the BBU 1360 at time $t_0$ will pass through the RF signal at a time that is 'd' in the future. The UL subframe 1381 being received by the BBU 1360 at time $t_0$ passed through the RF signal at a time that is 'u' in the past.

If the latency is large, some functions with strict latency constraints may not be directly implementable, so an implementation needs to be found to meet the strict requirements of the specification while maintaining a functional connection between the BBU 1330 and the UE. In some cases a function of the RAN may be bypassed, or somehow modified based on estimated, measured, or predicted latency. If latency is non-deterministic, the estimated, measured, or predicted latency value may be an average latency, maximum latency, 90%-latency, or the like.

Measuring latency of the employed fronthaul may imply periodically measuring latency over the fronthaul between the BBU 1360 and each RRU 1330 separately, and average the measurements over time. The measuring may also include feeding back, from the RRU 1330 to the BBU 1360, the number of pending samples in the UL and DL buffers, and accounting for these numbers when estimating the latency.

Predicting latency of the employed fronthaul may imply computing an expected latency (e.g., worst-case maximum latency) based on size of buffers of samples, type and quality of backhaul medium, number of concurrent connections between BBUs 1360 and RRUs 1330 that share the same medium, and the like.

In the following, a number of features of LTE (or E-UTRA) radio access networks with timeline constraints, or where a large or non-deterministic latency between the BBU 1360 and the RRU 1330 may significantly affect the performance if the system does not take into account such issue. For each feature we describe how to cope with the non-deterministic and potentially large latency, as well as the potential drawbacks of each possible implementation. Those skilled in the art will realize that some of the designs proposed below may similarly apply to radio access technologies other than LTE.

In LTE, both DL and UL HARQ has to fulfill a strict timeline. In particular, in FDD, a UE responds with an acknowledge (ACK) or non-acknowledge (NACK) 4 ms after the corresponding PDSCH transmission in DL. Similarly, an eNB responds with an ACK/NACK 4 ms after the corresponding PUSCH transmission in UL. In TDD, the ACK/NACK timeline requirements depend on the TDD configuration. In the following we focus on FDD systems, although extension to TDD is straightforward.

These timeline constraints effectively mandate the processing unit performing demodulation and decoding (that is, the UE for DL signals and the eNB for UL signals) to be able to complete demodulation and decoding of a given payload (PDSCH or PUSCH, respectively), determine the corresponding HARQ response (ACK or NACK) and assemble the HARQ response into a feedback packet ready to be transmitted, all of the above in up to 4 ms since the start of the data transmission such feedback refers to. In scenarios where BBU, RRU, and antennas are co-located, the only limiting factor is processing power, whereas in the distributed scenarios described above, fronthaul latency also factors in overall latency, along with latency due to buffering, if present.

If the end-to-end latency is such that HARQ processing timeline cannot be met, e.g., if fronthaul latency is significant causing 'u' plus 'd' latency to exceed 4 ms, HARQ processing can be effectively bypassed as discussed below.

In UL, HARQ bypassing boils down to feeding back an ACK, at the correct time imposed by the HARQ timeline, even though the PUSCH that the HARQ feedback refers to has not been decoded yet. That is, if eNB schedules an UL PUSCH transmission for at least one UE at a subframe m, if at time m+4 ms decoding of such PUSCH transmission has not been completed yet, an ACK dedicated to the UE can be transmitted with an assumption that the PUSCH transmission will eventually be successfully received.

In DL, HARQ bypassing is based on an assumption that the UE fed back an ACK corresponding to a PDSCH transmitted at time m to the UE, in case the HARQ feedback from the UE at time m+4 has not been received yet when it is time for the eNB scheduler to decide whether a retransmission is needed, or whether the original PDSCH transmission was received successfully. In DL, if HARQ feedback is not received on time and thus ACK is assumed by the eNB, eNB may refrain from decoding the HARQ feedback when the corresponding BB samples are finally available at the eNB.

It is noted that such bypassing of HARQ functions may be detrimental for the system performance, and suitable scheduling strategies, e.g., suitable reduction of modulation and coding scheme (MCS), may be adopted to limit the performance degradation. Furthermore, the potentially increased packet error rate (PER) due to the lack of effective HARQ functions may be compensated by upper layer error correction and recovery, e.g., performed at the RLC.

Because of increased latency, information fed back by UE may be received by the eNB BBU with a delay that makes it almost useless. When deciding whether to rely on information fed back by the UE such as channel quality information (CQI) and other channel state information (CSI) such as the precoding matrix information (PMI) for the sake of scheduling, the overall measured or estimated end-to-end latency may be accounted for.

If end-to-end latency is large enough to make the CSI almost decorrelated to the actual channel information for at least one UE, CSI feedback for that UE may be disabled by the eNB for the UE, or may be ignored. In this case, DL scheduling may use information other than CSI for making scheduling decisions, e.g., the reference signal received power (RSRP), reference signal received quality (RSRQ), and the like.

When deciding scheduling properties for a given PUSCH or PDSCH transmission to/from a given UE, end-to-end latency may be taken into account. In particular, if latency is such that HARQ has been bypassed as described above, a more conservative scheduling may be adapted, e.g., by reducing the employed code rate, modulation order, and the like.

In UL, scheduling requests (SRs) may be used by a UE to inform the eNB that the UE has pending UL data to be transmitted. eNB may respond to an SR received from the UE by providing the UE with a suitable UL allocation. If the overall end-to-end latency is large, SR may be received and decoded by the eNB BBU with a delay so large that the UE UL buffer may fill up and radio link failure (RLF) may be declared, thus making communication impossible. To avoid such scenario, in the presence of a large measured or estimated end-to-end latency, UL scheduler may schedule all RRC-connected UEs in a round-robin fashion by periodically providing each UE with a suitable UL resource allocation, regardless of whether an SR was received from the UE.

The PRACH timeline, described in the 3GPP specification "3GPP TS 36.300 version 12.4.0 Release 12, 2015-02, and "LTE; Evolved Universal Terrestrial Radio Access (E-UTRA); Medium Access Control (MAC) protocol specification," 3GPP TS 36.321 version 12.4.0 Release 12, 2015-02, defines a strict timeline that needs to be met in order for a random access procedure to be successful.

In particular, after transmission of a random access preamble from a UE, the UE expects a response (denoted as random access response (RAR)) from the cell within a specified window of time. The window is defined by the upper-layer signaled parameter ra-ResponseWindowSize. If the end-to-end latency allows the cell to detect a preamble transmission and transmit the corresponding RAR within the window, no changes are needed to the random access procedure compared to a scenario with reduced end-to-end latency. Parameter ra-ResponseWindowSize may have to be set to be as large as possible, e.g., equal to 10 subframes, so as to budget for the increased end-to-end latency.

If the end-to-end latency is so large that the RAR won't be received by the UE within the window, the BBU may take the actions described below:

Random access procedure may be configured so as to have multiple preamble transmissions if the RAR is not received by the UE (by tuning RRC parameter preambleTransMax);

A reduced number of PRACH opportunities or number of preambles selectable by the UEs may be configured to reduce overhead (see following);

When the BBU detects a preamble transmission, the preamble transmission may have occurred several ms earlier due to large end-to-end latency, and it may be already too late to send a corresponding RAR which can be successfully decoded by the UE as associated to the original preamble transmissions;

BBU may assume that UE keeps transmitting preambles if multiple sequential preamble transmissions are configured via the preambleTransMax parameter and the latency is not so large that all allowed preamble transmissions have been already carried out once the BBU detects the first successful one;

Hence, BBU may prepare a RAR (including UL grant, timing advance based on timing estimated from the successfully decoded preamble transmission, and the like) and transmit the RAR. However, the RAR may not have to correspond to the decoded preamble transmission, because due to latency the RAR response window may have already expired. Hence, the RAR may correspond to a later preamble transmission;

Hence, BBU may send the RAR multiple times, assuming different t_id and f_id compatible with PRACH parameters (see 3GPP 36.321, Section 5.1.4) and assuming different preamble identities compatible with PRACH parameters. The multiple RAR transmissions may occur in different subframes or, at least in part, in the same subframe. The multiple RAR transmissions may include non-overlapping UL grants.

If at least one of the multiple transmitted RARs correspond to the at least one subsequent preamble transmissions from the UE and is received within the response window corresponding to the preamble transmission, the random access procedure may proceed correctly to the next steps.

So in some systems, the BBU is configured to determine a latency for the fronthaul link, and bypass at least one function of the second-level protocol based on the determined latency and a response time requirement of the RAN protocol. The determined latency may be based on a measured latency, historical latency data, or predetermined values. The bypassing may include determining a first time that a message is expected to be sent from the wireless terminal, calculating a second time for a response message to be sent to the wireless terminal based on the first time and a response time requirement of the RAN protocol, and sending a command, at a third time, to the RRU to schedule the response message to be sent at the second time over the fronthaul link, the third time determined based on the second time and the determined latency for the fronthaul link. The third time is before a time that the message is received and processed by the BBU. In some systems, the BBU is further configured to defer to a higher level protocol of the RAN for error recovery if the response message was incorrectly sent based on the message received from the wireless terminal. In at least one system where the RAN protocol utilizes an Evolved Universal Terrestrial Radio Access Network (E-UTRAN), the message includes a PUSCH transmission, and the response message comprises a HARQ response.

In some systems, the BBU is configured to send a message to the RRU, where the message is scheduled to be sent to the wireless terminal at a first time. A second-level protocol function may be bypassed by calculating a second time for the message to be resent to the wireless terminal if a response message from the wireless terminal indicates that the message was not received correctly, the second time based on the first time and the response time requirement of the RAN protocol, and determining, at a third time, whether or not to resend the message to the RRU with the message scheduled to be sent to the wireless terminal at the second time, the third time determined based on the second time and the determined latency for the fronthaul link. The third time is before a time that the response message is received and processed by the BBU. In systems the determining whether or not to resend the message may be based on a predetermined decision or one or more previously received response messages. In a system where the RAN protocol utilizes an Evolved Universal Terrestrial Radio Access Network (E-UTRAN), the message may include a PDSCH transmission, and the response message may include a HARQ response.

In some systems the bypassing may include configuring the wireless terminal to periodically resend a message if a response message is not received within the response time requirement, receiving a first instance of the message at the BBU, and sending multiple versions of a response for the message to the wireless terminal. In such systems, the wireless terminal accepts at least one response to the multiple versions of the response as a valid response to a second instance of the message, the second instance of the message having been sent after the first instance of the message. In a system where the RAN protocol utilizes an Evolved Universal Terrestrial Radio Access Network (E-UTRAN), the message may include a Random Access Preamble, the wireless terminal may be configured to periodically resend the Random Access Preamble by setting a preambleTransMax parameter of a MAC protocol of the E-UTRAN, and the multiple versions of the response message may include Random Access Responses with differing t_id and f_id parameters of the MAC protocol. In such systems the BBU may be further configured to calculate the differing t_id and f_id parameters for multiple instances of the Random Access Preamble based on PRACH parameters.

Figure 14:
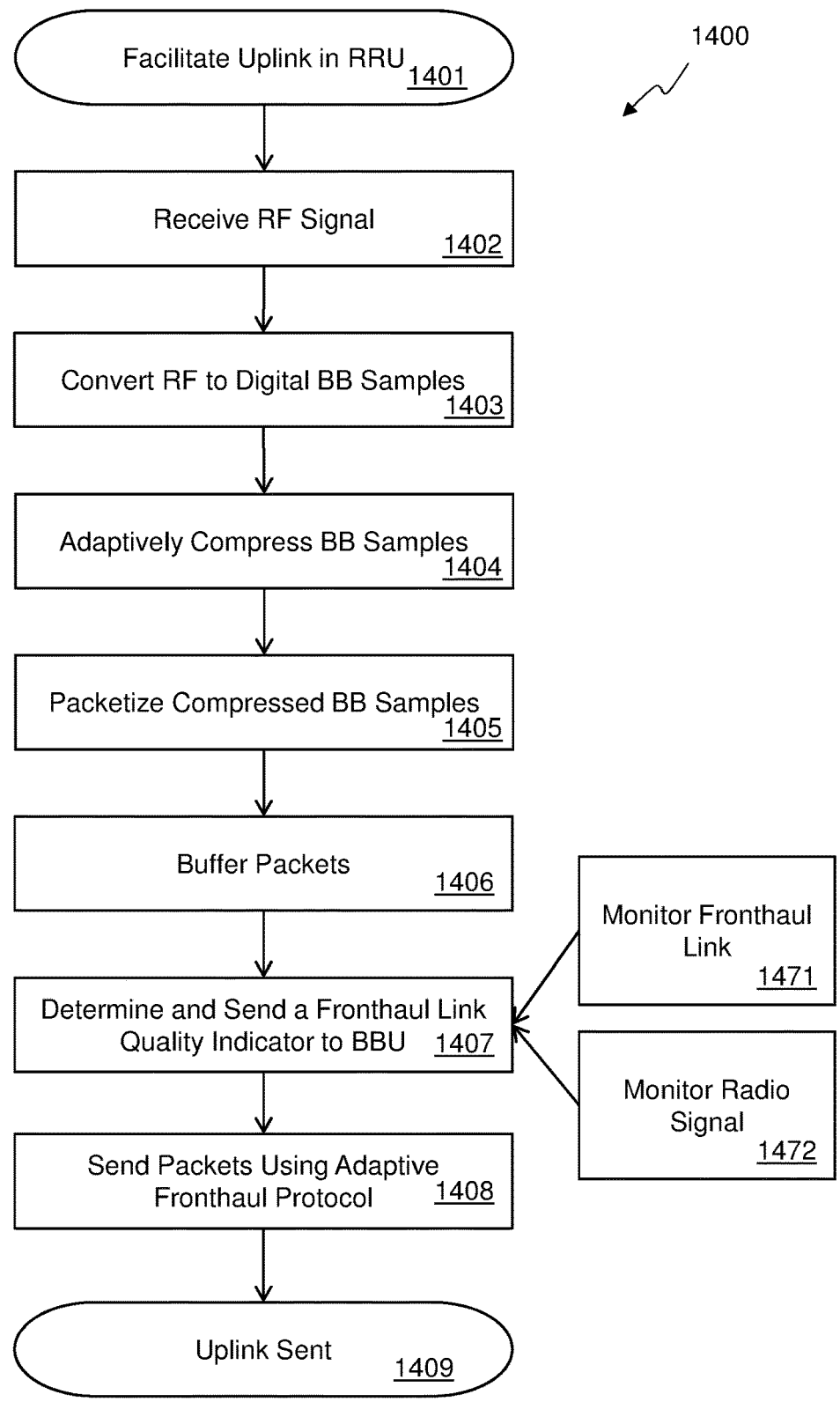
FIG. 14 shows a flowchart for an embodiment of facilitating communication between a wireless terminal and a BBU in a distributed RAN.

FIG. 14 shows a flowchart for an embodiment of facilitating communication between a wireless terminal and a BBU in a distributed RAN. The flowchart describes a method 1400 performed by a remote radio unit (RRU), for facilitating communication between a wireless terminal and a baseband unit (BBU) in a distributed radio access network (RAN). The method 1400 can be implemented by any combination of hardware and software, depending on the embodiment. In some embodiments, at least one tangible machine readable medium includes one or more instructions that in response to being executed on a computing device cause the computing device to carry out the method 1400.

Figure 15:
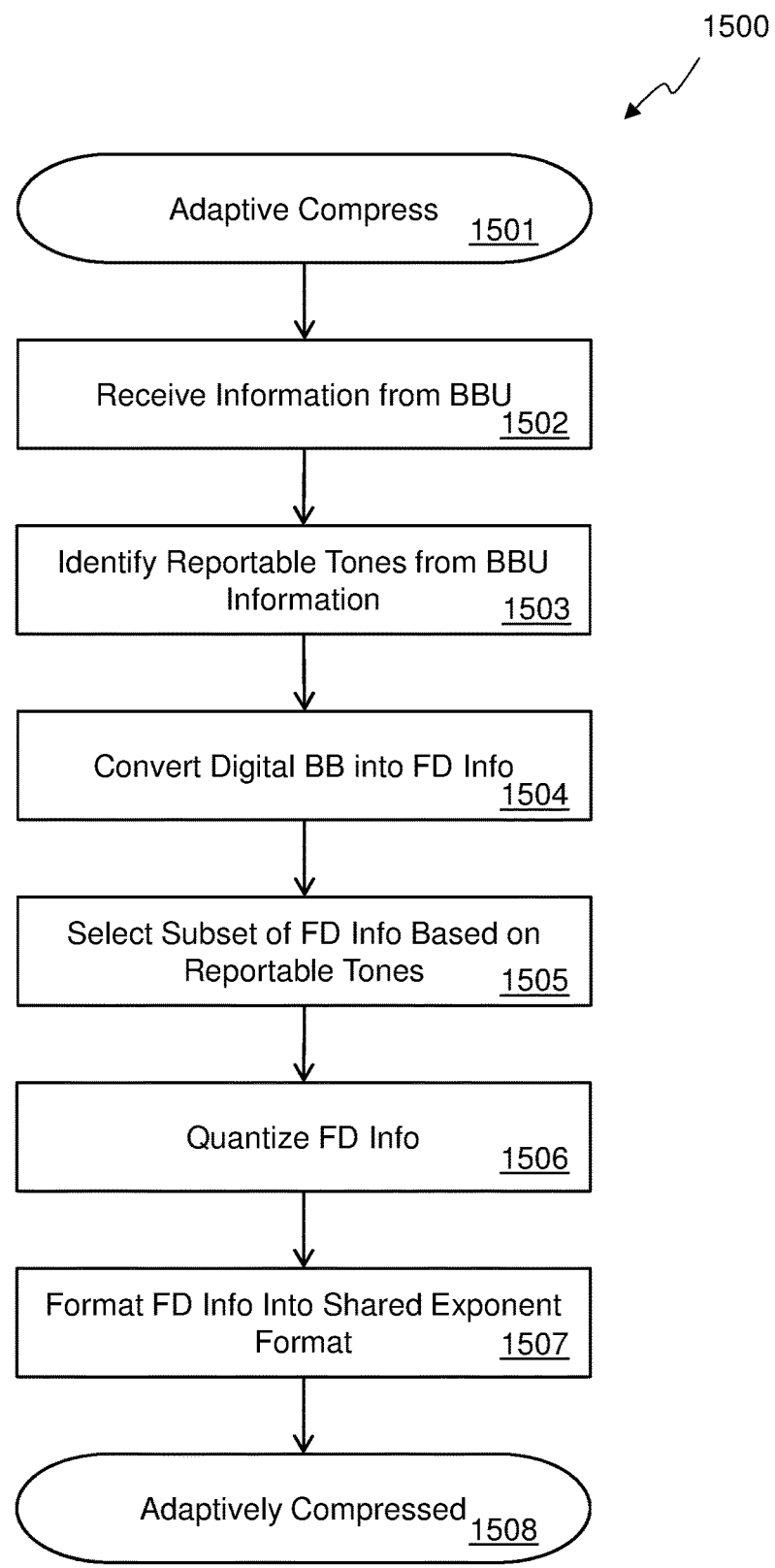
FIG. 15 shows a flowchart for an embodiment of adaptively compressing uplink fronthaul information in a RRU.

The flowchart starts facilitating uplink communication in a RRU of a RAN through a fronthaul link at block 1401 and continues with receiving a radio frequency signal from a wireless terminal at block 1402. In some embodiments, the RAN comprises an Evolved Universal Terrestrial Radio Access Network (E-UTRAN). At block 1403, the radio frequency signal is converted to digital baseband samples using receiver circuitry and an analog-to-digital converter. The digital baseband samples are adaptively compressed at block 1404, using adaptive compression circuitry, to create fronthaul uplink information. In some embodiments, the adaptive compression circuitry includes one or more processors, which may include a digital signal processor. Adaptive compression methods 1500 are shown in FIG. 15, but the adaptive compression loses information contained in the digital baseband samples in some embodiments.

In some embodiments, the method 1400 continues with packetizing the fronthaul uplink information into fronthaul uplink packets at block 1405. In some of those embodiments, the fronthaul uplink packets are compliant with an internet protocol (IP). Depending on the embodiment, the packets may be buffered at block 1406. This entails temporarily storing irregularly sent fronthaul uplink information in a buffer, either before or after is it packetized, to enable a constant stream of information to be received from a radio frequency signal sent by the wireless terminal. In some cases a size of the buffer is based on a fronthaul link quality indicator or information received from the BBU.

In various embodiments, at block 1407 a fronthaul link quality indicator is determined and the fronthaul link quality indicator is sent to the BBU over the fronthaul link. The fronthaul link may be monitored at block 1471 to capture fronthaul link information and the fronthaul link quality indicator may be determined based, at least in part, on the fronthaul link information that is captured. Various data items may be captured about the fronthaul link, including, but not limited to, an amount of data stored in one or more buffers for fronthaul link data in the RRU, buffer overrun indications, buffer underrun indications, fronthaul link error information, a fronthaul link latency, packet identity information, missing packet information, out-of-order packet information, or any combination thereof. In some embodiments, the radio signal may be monitored at block 1472 by determining a parameter of the received radio signal. The fronthaul link quality indicator may be determined at block 1407 based, at least in part, on the parameter of the received radio signal.

The fronthaul uplink information, which may be packetized, is sent over the fronthaul link to the BBU using an adaptive fronthaul protocol at block 1408. The method 1400 ends at block 1409

FIG. 15 shows a flowchart for an embodiment of adaptively compressing uplink fronthaul information in a RRU. The flowchart describes a method 1500 for adaptively compressing uplink fronthaul information and can be used to implement block 1404 of the method 1400 shown in FIG. 14. The method 1500 can be implemented by any combination of hardware and software, depending on the embodiment. In some embodiments, at least one tangible machine readable medium includes one or more instructions that in response to being executed on a computing device cause the computing device to carry out the method 1500.

The method 1500 starts at block 1501 and includes receiving information from the BBU over the fronthaul link at block 1502. Reportable tones are identified at block 1503 based on the received information from the BBU. Depending on the embodiment, this may include recognizing a tonemap descriptor in the received information from the BBU and identifying the reportable tones based on the tonemap descriptor. The reportable tones are a subset of the set of received tones and at least one tone of a set of received tones is not included in the reportable tones. So block 1503 may also include identifying at least one tone based on information, received from the BBU, that is not reportable.

At block 1504, the digital baseband samples are converted into frequency-domain information. This may be done by any method, but a Fourier transform is performed in some embodiments to convert the digital baseband samples into frequency-domain information for a set of received tones. A Fourier transform may be a discrete Fourier transform, a fast Fourier transform, or any other Fourier function. The Fourier transform may be performed using Fourier transform circuitry, which may include any combination of hardware and software. In some embodiments, the frequency-domain information is generated in a floating-point format that may include either a single floating-point number representing a real number or two floating-point numbers representing a complex number. The frequency-domain information includes at least a first frequency-domain sample and a second frequency-domain sample. In some embodiments, the digital baseband samples include pairs of in-phase and quadrature samples at discrete points in time, and the frequency-domain information includes complex samples for the set of received tones.

Only a subset of the frequency-domain information is selected to include in the fronthaul uplink information at block 1505. The subset of the frequency-domain information is related to the reportable tones. Because at least one tone is included in a set of receivable tones identified based on setup information received from the BBU and is excluded from a subset of tones identified by the information received from the BBU, at least some of the frequency-domain information is discarded. So block 1505 can also be thought of as discarding a subset of the frequency-domain information that is related to the at least one tone of the set of received tones and including a remaining subset of the frequency-domain information in the fronthaul uplink information. The remaining subset of the frequency-domain information is related to tones of the set of received tones other than the at least one tone. Thus, the method 1500 includes adapting the compressing based on the received information from the BBU.

In one embodiment, the method 1500 includes receiving a first tonemap descriptor from the BBU over the fronthaul link, identifying a first set of reportable tones based on the first tonemap, receiving a second tonemap descriptor from the BBU over the fronthaul link, identifying a second set of reportable tones based on the second tonemap, converting the digital baseband samples into first frequency-domain information associated with a first period of time and second frequency-domain information associated with a second period of time, selecting a subset of the first frequency-domain information that is related to the first set of reportable tones to be included in the fronthaul uplink information, and selecting a subset of the second frequency-domain information that is related to the second set of reportable tones to be included in the fronthaul uplink information, wherein the first set of reportable tones and the second set of reportable tones are different subsets of a set of received tones in the first frequency-domain information and the second frequency-domain information.

The method 1500 continues with quantizing the frequency-domain data at block 1506. The quantizing includes dynamically determining a quantization level for compression of the frequency-domain information, and quantizing the frequency-domain information at the quantization level to create the fronthaul uplink information. In some embodiments, the quantization level is based, at least in part, on measurements or estimates of received radio frequency power, received radio frequency noise, signal quality, modulation scheme, coding scheme, an available fronthaul bandwidth, or any combination thereof. In some embodiments, the quantization level is based, at least in part, on a determination of available fronthaul bandwidth. In some embodiments, the quantization level is based, at least in part, on an unsent amount of the fronthaul uplink information stored in a buffer of the RRU. The quantization level may be based, at least in part, on information received from the BBU over the fronthaul link, and in some embodiments, set by a quantization parameter received from the BBU over the fronthaul link. Any information may be included in the information received from the BBU for use in determining the quantization level, including, but not limited to, a radio signal-to-noise ratio, a physical layer modulation scheme, a physical layer code rate, an available bandwidth of the fronthaul link, or any combination thereof.

Frequency-domain information is compressed into shared-exponent frequency-domain information at block 1507. Shared frequency-domain information includes a first mantissa value for a real portion of the first frequency-domain sample, a second mantissa value for a real portion of the second frequency-domain sample, and a single shared-exponent value for both the first frequency-domain sample and the second frequency-domain sample. The fronthaul uplink information can include the shared-exponent frequency-domain information. In some embodiments, the fronthaul uplink information also includes additional mantissa values for additional frequency-domain samples associated with the single shared-exponent value. In at least one embodiment, the first frequency-domain sample and the second frequency-domain sample are both represented as complex numbers, and the fronthaul uplink information also includes a third mantissa value representing the complex part of the first frequency-domain sample and a fourth mantissa value representing a complex part of the second frequency-domain sample, with the single shared-exponent value used as an exponent for the complex part of both the first frequency-domain sample and the second frequency-domain sample.

The method 1500 for adaptive compression can include any combination of a) discarding frequency-domain information related to tones that are not included in a set of reportable tones, b) quantization of the frequency-domain information to a quantization level below that at which it was generated, and converting floating-point representations into a shared-exponent format.

Figure 16:
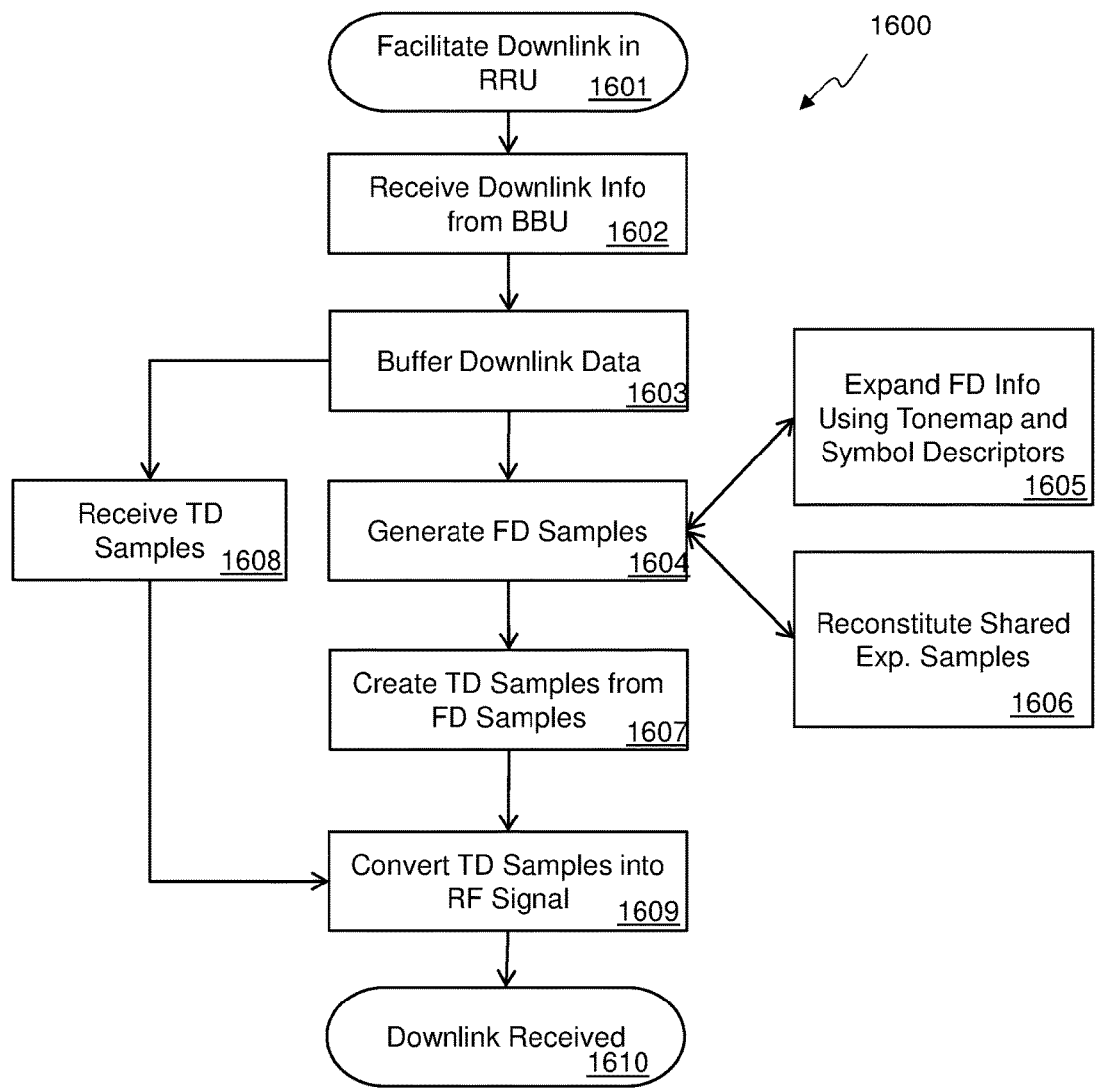
FIG. 16 shows a flowchart for an embodiment of facilitating communication between a BBU and a wireless terminal in a distributed RAN.

FIG. 16 shows a flowchart for an embodiment of facilitating communication between a BBU and a wireless terminal in a distributed RAN. The flowchart describes a method 1600, performed by a remote radio unit (RRU), for facilitating communication between a baseband unit (BBU) and a wireless terminal in a distributed radio access network (RAN). The method 1600 can be implemented by any combination of hardware and software, depending on the embodiment. In some embodiments, at least one tangible machine readable medium includes one or more instructions that in response to being executed on a computing device cause the computing device to carry out the method 1600.

The method 1600 starts to facilitate downlink communication at block 1601 and continues with receiving fronthaul downlink information over a fronthaul link from the BBU using an adaptive fronthaul protocol at block 1602. The method 1600 may include temporarily storing irregularly received fronthaul downlink information in a buffer at block 1603 to enable a constant stream of information to be provided for the radio frequency signal sent to the wireless terminal. In some embodiments, a size of the buffer can be based on a fronthaul link quality indicator or information received from the BBU.

The method 1600 also includes generating frequency-domain samples at block 1604, based on the fronthaul downlink information received. Sometimes, the frequency-domain samples are directly included in the fronthaul downlink information, so generating the frequency-domain samples includes selecting the frequency-domain samples from the fronthaul downlink information. Sometimes, the fronthaul downlink information received includes a tonemap descriptor describing a set of tones to be used to generate the radio frequency signal for transmission to the wireless terminal, a set of modulation symbol descriptors, and frequency-domain data identifying a modulation symbol descriptor of the set of modulation symbol descriptors to be used for a tone of the set of tones for a particular time period. So the frequency-domain samples are generated by expanding the frequency-domain data into the frequency-domain samples based on the tonemap descriptor and the set of modulation symbol descriptors at block 1605. Sometimes complex frequency-domain information is received for at least some time periods in the fronthaul downlink information. The complex frequency-domain information may be in a compressed floating-point format that includes a first mantissa value, a second mantissa value, a third mantissa value, a fourth mantissa value, and a shared-exponent value. So the method 1600 may include reconstituting, at block 1606, a first frequency-domain sample with a first real part having a first mantissa value and a shared-exponent value, and a first imaginary part having a second mantissa value and the shared-exponent value. A second frequency-domain sample is also reconstituted with a second real part having a third mantissa value and the shared-exponent value, and a second imaginary part having a fourth mantissa value and the shared-exponent value.

At block 1607, time-domain baseband samples are created from the frequency-domain samples. This may be done using an inverse Fourier transform. Any type of inverse Fourier transform may be used, including an inverse discrete Fourier transform (IDFT), an inverse fast Fourier transform (IFFT), or any other method. In some embodiments, the frequency-domain samples include complex frequency-domain samples, and the time-domain samples comprise pairs of in-phase and quadrature data.

Sometimes the fronthaul downlink data includes time-domain samples, so at block 1608, pairs of in-phase and quadrature time-domain data are received in the fronthaul downlink information. The method also includes converting the time-domain baseband samples into a radio frequency signal to send to the wireless terminal at block 1609, which includes converting pairs of in-phase and quadrature time-domain data into a portion of the radio frequency signal to send to the wireless terminal.

Figure 17:
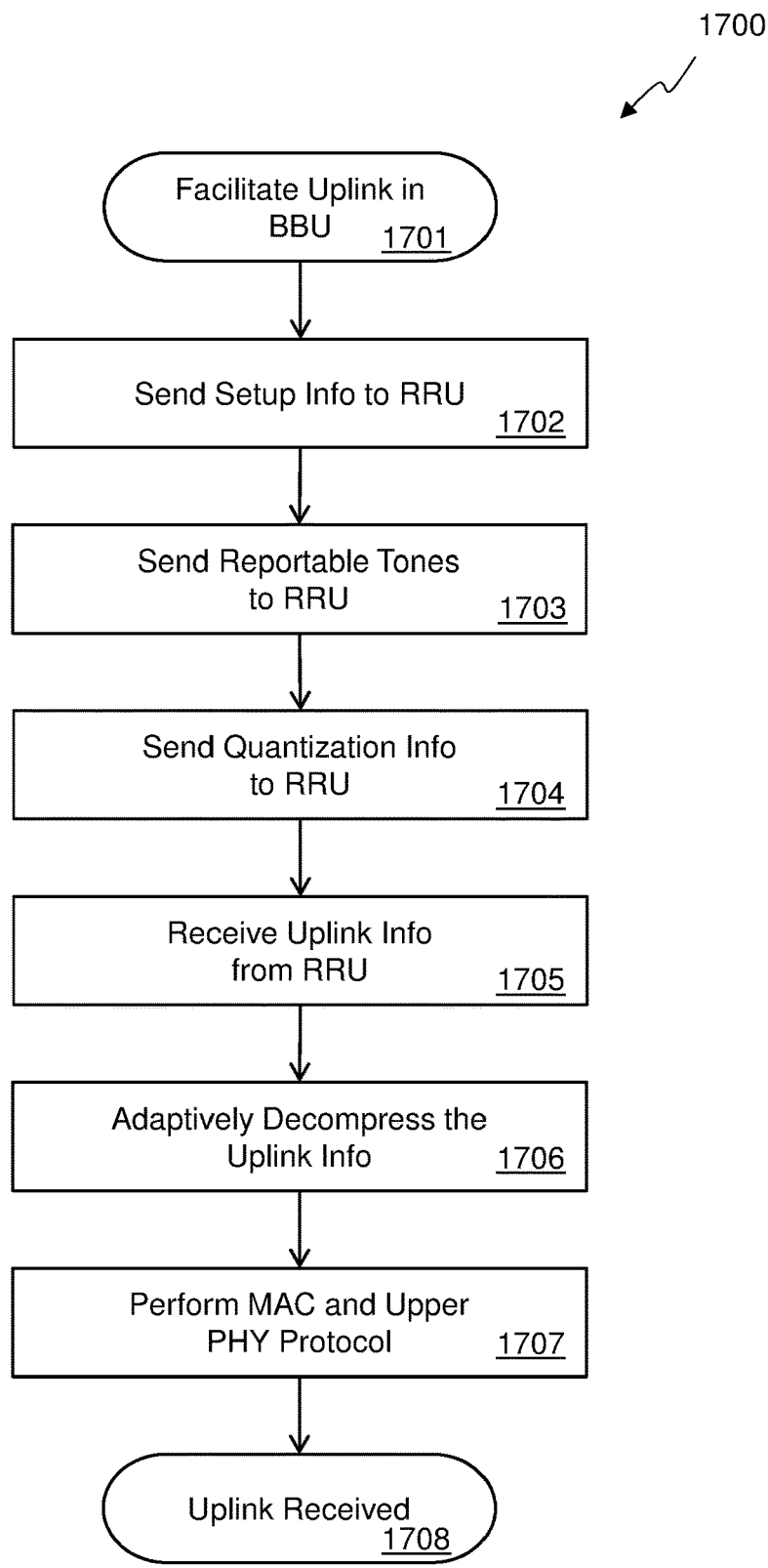
FIG. 17 shows a flowchart for an embodiment of facilitating communication between a RRU and a core network in a distributed RAN.

FIG. 17 shows a flowchart for an embodiment of facilitating communication between a RRU and a core network in a distributed RAN. The flowchart describes a method 1700, performed by a baseband unit (BBU), for facilitating communication between a core network and a remote radio unit (RRU) in a distributed radio access network (RAN). The method 1700 can be implemented by any combination of hardware and software, depending on the embodiment. In some embodiments, at least one tangible machine readable medium includes one or more instructions that in response to being executed on a computing device cause the computing device to carry out the method 1700.

The method 1700 starts to facilitate uplink at block 1701 and includes communicating over the fronthaul link with the RRU using an adaptive fronthaul protocol. This communication includes several types of communication. Setup information is sent to the RRU at block 1702 that identifies a set of receivable tones. The receivable tones may be based on a type of modulation, a center frequency, a bandwidth, or other parameters of the RAN. The method 1700 also includes sending tone information to the RRU over the fronthaul link that identifies a set of reportable tones to use in creation of the fronthaul uplink information at block 1703. This can also be referred to as sending tone information to the RRU over the fronthaul link that identifies at least one tone, included in the set of receivable tones, that is useable to identify frequency-domain information to discard during creation of the fronthaul uplink information. The tone information can include a tonemap descriptor that describes a set of reportable tones out of the set of receivable tones, and the at least one tone is excluded from a set of reportable tones. In at least one embodiment, the tone information includes a first tonemap descriptor that describes a set of reportable tones associated with a first time period and a second tonemap descriptor that describes a set of reportable tones associated with a second time period.

A tonemap descriptor of one embodiment includes either a base type with parameters, a unary operator and a second tonemap descriptor, or a binary operator with a third tonemap descriptor and a fourth tonemap descriptor. The unary operator may be an inverse operator. The binary operator is selected from a group consisting of a union operator, an intersection operator, and a difference operator. The base type with parameters is selected from a group consisting of a contiguous type with parameters comprising a first tone and a number of tones, a periodic type with parameters comprising a tone index and a periodicity, a list type with parameters comprising a list of tones, and a block type with parameters comprising a block size.

In some embodiments, the method 1700 includes sending quantization information to the RRU over the fronthaul link at block 1704. The quantization information may be based on a radio signal-to-noise ratio, a physical layer modulation scheme, a physical layer code rate, an available bandwidth of the fronthaul link, or any combination thereof. In at least one embodiment, the quantization information includes a quantization parameter to set a quantization level used by the RRU.

At block 1705, fronthaul uplink information is received from the RRU over the fronthaul link using the adaptive fronthaul protocol, which is adaptively decompressed at block 1706 to create decompressed fronthaul uplink data. In some embodiments, the adaptive decompression includes determining a quantization level of the fronthaul uplink information and expanding the fronthaul uplink information to a native quantization level to adaptively decompress the fronthaul uplink information. In some embodiments, the adaptive decompression includes receiving complex frequency-domain information in a shared-exponent floating-point format for at least some time periods in the fronthaul downlink information. The fronthaul uplink information includes a first mantissa value, a second mantissa value, a third mantissa value, a fourth mantissa value, and a shared-exponent value. A first frequency-domain sample is reconstituted with a first real part having the first mantissa value and the shared-exponent value, and a first imaginary part having the second mantissa value and the shared-exponent value. A second frequency-domain sample is also reconstituted with a second real part having the third mantissa value and the shared-exponent value, and a second imaginary part having the fourth mantissa value and the shared-exponent value. Additional frequency-domain samples may be reconstituted using additional mantissa values from the fronthaul uplink information with the shared-exponent value.

The decompressed fronthaul uplink data is then processed to provide appropriate information to the second level protocol. This processing includes performing a portion of a first-level protocol of the RAN, including upper PHY protocol blocks such as demuxing, demodulating, or decoding. So a second-level protocol of the RAN, such as the MAC, and an upper PHY protocol are performed at block 1707. In at least one embodiment, the RAN protocol uses an Evolved Universal Terrestrial Radio Access Network (E-UTRAN), the first-level protocol uses an Evolved Universal Terrestrial Radio Access (E-UTRA) physical-layer (PHY) protocol, and the second-level protocol uses an E-UTRA medium access control (MAC) protocol.

Figure 18:
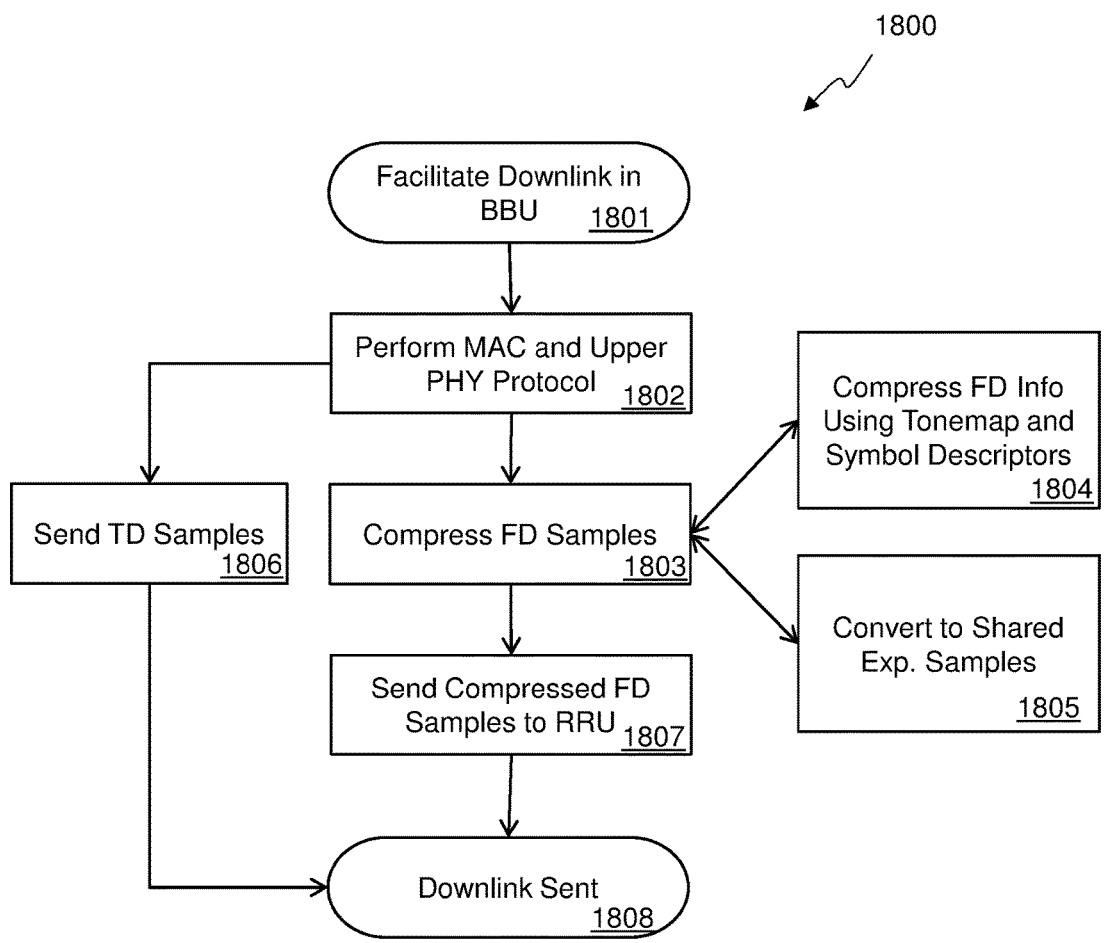
FIG. 18 shows a flowchart for an embodiment of facilitating communication between a core network and a RRU in a distributed RAN.

FIG. 18 shows a flowchart for an embodiment of facilitating communication between a core network and a RRU in a distributed RAN. The flowchart describes a method 1800, performed by a baseband unit (BBU), for facilitating communication between a core network and a remote radio unit (RRU) in a distributed radio access network (RAN). The method 1800 can be implemented by any combination of hardware and software, depending on the embodiment. In some embodiments, at least one tangible machine readable medium includes one or more instructions that in response to being executed on a computing device cause the computing device to carry out the method 1800.

The method 1800 starts at block 1801 and includes performing at least a second-level protocol of the RAN. So a MAC protocol and an upper PHY protocol are performed at block 1802. The method continues by adaptively compressing data, such as frequency-domain information, to create fronthaul downlink information to send to the RRU over the fronthaul link at block 1803. In some embodiments, the frequency-domain information is compressed at block 1804 using a tonemap descriptor describing a set of tones to be used by the RRU to generate a radio frequency signal for transmission to the wireless terminal, and data identifying modulation symbols for tones of the set of tones, and times associated with the modulation symbols. In some embodiments, data, including a first frequency-domain sample and a second frequency-domain sample, are converted into a shared-exponent format that includes two mantissa values for a first frequency-domain sample, two mantissa values for a second frequency-domain sample, and a single shared-exponent value for the first frequency-domain sample and the second frequency-domain sample to compress the data at block 1805 so that the fronthaul downlink information includes the frequency-domain information in the shared-exponent format. The fronthaul downlink information may also include additional mantissa values for additional frequency-domain samples associated with the single shared-exponent value.

The method 1800 includes communicating over the fronthaul link with the RRU using an adaptive fronthaul protocol, so block 1807 includes sending the fronthaul downlink information to the RRU over the fronthaul link using the adaptive fronthaul protocol. Sometimes time-domain samples are sent over the fronthaul link to the RRU at block 1806. The downlink information has been sent at block 1808.

Figure 19:
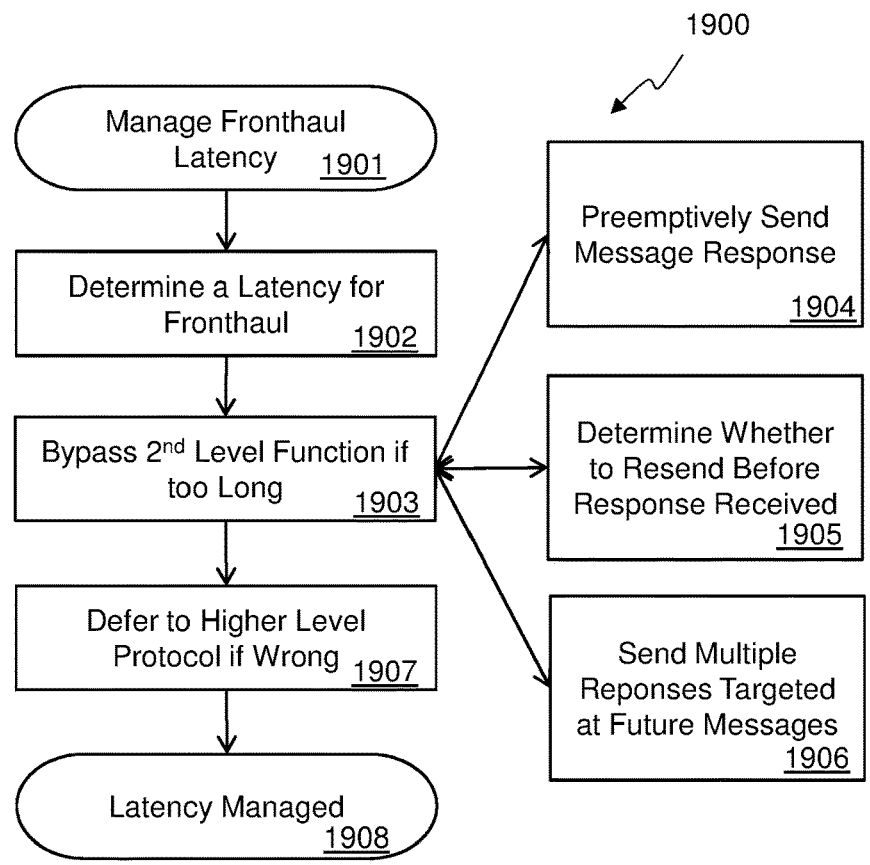
FIG. 19 shows a flowchart for an embodiment of managing fronthaul latency in a distributed RAN.

FIG. 19 shows a flowchart for an embodiment of managing fronthaul latency in a distributed RAN. The flowchart describes a method 1900 to manage latency on the fronthaul link. The method 1900 can be implemented by any combination of hardware and software, depending on the embodiment. In some embodiments, at least one tangible machine readable medium includes one or more instructions that in response to being executed on a computing device cause the computing device to carry out the method 1900.

The method 1900 starts managing fronthaul latency at block 1901 and a latency for the fronthaul link is determined at block 1902. In some cases, the determined latency is based on a measured latency, historical latency data, or predetermined values. At least one function of the second-level protocol is bypassed at block 1903 based on the determined latency and a response time requirement of the RAN protocol.

There are several different ways that a function of a second-level protocol can be bypassed. A message response can be preemptively sent at block 1904. This can be done by determining a first time that a message is expected to be sent from the wireless terminal and calculating a second time for a response message to be sent to the wireless terminal based on the first time and a response time requirement of the RAN protocol. A command is sent, at a third time, to the RRU to schedule the response message to be sent at the second time over the fronthaul link to bypass the at least one function of the second level protocol, the third time determined based on the second time and the determined latency for the fronthaul link. The third time is before a time that the message is received and processed by the BBU. In one embodiment, the RAN protocol utilizes an Evolved Universal Terrestrial Radio Access Network (E-UTRAN), the message includes a PUSCH transmission, and the response message includes a HARQ ACK response.

In some cases the bypassing is done by determining whether to resend a message before a response is received at block 1905. This includes sending a message to the RRU, the message scheduled to be sent to the wireless terminal at a first time. A second time is calculated for the message to be resent to the wireless terminal if a response message from the wireless terminal indicates that the message was not received correctly, the second time based on the first time and the response time requirement of the RAN protocol. At a third time, it is determined whether or not to resend the message to the RRU with the message scheduled to be sent to the wireless terminal at the second time to bypass the at least one function of the second level protocol, the third time determined based on the second time and the determined latency for the fronthaul link. The third time is before a time that the response message is received and processed by the BBU. In some cases this includes determining whether or not to resend the message based on a predetermined decision or one or more previously received response messages. In at least one embodiment, the RAN protocol utilizes an Evolved Universal Terrestrial Radio Access Network (E-UTRAN), the message includes a PDSCH transmission, and the response message comprises a HARQ response.

In an embodiment, the bypassing includes sending multiple responses targeted at future messages. To do this, the wireless terminal is configured to periodically resend a message if a response message is not received within the response time requirement. The BBU receives a first instance of the message and then sends multiple versions of a response for the message to the wireless terminal. The wireless terminal accepts at least one response to the multiple versions of the response as a valid response to a second instance of the message, the second instance of the message having been sent after the first instance of the message. In at least one embodiment, the RAN protocol utilizes an Evolved Universal Terrestrial Radio Access Network (E-UTRAN), the message comprises a Random Access Preamble, the wireless terminal is configured to periodically resend the Random Access Preamble by setting a preambleTransMax parameter of a MAC protocol of the E-UTRAN, and the multiple versions of the response message comprises Random Access Responses with differing t_id and f_id parameters of the MAC protocol. The BBU may be further configured to calculate the differing t_id and f_id parameters for multiple instances of the Random Access Preamble based on PRACH parameters.

The method of claim 1900, may also include deferring to a higher level protocol of the RAN for error recovery at block 1907, such as if the response message was incorrectly sent based on the message received from the wireless terminal. The latency has been managed at block 1908.

Figure 20:
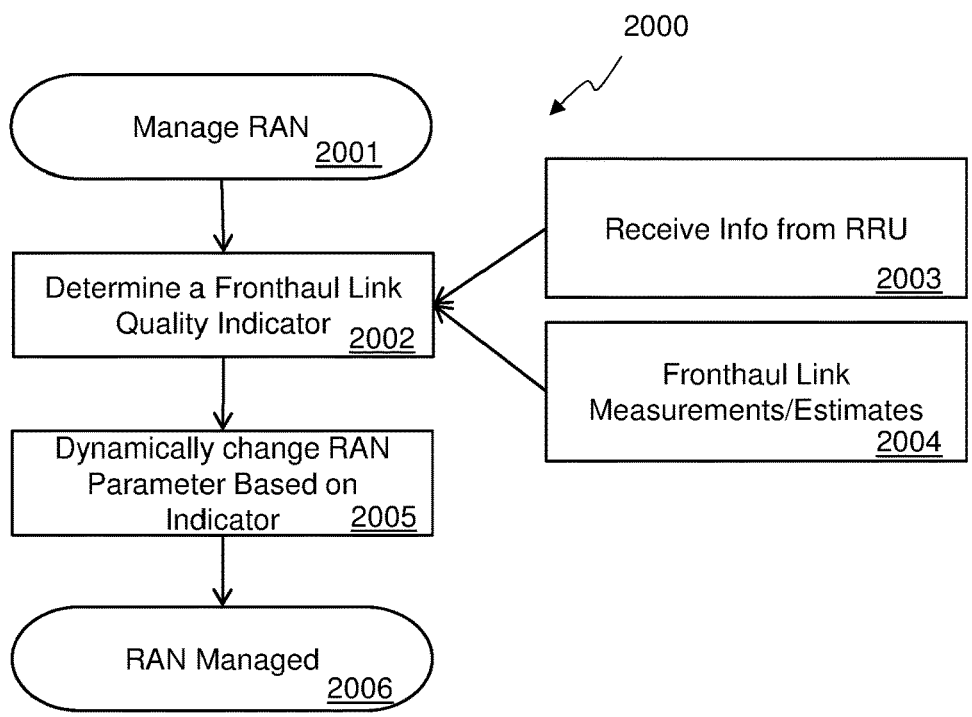
FIG. 20 shows a flowchart for an embodiment of managing a distributed RAN based on fronthaul link quality.

FIG. 20 shows a flowchart for an embodiment of managing a distributed RAN based on fronthaul link quality. The flowchart describes a method 2000 for managing the RAN. The method 2000 can be implemented by any combination of hardware and software, depending on the embodiment. In some embodiments, at least one tangible machine readable medium includes one or more instructions that in response to being executed on a computing device cause the computing device to carry out the method 2000.

The method 2000 starts managing the RAN at block 2001 and determines an indicator of fronthaul link quality at block 2002. In some cases the indicator of fronthaul link quality is determined based, at least in part, on information received from the RRU over the fronthaul link at block 2003. The information received from the RRU comprises RRU buffer status information, RRU buffer overrun indications, RRU buffer underrun indications, information about a received radio frequency signal, or any combination thereof. In some cases the indicator of fronthaul link quality is based on measurements or estimates of the fronthaul link at block 2004. The indicator of fronthaul link quality may be determined based, at least in part, on a latency of the fronthaul link, a bandwidth of the fronthaul link, errors on the fronthaul link, undelivered packets on the fronthaul link, out-of-order packets on the fronthaul link, BBU buffer overruns, BBU buffer underruns, or any combination thereof.

The method 2000 also includes dynamically changing one or more parameters of the RAN based on the indicator at block 2005. The one or more parameters of the RAN include frequency-domain allocation size, modulation and coding schemes, number of users, number of grants, pattern of usable subframes, anticipation of the scheduling with respect to the time index it refers to, or any combination thereof. In at least one embodiment, the indicator of fronthaul link quality includes a latency of the fronthaul link, and the one or more parameters of the RAN include a raResponseWindowSize parameter in a MAC protocol of an E-UTRA network. The method concludes at block 2006.

With frequency-domain transmission of non-empty resource elements (REs) only, it is beneficial for the non-empty REs to have a uniform structure. For example, if non-empty REs come in few blocks of consecutive REs, fewer descriptors may be needed to capture the map.

A cross-layer optimization of the scheduling may be adopted to reduce overhead of transmitting the map over the fronthaul. For example, the PDSCH scheduler may prefer consecutive RB allocations over scattered allocations, unless there's a significant performance improvement in using a scattered allocation. Similarly, the PDCCH scheduler may strive to minimize the number of non-consecutive blocks of non-empty resource element groups (REGs) on control symbols, e.g., by optimizing user selection and PDCCH candidates (which both control the CCEs). Similarly, the PUSCH scheduler may try to minimize the number of non-consecutive blocks of non-empty REs.

The fronthaul link may not provide enough throughput to deliver uplink and downlink samples for all REs, e.g., if fronthaul is not based on fiber-grade wiring, or if the medium is shared and the traffic spikes, or the like. Nevertheless, if average fronthaul throughput is large enough to convey all required DL broadcast signals, e.g., CRS, PSS, SSS, PBCH, SIB1, and the like, the cell can be left active, unlike in the implementation where time-domain baseband samples are exchanged over the fronthaul.

If fronthaul throughput is limited, any throughput left after transmission of frequency-domain samples corresponding the broadcast signals along with any required control signaling, can be allocated to additional physical channels, e.g., PDCCH, PDSCH, and the like. The scheduler may be aware of the average or instantaneous fronthaul throughput and may decide allocations based upon the throughput. For example, even with abundant queued traffic at either eNB side or UE side, the scheduler may not load the entire bandwidth due to the lack of fronthaul resources for exchanging the corresponding FD samples. In this scenario, only a portion of the tones may be allocated to the physical channels, with the portion computed based on the measured or estimated fronthaul throughput.

In addition, the state of the buffers of samples at the RRU (if any) may be used to drive scheduling decisions. For example, if either uplink buffer size or downlink buffer size or both increase above a predefined threshold, a suitable signal may be delivered via the control plane to the BBU, which may react by instructing the scheduler to decrease resource allocations in the next subframes, until the buffers empty out.

Aspects of various embodiments are described with reference to flowchart illustrations and/or block diagrams of methods, apparatus, systems, and computer program products according to various embodiments disclosed herein. It will be understood that various blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and/or block diagrams in the figures help to illustrate the architecture, functionality, and operation of possible embodiments of systems, devices, methods, and computer program products of various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems or circuitry that perform the specified functions or acts, or combinations of special purpose hardware, circuitry, and computer instructions.

These computer program instructions may also be stored in a non-transitory computer readable medium, such as a tangible computer memory, or tangible memory, that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 21:
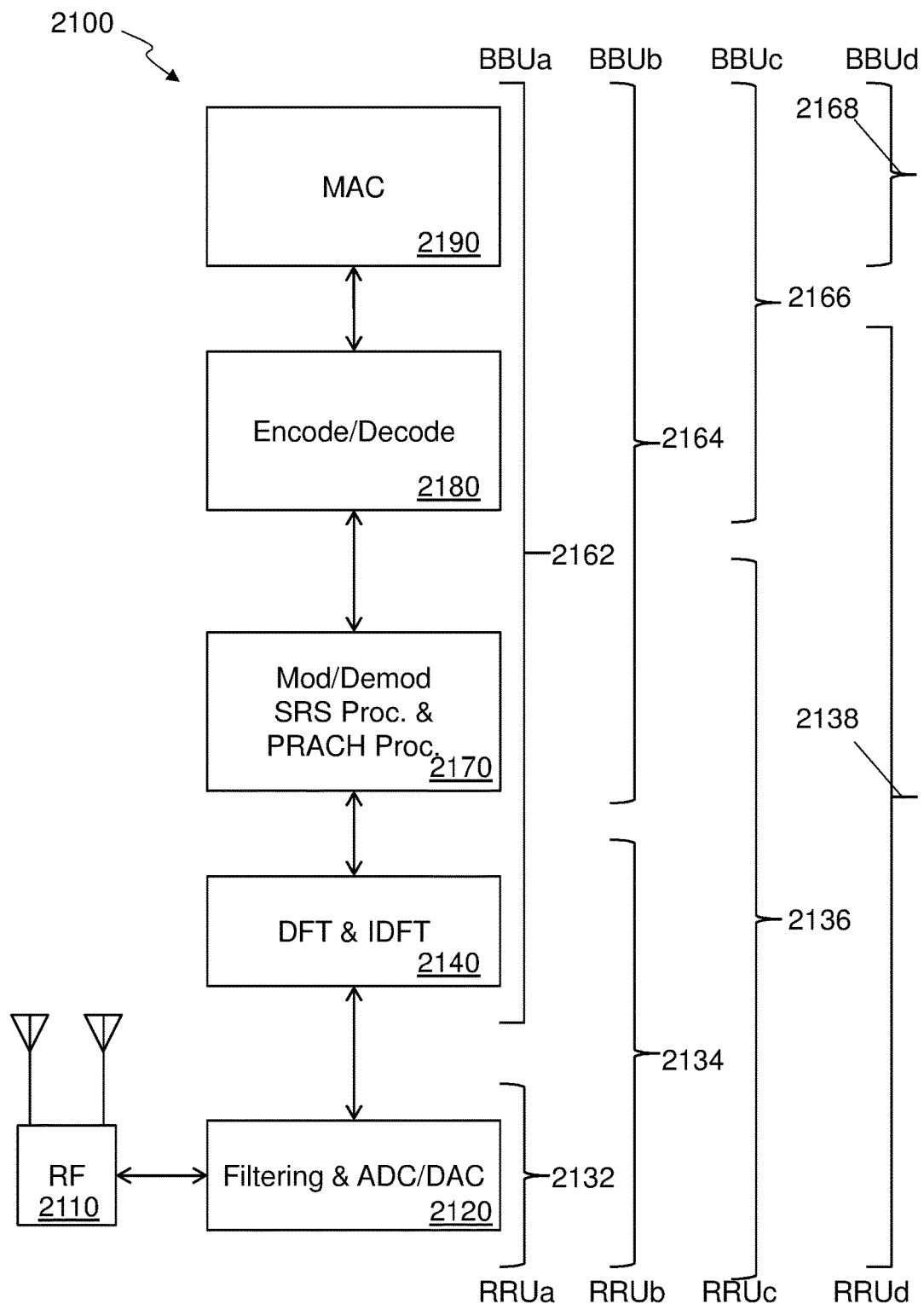
FIG. 21 is a diagram showing different possible partitioning options for embodiments of a distributed RAN.

FIG. 21 is a diagram showing different possible partitioning options for embodiments of a distributed RAN. Different functional splits between BBU and RRU may be considered, that is, specific functions of the protocol stack 2100 may be carried out by either the BBU or RRU depending on the design. In some embodiments, BBUs 2162 is responsible for generating (DL side) and decoding (UL side) baseband time-domain samples. This includes the MAC 2190 and in some cases, additional upper layers of the software stack, encode/decode 2180, modulation/demodulation as well as SRS processing, and PRACH processing 2170, and DFT and IDFT processing 2140. In these embodiments, the RRUa 2132 is responsible for RF operations 2110 tailored to transmission and reception of wireless signals as well as filtering and analog-to-digital conversion (ADC) and digital-to-analog conversion (DAC) 2120.

Other partitioning options are also possible in other embodiments. Each function may be implemented via dedicated hardware, software running on a special purpose processor such as a DSP, software running on a general purpose processor, or a combination thereof. In some embodiments, the split of functions between RRU and BBU may be static, that is, functional split has to be designed in advance and RRU and BBU may have to be equipped with special modules to support specific functions. In other embodiments, at least one function may be adaptively or semi-statically assigned to a unit depending on availability of specific HW blocks, availability of computational resources, fronthaul performance (e.g., in terms of latency, throughput, and the like), system performance requirements, power consumption requirements, and the like.

Different RRUs associated with the same BBU may implement different functions, depending on the various parameters described above. For example, two or more RRUs may implement minimal functions and the entire BB processing for the RRUs may be carried out by the BBU, while the remaining RRUs associated to the BBU may implement at least one of the BB functions. In the configuration, the two or more RRUs may benefit from centralized processing, e.g., by means of adoption of CoMP techniques.

Moving a specific function from RRU to BBU (or vice-versa) may imply disabling a HW or SW module on the RRU (BBU) and enabling a corresponding HW or SW module on the BBU (RRU). Furthermore, moving a specific function from RRU to BBU (or vice-versa) may imply changing the format of the data being exchanged over the fronthaul between the two units. The decision of moving a function from at least one RRU to the BBU or vice-versa may be taken by the BBU or a different centralized unit, and may require suitable signaling of the change and associated parameters over the fronthaul. In general, providing more functionality in the RRU provides lower fronthaul throughput requirements, but may not enable some CoMP algorithms, and may lead to a more expensive RRU. Providing less functionality in the RRU may lead to a cheaper/simpler RRU, lower overall energy consumption, and support for CoMP, but a higher fronthaul throughput requirement.

In some embodiments, the RRU is split between the DFT/IDFT 2140 and the modulate/demodulate block 2170 so that the RRUb 2134 includes the RF functions 2110, the filtering and ADC/DAC 2120 and the DFT/IDFT 2140. In these embodiments, the BBUb 2164 includes the MAC 2190, encode/decode 2180, and modulation/demodulation processing 2170.

In an OFDM-based radio technology, in DL, the last operation to be carried out to obtain time-domain BB samples may be an IDFT. Similarly, in a SC-FDMA-based radio technology, in UL, the first operation to be carried out on the BB samples may be a DFT. So with this partitioning, the IDFT and DFT operations are carried out by the RRUb 2134. Frequency-domain (FD) samples are exchanged between RRUb 2134 and BBUb 2164 over the fronthaul link, along with an additional control plane. Exchange of frequency-domain samples provides a significant reduction in the amount of data to be exchanged over the fronthaul link compared to exchanging time-domain baseband samples.

The RRUb 2134 is equipped with a suitable hardware, and software if required, to perform (I)FFTs at a speed that allows to sustain communication at the desired system bandwidth. Depending on the embodiment, the RRUb 2134 may perform a discrete Fourier transform (DFT), inverse discrete Fourier transform (IDFT), fast Fourier transform (FFT), inverse fast Fourier transform (IFFT), or any other specific implementation of a Fourier transform and/or inverse Fourier transform. The terms discrete Fourier Transform, fast Fourier transform, and Fourier Transform are used interchangeably within unless a specific intent is obvious in the use of one or the other term. Size of the FFT is a function of the system bandwidth, oversampling factors, and the like, and may be predefined, statically assigned, or semi-statically and dynamically assigned by the BBU. In the latter case, the FFT size needs to be signaled by the BBU to the RRU via control plane.

Some physical channels may require different processing than others in the RRU. For example, a separate processing tailored to decoding of PRACH may have to be carried out at the RRU, with the processing including at least one of a filtering, DFT, or the like, different from those employed for the other channels. The special processing may only be carried out on resources where PRACH transmission may be expected, and may be carried out in parallel with the main processing.

In another embodiment, the RF functions 2110, the filtering and ADC/DAC 2120, the DFT/IDFT 2140, and modulation/demodulation 2170 are performed in the RRUc 2136, leaving the BBUc 2166 with the encode/decode 2180 and MAC 2910 functions. This partitioning provides further compression of data exchanged over the fronthaul link.

In another embodiment, all PHY functions, the RF functions 2110, the filtering and ADC/DAC 2120, the DFT/IDFT 2140, modulation/demodulation 2170, the and encode/decode 2180, are implemented by the RRUd 2138, while the MAC 2190 and some of the upper layer functions may still be carried out by the BBUd 2168. In this embodiment, exchange of information over the fronthaul link corresponds to the exchange over the PHY/MAC interface. In addition, control information and signals may need to be exchanged. Such control information may include parameters and instructions needed by specific PHY layer blocks to perform their operations. For example, a turbo encoder and rate matching block may need to know code rate, redundancy version, and the like.

For PDSCH transmission, the MAC layer 2190 generates transport blocks (TBs) in the form of a stream of bits that need to be processed at the PHY layer. The PHY layer processing includes coding, modulation, layer mapping, spatial processing (e.g., linear precoding), mapping over resource elements, and the like.

For PDCCH transmission, the MAC layer 2190 provides downlink control information (DCI) content in the form of a stream of bits to PHY layer for processing. The processing includes encoding via tail-biting convolutional code (TBCC), modulation, spatial processing, mapping over resource elements, and the like. Parameters needed to perform the operations may include number and locations of CCEs to be used for transmission of the PDCCH, DCI format size, and the like.

For CRS transmission, parameters needed to generate CRS sequences and corresponding mapping over resource elements are provided to PHY layer, which carries out sequence generation, modulation, mapping over antenna ports and resource elements, and the like.

For PSS and SSS transmission, parameters needed to generate the sequences (e.g., the physical cell identity) and corresponding mapping over resource elements can be provided to PHY layer, which carries out sequence generation, modulation, mapping over antenna ports and resource elements, and the like.

For PHICH transmission, parameters needed to generate the PHICH signals, e.g., content (ACK/NACK), resource elements where to map the PHICHs, and the like, are provided to the PHY layer, which carries out sequence generation, modulation, mapping over antenna ports and resource elements, and the like.

For PUSCH reception, the MAC layer 2190 receives from PHY the TBs corresponding to PUSCHs suitably processed by the PHY layer. The processing includes extraction of resource elements, spatial processing, demodulation, demapping, decoding, and the like. Advanced processing such as interference cancellation, joint demodulation, and the like may be also carried out.

For PUCCH reception, the MAC layer 2190 receives from PHY the decoded uplink control information (UCI) that was sent in PUCCH, e.g., HARQ response, channel state information (CSI), and the like. Processing carried out by PHY layer includes extraction of resource elements, spatial processing, demodulation, demapping, decoding, and the like. Advanced processing such as interference cancellation, joint demodulation, and the like may be also carried out.

For SRS reception, the MAC layer 2190 receives one or more estimates of channel response, power, interference, time and frequency synchronization, and the like, for each SRS in a given subframe. Processing carried out by PHY layer includes extraction of resource elements associated to SRS transmissions, spatial processing, demodulation, and estimation of the at least one of the parameters above, and the like. Advanced processing such as interference cancellation, joint processing, and the like may be also carried out. Parameters needed to identify and demodulate each SRS are provided by MAC to PHY.

For PRACH reception, the MAC layer 2190 receives the detected PRACH preambles (if any) for each PRACH opportunity, including the preamble ID, timing estimate, and the like. Processing carried out by PHY layer includes suitable extraction of PRACH signals (e.g., via bandpass filtering), correlation with known sequences, energy estimation, timing estimation, and the like. Advanced processing such as interference cancellation, joint processing, and the like may be also carried out. Parameters needed to identify and demodulate PRACH, e.g., locations (in time and frequency) of PRACH opportunities, are provided by MAC to PHY.

In embodiments, data and control information exchanged over the fronthaul from the BBU to the RRU can include:
  Content of transport blocks and parameters needed to encode, modulate, and map them over corresponding PDSCHs;

Content of downlink control information and parameters needed to encode, modulate, and map them over corresponding PDCCHs;

Parameters needed to generate, modulate, and map CRS;

Parameters needed to generate, modulate, and map PSS and SSS;

Content of Master Information Block (MIB) and parameters needed to modulate and map PBCH;

Parameters needed to demap, demodulate, and decode PUSCHs received on a given subframe;

Parameters needed to demap, demodulate, and decode PUCCHs received on a given subframe;

Parameters needed to identify transmitted SRSs on a given subframe and perform estimation based on the SRSs;

Parameters needed to identify PRACH resources and determine transmitted PRACH preambles Common parameters provided to RRU also include system frame number (SFN) and subframe number that a certain set of parameters, instructions or payloads refer to, physical cell identity, number of antenna ports, and the like.

Data and control information exchanged over the fronthaul from the RRU to the BBU can include:

For each PUSCH decoded by PHY layer:
  Content of transport blocks corresponding to the PUSCH
  Channel estimates corresponding to the PUSCH
  Synchronization parameters (e.g., time and frequency) corresponding to the PUSCH
  Energy, interference, and noise estimates corresponding to the PUSCH
  Reliability (e.g., based on likelihood ratios) corresponding to the PUSCH For each PUCCH decoded by PHY layer:
  Content of uplink control information corresponding to the PUCCH
  Channel estimates corresponding to the PUCCH
  Synchronization parameters (e.g., time and frequency) corresponding to the PUCCH
  Energy, interference, and noise estimates corresponding to the PUCCH
  Reliability (e.g., based on likelihood ratios) corresponding to the PUCCH For each SRS employed by PHY layer to perform measurements:
  Channel estimates corresponding to the SRS
  Synchronization parameters (e.g., time and frequency) corresponding to the SRS
  Energy, interference, and noise estimates corresponding to the SRS For each preamble transmission identified by PHY on a PRACH opportunity:
  Preamble identity
  Synchronization parameters (e.g., time and frequency) corresponding to the SRS
  Energy and path loss estimates corresponding to the SRS Turbo decoding of PUSCH channels may impose a significant computational burden on the RRU, thus increasing cost, energy consumption, and form factor, or preventing software-defined implementation, or the like. Thus, turbo decoding may be moved from a RRU to a BBU, while all other computations remain as discussed before. In this case, communications between the RRU and BBU change as follows:

BBU provides to RRU all parameters needed to demap and demodulate all PUSCHs, but parameters needed for decoding are not provided RRU provides to BBU a representation of encoded (that is, not yet decoded), demodulated content of transport blocks associated to each PUSCH. The representation may be in the form of log-likelihood ratios (LLRs) associated to each coded bit in the transport block, or an equivalent representation.

Figure 22:
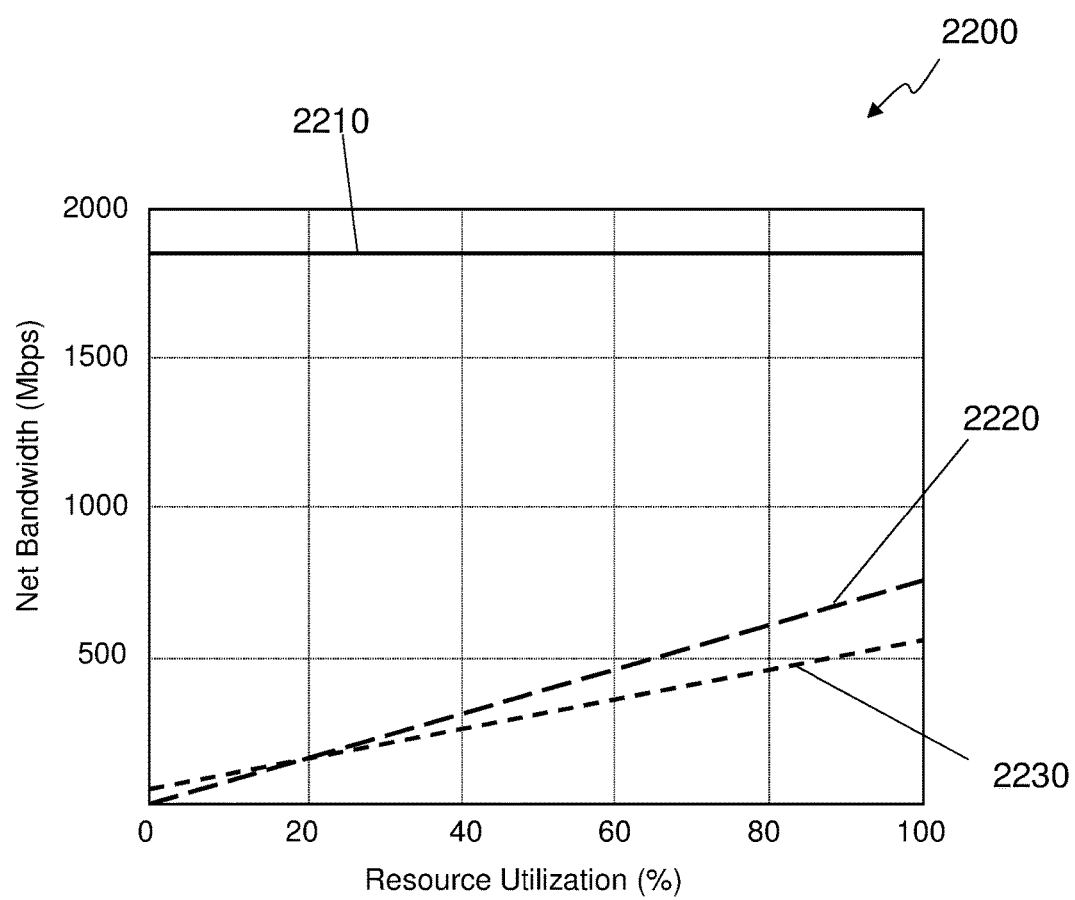
FIG. 22 shows a graph of fronthaul bandwidth usage for a traditional distributed RAN compared to an embodiment of a distributed RAN.

FIG. 22 shows a graph 2200 of fronthaul bandwidth usage for a traditional distributed RAN compared to an embodiment of a distributed RAN. A LTE 20 MHz system using a traditional distributed RAN architecture was used to collect the data as CPRI link bandwidth 2210. The traditional system used a CPRI link as the fronthaul, transmitting 15-bit real-valued time-domain samples between the BBU and the RRH. The RRH had two antennas used for both uplink and downlink radio operations. The bandwidth utilized is shown as a function of the resource utilization, which goes from 0% (when no UE is connected to the RRH) to 100% (when all radio resources are used). Note that CPRI link bandwidth 2210 is a constant irrespective of the resource utilization, because it sends time-domain samples for every sample period, and that the graph shown is for a single direction of data communication, either uplink or downlink.

An adaptive fronthaul uplink bandwidth 2220 and adaptive fronthaul downlink bandwidth 2230 are also shown on the graph 2200. Note that because the adaptive fronthaul downlink sends frequency-domain samples, the bandwidth utilization on the fronthaul link between RRU and BBU is roughly proportional to the resource utilization. Even at full load, the adaptive fronthaul schemes provide a significant gain both in uplink bandwidth 2220 and downlink bandwidth 2230 as compared to the CPRI bandwidth 2210. For the measurement taken on the system using the adaptive fronthaul, the real-valued frequency-domain samples were sent in a shared-exponent format with 11 bits used for each mantissa value with 5 exponent bits shared for all the frequency-domain samples in the same LTE resource block.

Figure 23:
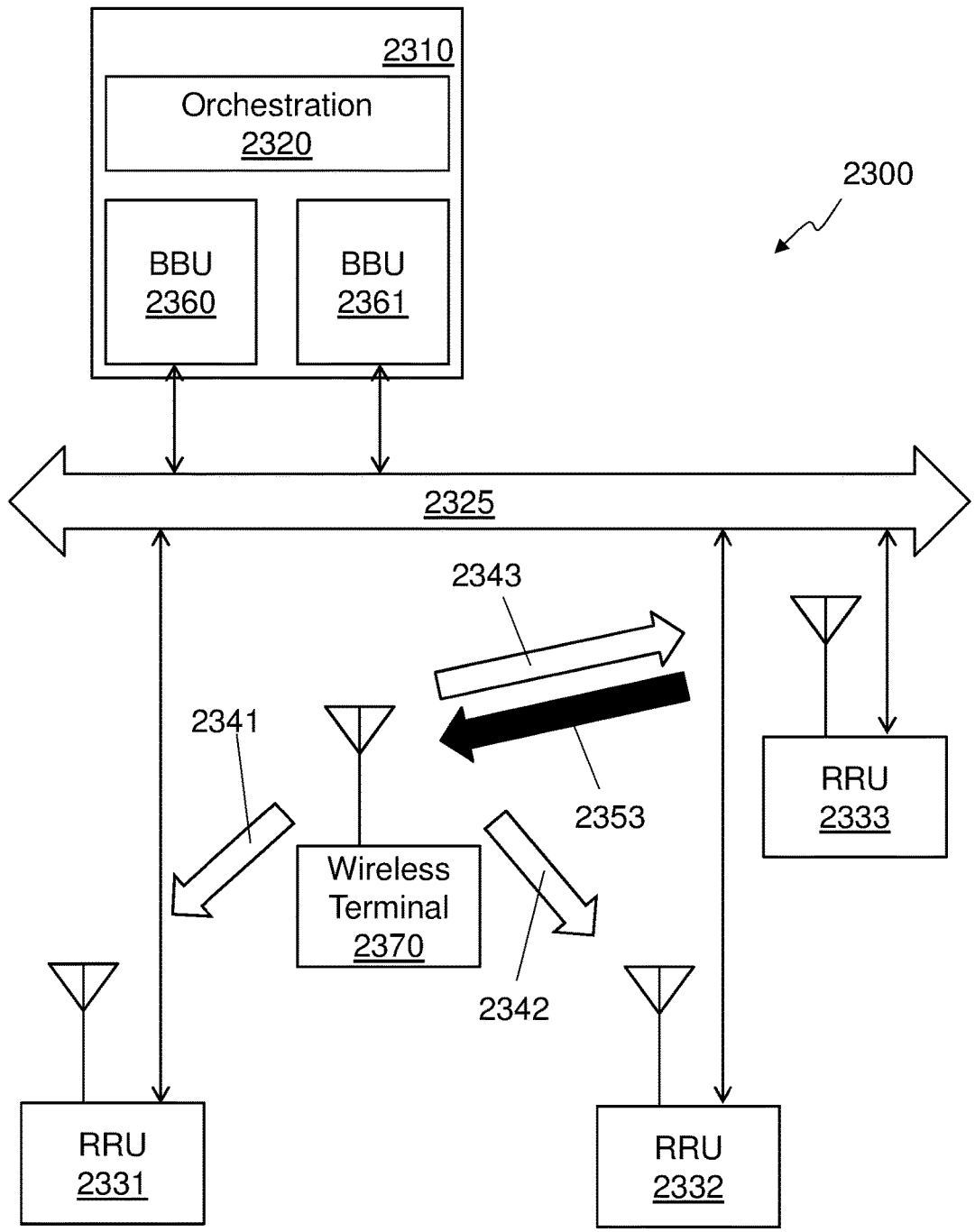
FIG. 23 is a block diagram of an embodiment of a distributed RAN using an orchestration layer.

FIG. 23 is a block diagram of an embodiment of a distributed RAN 2300 using an orchestration layer 2320. The adaptive fronthaul protocol used on the fronthaul link for communication between an RRU and BBU of embodiments can be referred to as fronthaul-over-IP (FIP). In some embodiments, an orchestration layer 2320 determines, among other things, association between RRUs and BBUs, which RRUs are active or inactive, computational resources to be assigned to each BBU instance, and so on. One instantiation of the orchestration layer 2320 can manage multiple BBUs 2360, 2361 and multiple RRUs 2331, 2332, 2333, and may manage all of the resources within one central office 2310 in some embodiments.

In the example system 2300, RRU 2333 is an active cell, in that is transmitting DL signals 2353 and receiving UL signals 2343, RRU 2331 is DL-inactive/UL-active because it is receiving UL signals 2341 but not transmitting and RRU 2332 is also DL-inactive/UL-active because it is receiving UL signals 2342 but not transmitting. An RRU 2331, 2332 in the DL-inactive/UL-active state may not transmit DL physical signals, or may transmit only a subset of DL signals, thus may not appear as a regular cell to the wireless terminal 2370. However, such RRUs 2331, 2332 may still be used to receive UL signals transmitted by the wireless terminal 2370. An RRU's state may be changed on the fly by the orchestration layer 2320 depending on mobile traffic, radio conditions, and the like.

In embodiments, multiple RRUs may be controlled by a single BBU, which may perform coordinated multipoint transmission and reception from and to the multiple RRUs it controls. In other embodiments, several BBUs share the same computational resources, e.g., physical or virtual CPUs, GPUs, servers, and the like. The orchestration layer 2320 assigns resources to the running BBUs 2360, 2361, performs handovers of terminals among BBUs 2360, 2361, controls scheduling parameters of the BBUs 2360, 2361, and performs other tasks. These operations may be triggered by resource usage, radio traffic, radio conditions, interference conditions, and the like.

Cellular base stations have stringent synchronization requirements, necessary to support reliable communications. In a typical centralized RAN implementation, all RRUs attached to the same central office can be kept synchronized by relying on the fronthaul signaling, since a fronthaul, such as a CPRI link, is assumed to be synchronous. Synchronization issues arise when a fronthaul link connecting at least one BBU with at least one RRU is asynchronous, as is the case for an adaptive fronthaul link utilizing a packet switching network such as an IP network. In the following description, an E-UTRAN network is used as an example, but the concepts described can apply to other RANs.

Since in a typical base station implementation the clock driving the sampling of the baseband signal and the clock used to up-sample and down-sample the signal to the employed carrier frequency (two separate frequencies in case of FDD) are both derived from a main system clock, locking the main clock enables synchronization of both. The radio signal transmitted by a standard-compliant eNB is typically required to meet very stringent constraints in terms of carrier frequency accuracy. For example, the frequency error cannot exceed 50 ppb (parts per billion) for LTE macro cells, whereas indoor small cells are given slightly relaxed requirements, which, for 3GPP standards, range up to 100 ppb for Release 6 Home Node B's (HNBs) and 250 ppb for Release 8 enhanced Home Node B's (eHNBs). The requirements are so strict that eNBs are typically GPS-synchronized, to guarantee fast estimation and compensation of the oscillator errors.

In scenarios with physical separation between BBU and RRU, The BBU is typically GPS-synchronized, whereas the RRU is not. In this case, to guarantee that the signal emitted by the RRU has the desired accuracy, the fronthaul link between BBU and RRU is traditionally a dedicated fiber-grade synchronous link, which essentially provides the RRU with the same relative frequency accuracy available at the BBU side. When the fronthaul link between BBU and RRU is asynchronous (e.g., the link is a logical transport channel conveyed over a shared network), synchronization may be based on a radio signal transmitted by a different device, as described below—the schemes may be denoted as "wireless assisted".

Wireless signals that can be used by the RRU for synchronization include at least one of a GPS signal, a broadcast signal transmitted by a nearby TV station, a downlink signal transmitted by a nearby cellular base station (e.g., an LTE eNB), an uplink signal transmitted by a nearby beacon unit, or a combination thereof. A beacon unit may be a special purpose device equipped with a GPS receiver and an LTE UE circuitry and baseband processor, whose goal is provide synchronization to nearby RRUs as described below.

In a first embodiment, a GPS signal is used by the RRU for synchronization. This may be accomplished by providing the RRU with a GPS receiver, from which GPS-grade atomic-clock level accuracy can be extracted.

Figure 24:
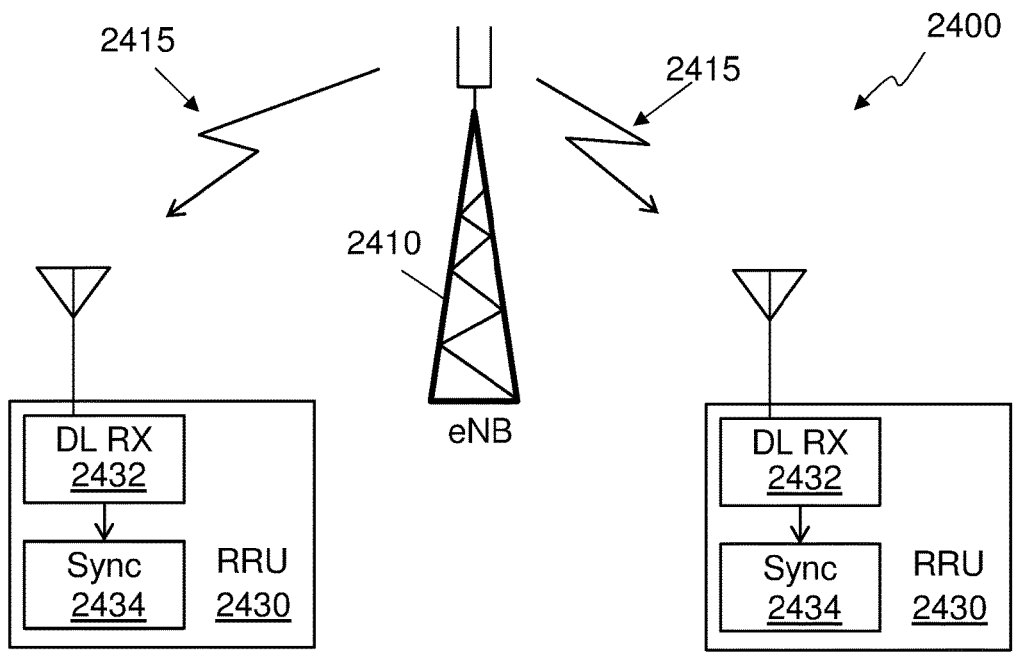
FIG. 24 is a diagram showing carrier synchronization based on a downlink signal.

FIG. 24 is a diagram showing carrier synchronization based on a downlink signal 2415, which is a second embodiment of a RAN system 2400. In the second implementation, a downlink (DL) signal 2415 transmitted by at least one nearby eNB 2410 is used for synchronization. The signal 2415 may be at least one of a primary synchronization sequence (PSS), secondary synchronization sequence (SSS), physical broadcast channel (PBCH), cell-specific reference signal (CRS), or a combination thereof. The at least one signal may be received by the RRU 2430 via a dedicated RF receiver chain 2432, or by periodically retuning the existing receiver chain to the frequency used for transmission by the at least one nearby eNB 2410. In the latter case, the RRU 2430 may not be able to receive regular uplink signals while the receiver chain is used to receive the signal for the sake of synchronization. Uplink configuration and scheduling may be tuned so as to minimize the performance degradation stemming from skipping reception of uplink signals during the retuning phases. If the carrier frequency used by the at least one eNB 2410 for transmission is the same carrier frequency employed by the RRU 2430 for DL transmission, the RRU 2430 may need to shut down DL transmission when it intends to receive the at least one signal transmitted from the at least one nearby eNB 2410, to avoid self-interference. If at least a partial subframe boundary synchronization is present, that is, the RRU 2430 and the at least one eNB 2410 are subframe aligned with reduced timing error, the retuning may be carried out when the transmission of the synchronization signal (e.g., a PSS) is expected, thus minimizing the fraction of time the DL chain of the RRU 2430 has to be shut off. On the contrary, if the RRU 2430 and the at least one eNB 2410 are asynchronous, the RRU 2430 tuner has to retune for long enough to receive at least one transmission of the synchronization signal.

Figure 25:
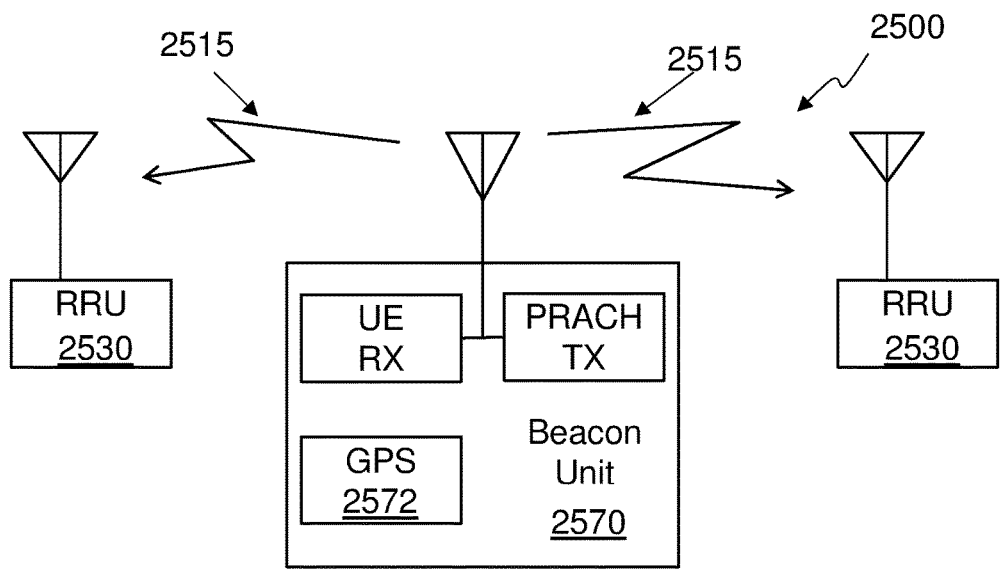
FIG. 25 is a diagram showing carrier synchronization based on an uplink signal.

FIG. 25 is a diagram showing carrier synchronization based on an uplink signal 2515, which is a third embodiment of a RAN system 2500. An uplink signal 2515 transmitted by at least one nearby UE 2570 is used for synchronization. The nearby UE 2570 may be a dedicated beacon unit. The beacon unit 2570 may be located in an area with good GPS reception and with good propagation conditions from/to multiple RRUs 2530. The beacon unit 2570 may have a GPS-synchronized UE circuitry 2572 and baseband UE processing, possibly simplified (that is, lacking some features to reduce costs). The beacon unit 2570 may periodically attempt random access on the uplink frequency used by nearby RRUs 2530 for UL reception. Periodic random access attempts may sequentially target a different RRU 2530, that is, the UE embedded in the beacon unit 2570 may sequentially camp on each detectable RRU 2530 and perform at least one random access for each RRU 2530 after camping. The plurality of detected RRUs 2530 may be explored in a round-robin fashion. Special resources (e.g., preamble identity, subframe configuration, center frequency, and the like) may be assigned to the beacon unit 2570 so as to make it easy to distinguish preamble transmissions from the beacon unit 2570 and preamble transmissions from regular UEs. As an alternative, all RRUs 2530 in a given area may share a common set of resources devoted to preamble transmissions from the beacon unit 2570, and all RRUs 2530 may receive the preamble transmissions on the shared resources, the share resources being different from the PRACH resources devoted to preamble transmissions from regular UEs. At least one RRU 2530 may detect a preamble transmission from the beacon unit 2530, interpret it as a transmission from the beacon unit 2530 rather than a random access attempt from a regular UE, and estimate the frequency offset between the received preamble signal and the oscillator embedded in the RRU 2530. The offset may be used to correct the embedded oscillator's errors and drifts.

In both of the embodiments described above, the RRU may perform all operations needed to acquire carrier synchronization. As an alternative, the RRU may perform a subset of the operations, and remaining operations needed to acquire carrier synchronization may be carried out by an associated BBU. For example, the RRU may be equipped with RF devices and functions needed to receive and sample the assisting signal, whereas all the corresponding baseband functions may be carried out by the BBU. The BBU may then transmit information to the RRU on how to correct the estimated frequency error. In this process, the BBU may utilize one of the numerous algorithms known to provide frequency error estimation by processing reference signals, or a sampled version of them, such as the algorithms in "Carrier-frequency estimation for transmissions over selective channels," by M. Morelli and U. Mengali, published in *IEEE Transactions on Communications*, vol. 48, no. 9, pp. 1580-1589, September 2000, and "ML estimation of time and frequency offset in OFDM systems," by J. J. van de Beek, M. Sandell and P. O. Borjesson, published in *IEEE Transactions on Signal Processing*, vol. 45, no. 7, pp. 1800-1805, July 1997, among others. Also, the BBU may convey information to the RRU on how to correct the frequency error by transmitting simple commands in the form "increase/decrease the RRU frequency reference by N ppb", where N is the desired granularity of the error correction process.

The BBU may ask the RRU to tune to a specific frequency and sample a specific signal based on the quality of the radio signal. For example, the BBU may ask the RRU to sample an eNB signal in indoor settings with poor GPS reception, or to sample a GPS signal in remote rural areas with poor LTE coverage. The BBU may decide dynamically which source to ask for, based on a suitable metric of the radio signal quality. For example, the BBU may ask the RRU to sample a different signal when the signal currently used for frequency synchronization experiences a degradation in signal-to-noise ratio (SNR). Similarly, the BBU may ask the RRU to switch from LTE reference signals to GPS reference signals, and vice versa. The same concepts hold for any radio signal emitted from a source that meets the desired frequency accuracy requirements. Similar techniques for adaptive selection of reference signals to assist frequency synchronization may be employed at the RRU side, without BBU intervention.

Another synchronization issue is alignment, across geographically separated RRUs, of the OFDM (SC-FDMA for UL) symbol boundary, the subframe boundary, and the radio frame boundary. Achieving this synchronization among nearby RRUs enables advanced algorithms and techniques such as Coordinated Multi-Point (CoMP), enhanced inter-carrier interference coordination (eICIC), and the like. Once the master clocks of a plurality of RRUs are synchronized and fulfill the accuracy requirements of the standard, sampling frequency is assumed to be synchronized, too. However, having locked oscillators is not enough to achieve symbol/subframe/radio frame alignment among the plurality of RRUs. Achieving such alignment, denoted as timing synchronization herein, is important to enable CoMP, eICIC, and other advanced features. Similarly to carrier frequency synchronization, timing synchronization can be achieved through assistance of at least one of a GPS signal, DL synchronization signal, or UL synchronization signal.

In a first embodiment, a GPS signal is used by the RRU for timing synchronization. This may be accomplished by providing the RRU with a GPS receiver, from which GPS-grade atomic-clock level accuracy can be extracted. Symbol, subframe, and radio frame boundaries can be obtained from the GPS clock in a uniform fashion across the plurality of RRUs, so that, since they share the same clock (obtained from GPS signals), timing alignment is automatically ensured with a precision related to the common clock.

In a second embodiment, a downlink signal transmitted by at least one nearby eNB is used for synchronization. The signal may be at least one of a primary synchronization sequence (PSS), secondary synchronization sequence (SSS), physical broadcast channel (PBCH), cell-specific reference signal (CRS), or a combination thereof. The same issues described above for carrier frequency synchronization in the implementation hold for timing synchronization, too. The RRU may try to detect the at least one DL synchronization signals. If the at least one signal is detected correctly, and if an absolute timing reference can be extracted from the signal (e.g., a subframe index and a system frame number), the RRU may align its own timing with the reference extracted from the detected signal. The boundaries of the detected signal may also be used to align timing. For example, if the signal occupies one OFDM symbol, the first sample of the detected signal may be used as a reference by the RRU to determine OFDM symbol boundaries. Note that the synchronization accuracy in this scenario may be limited by the propagation delay between the nearby eNB and the RRU. Since such propagation delay is in general unknown, the uncertainty applies to the timing synchronization as well. Thus, timing alignment between the RRU and the eNB may be at best within the maximum propagation delay between the RRU and the eNB.

In a third implementation, an uplink signal transmitted by at least one nearby UE is used for timing synchronization. The nearby UE may be a dedicated GPS-synchronized beacon unit, as described above. The beacon unit may periodically attempt random access on the uplink frequency used by nearby RRUs for UL reception, and the preamble transmissions may be received by nearby RRUs who may use the received signal boundaries to synchronize their own timing. The timing reference that can be obtained from a received preamble transmission includes a subframe boundary, since the preambles are transmitted with subframe alignment. Depending on the PRACH resource configuration, additional timing reference information may be obtained. For example, if one subframe of every radio frame is configured by at least one RRU for PRACH, and if a preamble transmitted by the beacon unit is detected by the RRU, the detected signal may also be used by the RRU to determine an absolute reference of a subframe index within a radio frame, corresponding to the PRACH configuration. Additional timing reference may be obtained by suitable association of a preamble index with timing reference information. For example, the preamble index may indicate a system frame number (SFN). For example, the beacon unit may encode the system frame number in the preamble identifier as follows: preambleID=SFN modulo N, where N is the number of available preamble identifiers. The beacon unit may then choose a preamble identifier according to the formula above when attempting the random access. The nearby RRUs that detected the preamble transmission may extract the SFN (modulo N) and use this information for radio frame synchronization. The additional timing uncertainty stemming from the modulo operation (due to the finite number of signature sequences for the preamble transmission) may be solved via network timing synchronization or other methods. A special set of PRACH resources may be assigned to preamble transmissions from the beacon unit, so as to avoid confusion between the preamble transmissions and random access attempts from regular UEs.

In order to improve the timing alignment accuracy of the second and third embodiments described above, the propagation delays between RRU and the eNB (second embodiment) or the beacon unit (third embodiment) may be estimated or measured. For example, propagation delay may be estimated from the geographical distance between the sites, and the estimated value (assumed constant for entire lifetime of the deployment) may be used to compensate the timing alignment error. In another example, propagation delay may be measured when the devices are deployed, and the measured value (assumed constant for entire lifetime of the deployment) may be used to compensate the timing alignment error.

In a different embodiment, the propagation delay may be periodically measured autonomously by the network, and the measured value may be used to compensate the timing alignment error until an updated measurement is available. The measurement may rely on regular LTE standard protocols, e.g., on the timing advance scheme used by LTE network to correct propagation delays and ensure uplink timing alignment.

Figure 26:
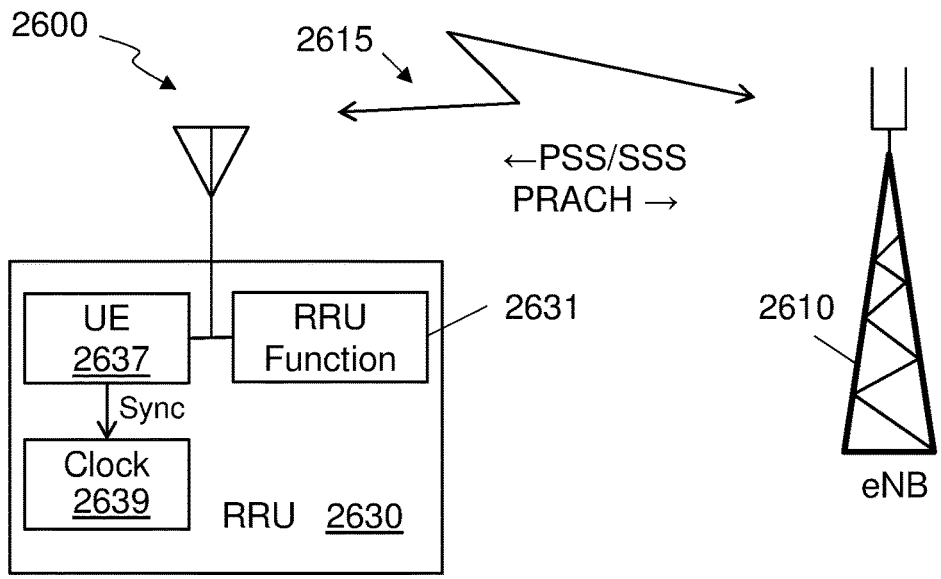
FIG. 26 is a diagram showing carrier synchronization based on a downlink signal with compensation of propagation delay.

FIG. 26 is a diagram showing carrier synchronization based on a downlink signal 2615 with compensation of propagation delay in a RAN system 2600 similar to the system 2400 shown in FIG. 24. The RRU 2630 of this embodiment is be equipped with an embedded UE 2637 having both a DL receiver and an UL transmitter (as in a regular UE, although possibly with reduced baseband capabilities), as well as the RRU function 2631. The embedded UE 2637 in the RRU 2630 may camp on at least one eNB 2610 used for synchronization and may periodically attempt a random access tailored to the eNB 2610. If the preamble transmission is correctly received by the eNB 2610, the response contains a timing advance command, which may be used by the embedded UE 2637 to estimate a propagation delay and provide the RRU function 2631 with a corrected timing synchronization from the clock 2639.

Figure 27:
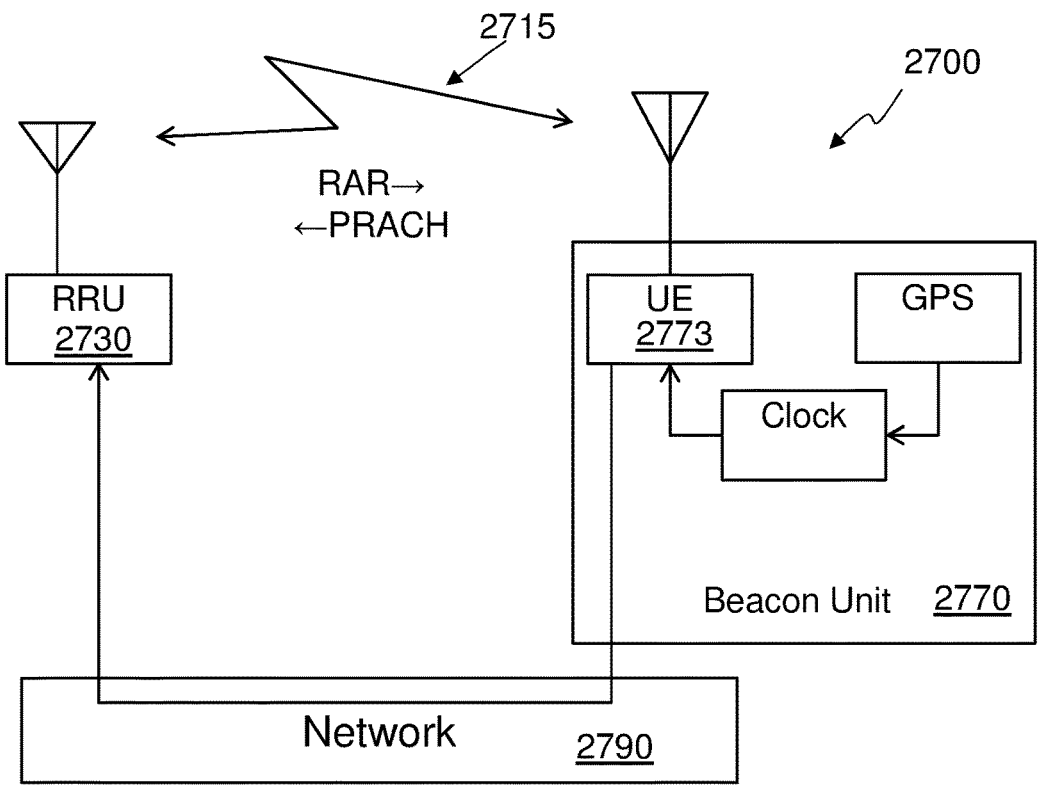
FIG. 27 is a diagram showing carrier synchronization based on an uplink signal with compensation of propagation delay.

FIG. 27 is a diagram showing carrier synchronization based on an uplink signal 2715 with compensation of propagation delay in a RAN system 2700 which may be similar to the system 2500 shown in FIG. 25. The beacon unit 2770 may be equipped with an embedded UE 2773 having both an UL transmitter and a DL receiver, and may have connection to the network 2790, e.g., via a cable, wireless connectivity, or the like. The beacon unit 2770 may attempt random access as described above, and may receive a random access response (RAR) from at least one RRU 2730 in the vicinity. The random access responses may contain timing advance information, from which an estimate of the propagation delay between the beacon unit 2770 and the RRU 2730 can be obtained. The timing advance information or propagation delay estimates may be provided by the beacon unit 2770 to a control unit in the network, e.g., a BBU, which may use the information to aid timing synchronization for the nearby RRUs.

In some instances non-negligible carrier frequency offsets exist between at least one UL received signal (e.g., a PUSCH) and the RRU local oscillator. The offset may be due to Doppler shift stemming from mobility of UEs. Performance degradation can arise from these non-negligible offsets, especially when signals transmitted from UEs with different offsets are multiplexed in the same subframe.

In a given slot or subframe a plurality of uplink signals (e.g., PUSCH, PUCCH, SRS, or the like) transmitted by a plurality of UEs may be multiplexed and may have to be decoded by the eNB. Since the signals may come from different mobile terminals, each with a different speed and direction, each signal may be affected by a different Doppler shift. Similarly, carrier frequency errors in the terminals' oscillators may further contribute to the overall frequency shift experienced by each signal.

A Doppler shift affecting an OFDM or SC-FDMA modulated signal, like for example a PUSCH, PUCCH, SRS, or the like, have two major effects.

1) Time variations of the time-domain channel impulse response destroy orthogonality among subcarriers in the frequency domain, thus causing inter-carrier interference (ICI). Per-tone equalization is no longer optimal due to the inter-dependence among subcarriers, and depending on the severity of ICI the performance degradation stemming from per-tone processing may be significant, thus requiring special processing and/or compensation to cope with ICI or prevent it.

2) Channel changes across consecutive OFDM(A) symbols, and such variations may be large enough to severely affect the quality of channel estimation. To enable channel estimation, standards usually provide suitable reference signals, e.g., the demodulation reference sequence (DM-RS) which aids channel estimation for the sake of demodulation of PUSCH or PUCCH. The reference sequences may be located in specific OFDM(A) symbols in a slot or subframe, and other symbols may not convey any reference signal whatsoever. If channel estimation relies on reference signals only, special interpolation algorithms may be needed to derive channel estimates for symbols not conveying reference signals. In a rapidly time-varying scenario, the interpolation may be inaccurate, and the resulting channel estimates may not reflect the actual channel realizations over symbols not conveying reference signals. The inaccurate channel estimates may affect the overall system performance, e.g., in terms of decoding reliability.

It has been shown through simulations and lab tests that the second effect listed above has a more dramatic impact than the first in typical LTE deployments. That is, for increasingly large Doppler shifts, channel estimation may become the main bottleneck affecting overall system performance. The insurgence of ICI also affects performance, although its effect may be less severe than the one from channel estimation inaccuracies. If enhanced channel estimation techniques are adopted to cope with Doppler shifts, ICI may become the primary cause of performance degradation.

In a first embodiment, the eNB may ignore the different Doppler shifts affecting the plurality of signals multiplexed within the slot or subframe, and may demodulate and decode the plurality of signals assuming that the Doppler shifts have a negligible impact on the performance. Channel estimation may be carried out on OFDM symbols conveying reference signals, and channel estimates for other symbols may be assumed to coincide with channel estimates over the closest symbol where a channel estimate is available.

In a second embodiment, the ICI due to Doppler shifts may still be ignored and assumed negligible. Channel estimation may still be carried out on symbols conveying reference signals. Suitable filtering, smoothing, interpolation, or the like, may be carried out to derive channel estimates for the remaining OFDM symbols. The filtering may be based on a Kalman or Wiener filter, or may be a linear interpolation. The filtering may depend on parameters which in turn may depend on the estimated Doppler shift of the signal, if the estimate is available.

In a third embodiment, the ICI due to Doppler shifts may still be ignored and assumed negligible. Channel estimation may be carried out on symbols conveying reference signals, and channel estimates for the remaining symbols may be obtained via filtering, interpolation, or the like, or by assuming the same channel estimates as the closest symbol conveying reference signals. Demodulation and decoding may be carried out for the signal of interest. After decoding, preliminary decisions may be taken for all or part of the tones of all or part of the symbols not conveying reference signals. A new channel estimation may be carried out, this time including reference signals and all tones, symbols, and the like for which preliminary decisions have been taken. The channel estimates may be filtered, smoothed, interpolated, or the like, to reduce the impact of additional noise stemming from imperfect decisions. The signal may be demodulated and decoded again, using the updated channel estimates. This procedure may be carried out multiple times, in an iterative fashion.

In a fourth embodiment, the eNB may estimate and track Doppler shift on a per-UE basis. If only one UE is transmitting in one slot or subframe, during that one slot or subframe the eNB may pre-compensate the received time-domain signal by de-rotating the signal so as to remove the (estimated) Doppler shift. If the Doppler shift estimation is accurate enough, the ICI may become negligible after pre-compensation, and a simplified channel estimation method may be adopted, e.g., by estimating channels only on the symbols conveying reference signals and obtaining the missing channel estimates via filtering, interpolation, or the like.

If a plurality of UEs transmit on the slot or subframe, and the plurality of UEs are affected by different Doppler shifts, a single time-domain Doppler compensation may degrade demodulation performance. In this scenario, multiple Doppler values may be compensated.

Figure 28:
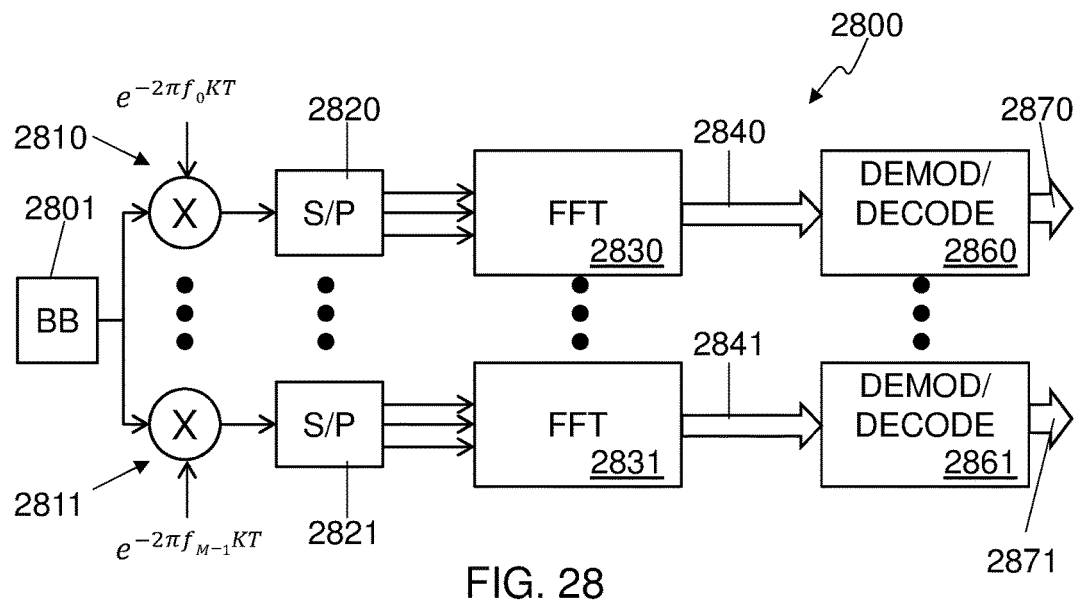
FIG. 28 is a data flow diagram of a multibank receiver with UE-specific Doppler compensation.

FIG. 28 is a data flow diagram of a multibank receiver 2800 with UE-specific Doppler compensation. A plurality of FFTs may be carried out, each FFT 2830, 2831 operating on different version of the input baseband time-domain samples 2801, each version representing the input signal compensated assuming a Doppler shift corresponding to a UE multiplexed in the slot or subframe. The baseband samples 2801 are compensated for a first Doppler shift created by movement of a first UE sending data to the RRU by block 2810 and then converted from serial to parallel by block 2820. At the output of the first FFT 2830, the tones 2840 corresponding to physical channels transmitted by a first UE, which corresponds to this specific data path of the receiver, are extracted, and the tones 2840 are then used for demodulation and decoding 2860 of the corresponding physical channels to determine the data and control 2870 sent by the first UE. The baseband samples 2801 are also compensated for a M–1 Doppler shift created by movement of a M–1 UE sending data to the RRU by block 2811 and then converted from serial to parallel by block 2821. At the output of the first FFT 2831, the tones 2841 corresponding to physical channels transmitted by the M–1 UE, which corresponds to this specific data path of the receiver, are extracted, and the tones 2841 are then used for demodulation and decoding 2861 of the corresponding physical channels to determine the data and control 2871 sent by the M–1 UE.

Figure 29:
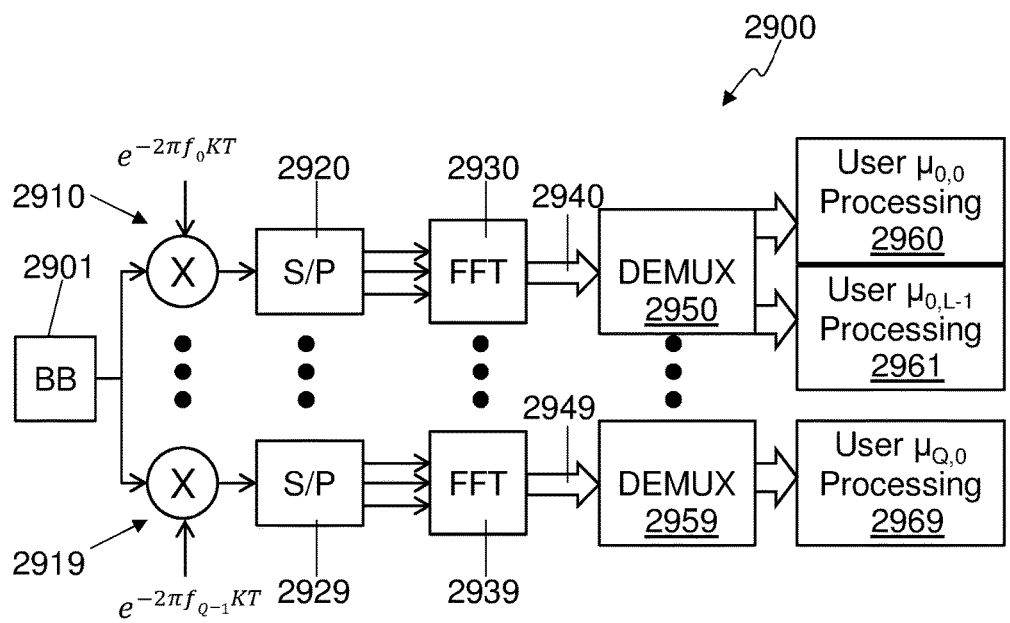
FIG. 29 is a data flow diagram of a multibank receiver with predefined compensation.

FIG. 29 is a data flow diagram of a multibank receiver 2900 with predefined compensation. In the receiver 2900, rather than separately compensating the Doppler shift corresponding to each UE multiplexed in the slot or subframe, the receiver may choose a set of Doppler values, which may be unrelated to the Doppler shifts experienced by the UEs. For example, the values may correspond to a regular grid of values between a minimum value and maximum value. Each of the UEs may be associated to one of the predetermined values, e.g., based on Doppler estimates, that is, each UE may be associated to the predetermined value which matches most closely the actual Doppler experienced by the UE. Each branch includes compensation of the input baseband time-domain signal 2901 with a pre-determined Doppler value 2910, 2919, serial-to-parallel conversion 2920, 2929, FFT 2930, 2939, and extraction of tones 2940, 2949 corresponding to physical channels transmitted by UEs associated with the pre-determined Doppler value. The extracted tones 2940, 2941 are then demuxed 2950, 2959 and processed 2960, 2961, 2969 to determine data sent by the individual UEs. If in at least one slot or subframe at least one of the pre-determined Doppler values is not associated to any UE multiplexed in the slot or subframe, the receiver branch corresponding to the pre-determined Doppler value may be turned off.

In another embodiment, similar to the one represented in FIG. 29, at least one of the physical channels may be demodulated and decoded separately by a plurality of branches. The outcomes of each decoding may be compared and one may be selected based on at least one of a CRC check, LLR-based metric, energy metric, or the like.

Complexity of the multi-bank schemes depicted in FIG. 28 and FIG. 29 is proportional to the number of branches. The number in turn may depend on the number of UEs scheduled for transmission on each subframe. Hence, reducing the number of co-scheduled UEs may reduce the complexity or similarly improve the performance for a given complexity.

In one embodiment, a UL scheduler is designed so that estimated Doppler shift of UEs is taken into account when determining UL allocations. In particular, scheduler may try to limit co-scheduling, on a slot or subframe, only of UEs who share a similar estimated Doppler shift. In a metric-based scheduling strategy, e.g., the proportional fairness (PF) scheduling, this may be achieved by suitably reducing the utility of those scheduling strategies consisting in a plurality of UEs with different Doppler shifts co-scheduled in the same subframe. The reduction may be a function of the number of branches adopted in the receiver, that is, compensated Doppler shifts (if any), and other scheduling inputs, e.g., the signal to noise and interference ratios (SINRs). In addition, periodic uplink signals such as PUCCH, SRS, and the like may be accounted for when making scheduling decisions. For example, if transmission of at least one periodic UL signal, e.g., a PUCCH, is expected on a given subframe, the scheduler may account for the estimated Doppler shift of the at least one UE expected to transmit the PUCCH when determining PUSCH scheduling decisions in the subframe.

In another embodiment, estimated Doppler shifts may be taken into account when determining user pairings for MU-MIMO. That is, if a plurality of UEs are co-scheduled on the same or at least partially overlapping resources, the UEs may be chosen so that their Doppler shift is comparable.

As will be appreciated by those of ordinary skill in the art, aspects of the various embodiments may be embodied as a system, device, method, or computer program product apparatus. Accordingly, aspects of the present invention may take the form of an entirely hardware embodiment, an entirely software embodiment (including firmware, resident software, micro-code, or the like) or an embodiment combining software and hardware aspects that may all generally be referred to herein as a "server," "circuit," "module," "client," "computer," "logic," or "system." Furthermore, aspects of the various embodiments may take the form of a computer program product embodied in one or more computer readable medium(s) having computer program code stored thereon.

Any combination of one or more computer readable storage medium(s) may be utilized. A computer readable storage medium may be embodied as, for example, an electronic, magnetic, optical, electromagnetic, infrared, or semiconductor system, apparatus, or device, or other like storage devices known to those of ordinary skill in the art, or any suitable combination of computer readable storage mediums described herein. In the context of this document, a computer readable storage medium may be any tangible medium that can contain, or store a program and/or data for use by or in connection with an instruction execution system, apparatus, or device.

Computer program code for carrying out operations for aspects of various embodiments may be written in any combination of one or more programming languages, including an object oriented programming language such as Java, Smalltalk, C++, or the like, and conventional procedural programming languages, such as the "C" programming language or similar programming languages. The computer program code if loaded onto a computer, or other programmable apparatus, produces a computer implemented method. The instructions which execute on the computer or other programmable apparatus may provide the mechanism for implementing some or all of the functions/acts specified in the flowchart and/or block diagram block or blocks. In accordance with various implementations, the program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). The computer program code stored in/on (i.e. embodied therewith) the non-transitory computer readable medium produces an article of manufacture.

The computer program code, if executed by a processor causes physical changes in the electronic devices of the processor which change the physical flow of electrons through the devices. This alters the connections between devices which changes the functionality of the circuit. For example, if two transistors in a processor are wired to perform a multiplexing operation under control of the computer program code, if a first computer instruction is executed, electrons from a first source flow through the first transistor to a destination, but if a different computer instruction is executed, electrons from the first source are blocked from reaching the destination, but electrons from a second source are allowed to flow through the second transistor to the destination. So a processor programmed to perform a task is transformed from what the processor was before being programmed to perform that task, much like a physical plumbing system with different valves can be controlled to change the physical flow of a fluid.

Examples of various embodiments are described below:

Embodiment 1. A wireless communication system composed by at least one baseband unit (BBU) and at least one remote radio unit (RRU), wherein the connectivity between the at least one BBU and the at least one RRU is based on a medium or protocol which exhibit jitter, reduced throughput, unreliable data delivery, out-of-order data delivery, or a combination thereof.

Embodiment 2. The wireless communication system of embodiment 1, wherein at least one BBU may perform operations belonging to the physical, medium access control, and above layers of the radio stack.

Embodiment 3. The wireless communication system of embodiment 1, wherein the network connection between the at least one BBU and the at least one RRU, known as fronthaul, may be based on a shared medium such as cable, fiber, wireless, or the like, a protocol such as Ethernet, IP, or the like, and may include active components such as routers, switches, bridges, and the like.

Embodiment 4. The wireless communication system of embodiment 1, wherein the data exchanged on the fronthaul between the at least one BBU and the at least one RRU may include frequency-domain baseband samples corresponding to tones effectively used for transmission or reception, whereas the tones not used for transmission or reception may be omitted.

Embodiment 5. The wireless communication system of embodiment 4, wherein the at least one BBU determines which tones it needs and informs the at least one RRU of the tones whose baseband samples need to be reported.

Embodiment 6. The wireless communication system of embodiment 5, wherein the information about the set of tones needed by the at least one BBU may be suitably encoded and transmitted over the fronthaul to the at least one RRU every scheduling interval, or with any other periodicity.

Embodiment 7. The wireless communication system of embodiment 6, wherein the at least one RRU combines the suitably encoded information about the tones to be reported for each time period and encodes the samples corresponding to said tones in a suitable compressed format, wherein the quantization format of the baseband samples may be determined by the at least one BBU, autonomously by the RRU using estimates of the power, noise, signal quality, modulation and coding scheme, or a combination thereof.

Embodiment 8. The wireless communication system of embodiment 1, wherein the at least one RRU may include a buffer of base-band samples in order to provide a constant, synchronized flow of baseband samples to the transmit antennas, wherein the size of said buffer may be dynamically adjusted based on measured fronthaul quality, commands from the BBU, status of the buffer itself, or the like.

Embodiment 9. The wireless communication system of embodiment 8, wherein the fronthaul quality may be at least one statistical measure (average, median, maximum, variance, and the like) of at least one of a latency, throughput, or reliability.

Embodiment 10. The wireless communication system of embodiment 8, wherein the at least one RRU may inform the at least one BBU about its buffer status, or events related to its buffer, for example occurrence of buffer underruns or buffer overruns.

Embodiment 11. The wireless communication system of embodiment 10, wherein the at least one BBU may adapt certain scheduling parameters based on a measured fronthaul quality, report from the at least one RRU, traffic, performance requirement, congestion information, or a combination thereof.

Embodiment 12. The wireless communication system of embodiment 11, wherein the scheduling parameters may include frequency-domain allocation size, modulation and coding schemes, number of users, number of grants, pattern of usable subframe, anticipation of the scheduling with respect to the time index it refers to, or a combination thereof.

Embodiment 13. The wireless communication system of embodiment 12, wherein the scheduling for at least one BBU may consist in a plurality of steps carried out at different times, with at least one step carrying out scheduling for broadcast signals (such as CRS, PSS, SSS, PBCH, SIBs, and the like) and at least one step carrying out scheduling for unicast signals (such as PCFICH, PDCCH, PDSCH, and the like), wherein the at least one scheduling for broadcast signals can be carried out much earlier than the at least one scheduling for unicast signals.

Embodiment 14. The wireless communication system of embodiment 13, wherein the at least one BBU generates encoded and compressed version of the downlink signals to transmit after the corresponding scheduling operation terminates, wherein encoding may consists of selecting a subset of tones, symbols, antennas, and the like for which baseband samples need to be transmitted, and compression may consist of choosing a reduced-size representation for the baseband samples, such as modulation bits.

Embodiment 15. The wireless communication system of embodiment 14, wherein the at least one BBU transmits the at least one encoded and compressed version of the downlink signals to the at least one RRU, and said RRU decompresses said version and transmits the corresponding baseband samples.

Embodiment 16. The wireless communication system of embodiment 14, wherein the at least one encoded and compressed version of the downlink signals includes a representation of the time said downlink signal refers to.

Embodiment 17. The wireless communication system of embodiment 15, wherein the decompression may include at least one of a spatial processing, modulation, constellation mapping, encoding, tone mapping, rotation, time-shifting, scaling, Fourier transform, or a combination thereof.

Embodiment 18. The wireless communication system of embodiment 1, wherein the at least one BBU may bypass functionalities of the radio stack based on an estimated or predicted latency over the fronthaul.

Embodiment 19. The wireless communication system of embodiment 18, wherein the functionalities may include the Hybrid Automatic ReQuest (HARQ), because the timeline of HARQ may not be met due to the fronthaul latency.

Embodiment 20. The wireless communication system of embodiment 19, wherein the at least one BBU may decide, if a downlink (non-)acknowledge information corresponding to at least one HARQ process is not received, to assume ACK(s), NACK(s), to postpone decision until the information is received, or to postpone decision until a timer expires.

Embodiment 21. The wireless communication system of embodiment 19, wherein the at least one BBU may decide, if an uplink (non-)acknowledge information corresponding to at least one HARQ process is not available when a corresponding (re-)transmission for said HARQ process takes place, to assume ACK(s) or NACK(s) for the sake of scheduling for the same HARQ process.

Embodiment 22. The wireless communication system of embodiment 18, wherein the functionalities may include the random access channel (RACH).

Embodiment 23. The wireless communication system of embodiment 22, wherein the fronthaul latency may be such that a mobile terminal trying to access the network may not receive a random access response (RAR) from the at least one BBU within the acceptable time window.

Embodiment 24. The wireless communication system of embodiment 23, wherein the at least one BBU may:
 a. Configure the mobile terminals to perform multiple periodic preamble transmissions from the mobile terminals;
 b. Prepare a RAR once a preamble is detected, in a subframe computed according to when said preamble was detected and the periodicity of preamble transmissions;
 c. Send the RAR multiple times, assuming different t_id and f_id compatible with PRACH configuration parameters, and assuming different preamble identities compatible with said PRACH parameters. The multiple RAR transmissions may occur in different subframes or, at least in part, in the same subframe. The multiple RAR transmissions may include non-overlapping UL grants.

Embodiment 25. A protocol for data transport between two or more nodes over an internet protocol (IP) network, said protocol including definitions and procedures for:
 a. Providing reliable communication while minimizing the application-layer latency between the sender and the receiver of each message;
 b. Providing reliable communication while maximizing the application-layer throughput between the sender and the receiver of each message;
 c. Detecting network delivery errors such as message losses and the like;
 d. Aiding synchronization of the clock rate between different nodes in the network.

Embodiment 26. The protocol of embodiment 25, wherein the protocol may rely on one underlying transport layer protocol (e.g., UDP), or more transport layer protocols, or no transport layer protocol ("raw IP socket"), and wherein an application layer (AL) relies on said protocol for reliable communication.

Embodiment 27. The protocol of embodiment 26, wherein the protocol may detect an out-of-order delivery event, defined as the event in which two or more packets transmitted in a certain order are received in a different order. The application layer may be notified of the event detected at the side that transmitted the packets for which the event was detected, or at the side meant to receive said packets, or at both sides.

Embodiment 28. The protocol of embodiment 27, wherein the protocol may correct the event detected, for example by buffering the received packets and reordering them before passing them to the AL.

Embodiment 29. The protocol of embodiment 26, wherein the protocol may detect a multiple-delivery event, defined as the event in which one packet is received multiple times. The AL may be notified of the event detected at the side that transmitted the packet for which the event was detected, or at the side meant to receive said packet, or at both sides.

Embodiment 30. The protocol of embodiment 29, wherein the protocol may correct the event detected, for example by passing the packet received multiple times to the AL only once (e.g., the first time it was received).

Embodiment 31. The protocol of embodiment 26, wherein the protocol may detect an error-delivery event, defined as the event in which one packet is received with content not equal to the content it had at transmission (e.g., because of content corruptions over the fronthaul). The AL may be notified of the event detected at the side that transmitted the packet for which the event was detected, or at the side meant to receive said packet, or at both sides.

Embodiment 32. The protocol of embodiment 31, wherein the protocol may try to correct the event detected, for example by requesting a retransmission.

Embodiment 33. The protocol of embodiment 26, wherein the protocol may detect a packet-loss event, defined as event in which a packet transmitted is never received, or is received after a properly-defined "time expired" condition. The application layer may be notified of the event detected at the side that transmitted the packet for which the event was detected, or at the side meant to receive said packet, or at both sides.

Embodiment 34. The protocol of embodiment 33, wherein the protocol may try to correct the event detected, for example by requesting a retransmission.

Embodiment 35. The protocol of embodiment 26, wherein the protocol may estimate the a certain "quality metric" on each link over which said protocol operates, in either direction of each of said links, or both directions. Quality metric may be at least one of a throughput, defined as the number of bytes per second that can be reliably received in a certain direction of a certain link, latency, defined at the time it takes a packet to travel the fronthaul in a certain direction of a certain link, packet-loss rate, error-delivery rate, out-of-order-delivery rate, or the like.

Embodiment 36. The protocol of embodiment 35, wherein the protocol may update these estimates over time, possibly employing averaging, filtering and the like.

Embodiment 37. The protocol of embodiment 35, wherein the protocol may maintain, at any given time, different estimates of a certain quality metric achievable on a certain direction of a certain link. For example, said protocol may maintain a long-term average throughput estimate as well as a short-term average throughput estimate.

Embodiment 38. The protocol of embodiment 35, wherein the protocol may use the estimates of said quality metrics (and/or a mathematically processed version of said quality metrics) in order to provide information to the application layer of one or more nodes in the network over which protocol operates.

Embodiment 39. The protocol of embodiment 38, wherein said information include at least one of a throughput expected to be reliably sustained in a certain direction of a certain link (e.g., long-term expected value, short-term expected value, and the like), packet size expected to be reliably sustained in a certain direction of a certain link at a certain packet-transmission rate (e.g., long-term expected value, short-term expected value, and the like), clock rate difference between the clocks running on different nodes of the network, or a combination thereof.

Embodiment 40. The protocol of embodiment 38, wherein said information may be provided in a way that recommends an action. Examples include, but are not limited to, recommendations of transmitting packets with more (or less) bytes in them (possibly including the suggested variation), transmitting packets more (or less) frequently (possibly including the suggested variation), correcting the clock rate to a faster (slower) rate (possibly including the suggested variation).

Embodiment 41. A protocol for communication between at least one BBU and at least one RRU, said protocol including definition of protocol units for:
  a. Transferring downlink samples to the at least one RRU;
  b. Informing the at least one RRU about which UL samples to report, how to represent them, and the like;
  c. Transferring uplink samples to the at least one BBU according to said representation and compression rules.
  d. Exchanging parameters, capabilities, codebooks, and the like, establishing connection, performing synchronization, or a combination thereof (handshake).

Embodiment 42. The protocol of embodiment 41, wherein protocol units may contain an absolute time reference denoted as FIP period index, whose duration may or may not be related to the underlying radio numerology (e.g., may or may not be a multiple of a OFDM symbol, LTE slot or subframe, or the like).

Embodiment 43. The protocol of embodiment 41, wherein protocol units may include a list of tones, symbols, or a combination thereof, wherein said list may represent consecutive tones or symbols, periodically repeating tones or symbols, bitmaps of tones or symbols, or any combination thereof.

Embodiment 44. The protocol of embodiment 41, wherein protocol units may include one or more of a scaling and power adaptation, frequency, phase or time shift, clipping, dynamic range adjustment, or the like.

Embodiment 45. The protocol of embodiment 41, wherein the representation of baseband samples may be based on complex numbers or integer numbers representing elements of a fixed constellation.

Embodiment 46. The protocol of embodiment 45, wherein the quantization rules (e.g., number of bits) used to represent said complex numbers may be hardcoded, predetermined by one of the entities involved which instructs the other(s) about the quantization rules to follow, adaptively decided based on other characteristics such as least one of a signal power, noise power, required quality, modulation and coding scheme, and the like, or a combination thereof.

Embodiment 47. The protocol of embodiment 45, wherein the constellation may be adaptively decided by the at least one BBU and said information may be conveyed to the at least one RRU, wherein the at least one BBU and the least one RRU share a list of available constellations that are either hardcoded or adaptively constructed during handshake.

Embodiment 48. The protocol of embodiment 41, wherein protocol units may include a description of the employed spatial scheme, such as transmit diversity, linear precoding, and the like.

Embodiment 49. The protocol of embodiment 48, wherein the description of the employed spatial scheme may include a number of antenna ports and a mapping between antenna ports and physical antennas.

Embodiment 50. The protocol of embodiment 48, wherein the description of the employed spatial scheme may include at least one spatial mapping matrix describing how precoding is carried out, wherein said matrix may be explicitly signaled or may be predetermined, and may belong to a codebook of matrices that is either hardcoded or adaptively constructed during handshake.

Embodiment 51. The wireless communication system of embodiment 1, wherein each RRU may or may not be enabled to transmit DL signals, the number of deployed RRUs may be larger than the number of running BBUs, and whether each RRU is enabled to transmit DL as well as the association between RRUs and BBUs may be dynamically decided by an orchestration algorithm based on system load, number of mobile terminals in the coverage area of said wireless communication system, radio signal measurements from both said RRUs and said mobile terminals, interference, available computational resources, or a combination thereof.

Embodiment 52. The wireless communication system of embodiment 51, wherein the plurality of BBUs are executed by a common pool of general purpose CPUs, GPUs, or the like, wherein the CPUs or GPUs may be physical CPUs or GPUs or virtual CPUs or GPUs, and wherein the at least one BBU may be adaptively assigned CPUs or GPUs based on the workload.

Embodiment 53. The wireless communication system of embodiment 51, wherein at least one BBU processes samples for a plurality of RRUs via coordinated multi-point processing.

Embodiment 54. The wireless communication system of embodiment 51, wherein some features of the plurality of BBUs may be dynamically changed depending on the workload, available computational resources, and the like, wherein the features may include at least one of a scheduling parameter, number of active mobile terminals served by said BBU, RRC parameter, or a combination thereof.

Embodiment 55. The wireless communication system of embodiment 54, wherein the scheduling parameter may be one of an assigned resources (e.g., bandwidth or subframe), modulation and coding scheme, physical signals configurations, or the like.

Embodiment 56. The wireless communication system of embodiment 51, wherein mobile terminals may be handed over between at least one BBU to another at least one BBU depending on the workload, available computational resources, and the like.

Any combination of 56 embodiments described above may be used in a particular embodiment.

As used in this specification and the appended claims, the singular forms "a", "an", and "the" include plural referents unless the content clearly dictates otherwise. Thus, for example, reference to an element described as "a tone" may refer to a single tone, tones, or any other number of tones. As used in this specification and the appended claims, the term "or" is generally employed in its sense including both a union operator (OR) and an intersection operator (AND), which may also be referred to as an "inclusive OR" or an "and/or" unless the content clearly dictates otherwise. As used herein, the term "coupled" includes direct and indirect connections. Moreover, where first and second devices are coupled, intervening devices, including active devices, may be located there between. Unless otherwise indicated, all numbers expressing quantities of elements, percentages, and so forth used in the specification and claims are to be understood as being modified in all instances by the term "about." Interpretation of the term "about" is context specific, but in the absence of other indications, should generally be interpreted as ±10% of the modified quantity, measurement, or distance. The recitation of numerical ranges by endpoints includes all numbers subsumed within that range (e.g. 1 to 5 includes 1, 2.78, 3.33, and 5). Any element in a claim that does not explicitly state "means for" performing a specified function, or "step for" performing a specified function, is not to be interpreted as a "means" or "step" clause as specified in 35 U.S.C. § 112(f).

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. A baseband unit (BBU) for use with a remote radio unit (RRU) in a distributed radio access network (RAN) and coupled to a core network, the BBU comprising:
    a processor;
    one or more memory devices coupled to the processor, and storing instructions to configure the processor; and
    interface circuitry coupled to the processor and a fronthaul link;
    the processor configured to:
        perform at least a second-level protocol of the RAN;
        communicate over the fronthaul link with the RRU using an adaptive fronthaul protocol;
        send setup information to the RRU that identifies a set of receivable tones; and
        send tone information to the RRU over the fronthaul link that identifies at least one tone, included in the set of receivable tones, that is useable to identify frequency-domain information to discard during creation of fronthaul uplink information.

2. The BBU of claim 1, the processor further configured to perform a portion of a first-level protocol of the RAN.

3. The BBU of claim 2, wherein the RAN protocol comprises an Evolved Universal Terrestrial Radio Access Network (E-UTRAN);
    the core network comprising an Evolved Packet Core (EPC);
    the first-level protocol comprises an Evolved Universal Terrestrial Radio Access (E-UTRA) physical-layer (PHY) protocol; and
    the second-level protocol comprises an E-UTRA medium access control (MAC) protocol.

4. The BBU of claim 1, wherein the tone information sent to the RRU identifies a set of reportable tones, which is a subset of the set of receivable tones, to use in the creation of the fronthaul uplink information.

5. The BBU of claim 1, the processor further configured to send quantization information to the RRU over the fronthaul link based on a radio signal-to-noise ratio, a physical layer modulation scheme, a physical layer code rate, an available bandwidth of the fronthaul link, or any combination thereof.

6. The BBU of claim 1, the processor further configured to:
    adaptively decompress the fronthaul uplink information received from the RRU over the fronthaul link using the adaptive fronthaul protocol to create decompressed fronthaul uplink data; and
    process the decompressed fronthaul uplink data to provide appropriate information to the second level protocol.

7. The BBU of claim 1, the processor further configured to:
    adaptively compress data to create fronthaul downlink information to send to the RRU over the fronthaul link; and
    send the fronthaul downlink information to the RRU over the fronthaul link using the adaptive fronthaul protocol.

8. A baseband unit (BBU) for use with a remote radio unit (RRU) in a distributed radio access network (RAN) and coupled to a core network, the BBU comprising:
    a processor;
    one or more memory devices coupled to the processor, and storing instructions to configure the processor; and interface circuitry coupled to the processor and a fronthaul link;
the processor configured to:
perform at least a second-level protocol of the RAN;
communicate over the fronthaul link with the RRU using an adaptive fronthaul protocol;
determine an indicator of fronthaul link quality; and
dynamically change one or more parameters of the RAN based on the indicator.

9. The BBU of claim 8, wherein the indicator of fronthaul link quality is determined based, at least in part, on information received from the RRU over the fronthaul link.

10. The BBU of claim 8, wherein indicator of fronthaul link quality is determined based, at least in part, on a latency of the fronthaul link, a bandwidth of the fronthaul link, errors on the fronthaul link, undelivered packets on the fronthaul link, out-of-order packets on the fronthaul link, BBU buffer overruns, BBU buffer underruns, or any combination thereof.

11. The BBU of claim 8, wherein the one or more parameters of the RAN comprise:
frequency-domain allocation size, modulation and coding schemes, number of users, number of grants, pattern of usable subframe, anticipation of the scheduling with respect to the time index it refers to, or any combination thereof.

12. The BBU of claim 8, wherein the indicator of fronthaul link quality comprises a latency of the fronthaul link, and the one or more parameters of the RAN comprises a ra-ResponseWindowSize parameter in a MAC protocol of an E-UTRA network.

13. The BBU of claim 8, the processor further configured to perform a portion of a first-level protocol of the RAN.

14. The BBU of claim 8, wherein the RAN protocol comprises an Evolved Universal Terrestrial Radio Access Network (E-UTRAN);
the core network comprising an Evolved Packet Core (EPC);
the first-level protocol comprises an Evolved Universal Terrestrial Radio Access (E-UTRA) physical-layer (PHY) protocol; and
the second-level protocol comprises an E-UTRA medium access control (MAC) protocol.

15. The BBU of claim 8, the processor further configured to send quantization information to the RRU over the fronthaul link based on a radio signal-to-noise ratio, a physical layer modulation scheme, a physical layer code rate, an available bandwidth of the fronthaul link, or any combination thereof.

16. The BBU of claim 8, the processor further configured to:
adaptively decompress the fronthaul uplink information received from the RRU over the fronthaul link using the adaptive fronthaul protocol to create decompressed fronthaul uplink data; and
process the decompressed fronthaul uplink data to provide appropriate information to the second level protocol.

17. The BBU of claim 8, the processor further configured to:
adaptively compress data to create fronthaul downlink information to send to the RRU over the fronthaul link; and
send the fronthaul downlink information to the RRU over the fronthaul link using the adaptive fronthaul protocol.

18. A method, performed by a baseband unit (BBU), for facilitating communication between a core network and a remote radio unit (RRU) in a distributed radio access network (RAN), the method comprising:
performing at least a second-level protocol of the RAN;
communicating over a fronthaul link with the RRU using an adaptive fronthaul protocol;
sending setup information to the RRU that identifies a set of receivable tones; and
sending tone information to the RRU over the fronthaul link that identifies at least one tone, included in the set of receivable tones, that is useable to identify frequency-domain information to discard during creation of the fronthaul uplink information.

19. The method of claim 18, further comprising performing a portion of a first-level protocol of the RAN.

20. The method of claim 19, wherein the RAN protocol comprises an Evolved Universal Terrestrial Radio Access Network (E-UTRAN), and the core network comprising an Evolved Packet Core (EPC);
the first-level protocol comprises an Evolved Universal Terrestrial Radio Access (E-UTRA) physical-layer (PHY) protocol; and
the second-level protocol comprises an E-UTRA medium access control (MAC) protocol.

21. The method of claim 18, wherein the tone information comprises a tonemap descriptor that describes a set of reportable tones out of the set of receivable tones, and the at least one tone is excluded from a set of reportable tones.

22. The method of claim 18, further comprising sending quantization information to the RRU over the fronthaul link based on a radio signal-to-noise ratio, a physical layer modulation scheme, a physical layer code rate, an available bandwidth of the fronthaul link, or any combination thereof.

23. The method of claim 22, wherein the quantization information comprises a quantization parameter to set a quantization level used by the RRU.

24. The method of claim 18, further comprising:
adaptively decompressing fronthaul uplink information received from the RRU over the fronthaul link using the adaptive fronthaul protocol to create decompressed fronthaul uplink data; and
processing the decompressed fronthaul uplink data to provide appropriate information to the second level protocol.

25. The BBU of claim 8, the processor further configured to send quantization information to the RRU over the fronthaul link based on a radio signal-to-noise ratio, a physical layer modulation scheme, a physical layer code rate, an available bandwidth of the fronthaul link, or any combination thereof.

26. The BBU of claim 8, the processor further configured to:
adaptively decompress the fronthaul uplink information received from the RRU over the fronthaul link using the adaptive fronthaul protocol to create decompressed fronthaul uplink data; and
process the decompressed fronthaul uplink data to provide appropriate information to the second level protocol.

27. The BBU of claim 8, the processor further configured to:
adaptively compress data to create fronthaul downlink information to send to the RRU over the fronthaul link; and
send the fronthaul downlink information to the RRU over the fronthaul link using the adaptive fronthaul protocol.

28. A method, performed by a baseband unit (BBU), for facilitating communication between a core network and a remote radio unit (RRU) in a distributed radio access network (RAN), the method comprising:
performing at least a second-level protocol of the RAN;
communicating over the fronthaul link with the RRU using an adaptive fronthaul protocol; and
sending tone information to the RRU over the fronthaul link that identifies a set of reportable tones to use in creation of the fronthaul uplink information;
wherein the tone information comprises a first tonemap descriptor that describes a set of reportable tones associated with a first time period and a second tonemap descriptor that describes a set of reportable tones associated with a second time period.

29. A method, performed by a baseband unit (BBU), for facilitating communication between a core network and a remote radio unit (RRU) in a distributed radio access network (RAN), the method comprising:
performing at least a second-level protocol of the RAN;
communicating over the fronthaul link with the RRU using an adaptive fronthaul protocol;
sending tone information to the RRU over the fronthaul link that identifies a set of reportable tones to use in creation of the fronthaul uplink information; and
generating a first tonemap descriptor according to the adaptive fronthaul protocol;
the tonemap descriptor comprising:
a base type with parameters;
a unary operator and a second tonemap descriptor; or
a binary operator, a third tonemap descriptor, and a fourth tonemap descriptor;
wherein the tone information comprises the first tonemap descriptor.

30. The method of claim 29, wherein the unary operator comprises an inverse operator;
the binary operator is selected from a group consisting of a union operator, an intersection operator, and a difference operator; and
the base type with parameters is selected from a group consisting of
a contiguous type with parameters comprising a first tone and a number of tones;
a periodic type with parameters comprising a tone index and a periodicity;
a list type with parameters comprising a list of tones; and
a block type with parameters comprising a block size.

31. A method performed by a baseband unit (BBU), for facilitating communication between a core network and a remote radio unit (RRU) in a distributed radio access network (RAN), the method comprising:
performing at least a second-level protocol of the RAN;
communicating over the fronthaul link with the RRU using an adaptive fronthaul protocol;
adaptively decompressing fronthaul uplink information received from the RRU over the fronthaul link using the adaptive fronthaul protocol to create decompressed fronthaul uplink data;
processing the decompressed fronthaul uplink data to provide appropriate information to the second level protocol;
determining a quantization level of the fronthaul uplink information; and
expanding the fronthaul uplink information to a native quantization level to adaptively decompress the fronthaul uplink information.

32. A method, performed by a baseband unit (BBU), for facilitating communication between a core network and a remote radio unit (RRU) in a distributed radio access network (RAN), the method comprising:
performing at least a second-level protocol of the RAN;
communicating over the fronthaul link with the RRU using an adaptive fronthaul protocol;
adaptively decompressing fronthaul uplink information received from the RRU over the fronthaul link using the adaptive fronthaul protocol to create decompressed fronthaul uplink data;
processing the decompressed fronthaul uplink data to provide appropriate information to the second level protocol;
receiving complex frequency-domain information in a shared-exponent floating-point format for at least some time periods in the fronthaul downlink information, the fronthaul uplink information comprising a first mantissa value, a second mantissa value, and a shared-exponent value;
reconstituting a first frequency-domain sample having the first mantissa value and the shared-exponent value; and
reconstituting a second frequency-domain sample having the third mantissa value and the shared-exponent value.

33. The method of claim 32, further comprising reconstituting additional frequency-domain samples using additional mantissa values from the fronthaul uplink information with the shared-exponent value.

34. A method, performed by a baseband unit (BBU), for facilitating communication between a core network and a remote radio unit (RRU) in a distributed radio access network (RAN), the method comprising:
performing at least a second-level protocol of the RAN;
communicating over the fronthaul link with the RRU using an adaptive fronthaul protocol; and
compressing the data comprising a first complex frequency-domain sample and a second frequency-domain sample into a shared-exponent format that comprises a mantissa value for a first frequency-domain sample, a mantissa value for a second frequency-domain sample, and a single shared-exponent value for the first frequency-domain sample and the second frequency-domain sample;
wherein the fronthaul downlink information comprises the frequency-domain information in the shared-exponent format.

35. The method of claim 34, the fronthaul downlink information further comprising additional mantissa values for additional frequency-domain samples associated with the single shared-exponent value.

36. A method, performed by a baseband unit (BBU), for facilitating communication between a core network and a remote radio unit (RRU) in a distributed radio access network (RAN), the method comprising:
performing at least a second-level protocol of the RAN;
communicating over the fronthaul link with the RRU using an adaptive fronthaul protocol; and
sending frequency-domain information over the fronthaul link to the RRU using the adaptive fronthaul protocol, the frequency-domain information comprising:
a tonemap descriptor describing a set of tones to be used by the RRU to generate a radio frequency signal for transmission to the wireless terminal; and
data identifying modulation symbols for tones of the set of tones, and times associated with the modulation symbols.

* * * * *